(12) United States Patent
Schwarz et al.

(10) Patent No.: US 11,784,062 B2
(45) Date of Patent: Oct. 10, 2023

(54) PRODUCTION OF OPTOELECTRONIC COMPONENTS

(71) Applicant: Osram OLED GmbH, Regensburg (DE)

(72) Inventors: Thomas Schwarz, Regensburg (DE); Andreas Plössl, Regensburg (DE); Jörg Sorg, Regensburg (DE)

(73) Assignee: Osram OLED GmbH, Regensburg (DE)

(*) Notice: Subject to any disclaimer, the term of this patent is extended or adjusted under 35 U.S.C. 154(b) by 155 days.

(21) Appl. No.: 16/765,801

(22) PCT Filed: Nov. 23, 2018

(86) PCT No.: PCT/EP2018/082375
§ 371 (c)(1),
(2) Date: May 20, 2020

(87) PCT Pub. No.: WO2019/105862
PCT Pub. Date: Jun. 6, 2019

(65) Prior Publication Data
US 2020/0287111 A1 Sep. 10, 2020

(30) Foreign Application Priority Data
Nov. 30, 2017 (DE) .......................... 102017128457.5

(51) Int. Cl.
*H01L 21/50* (2006.01)
*H01L 25/075* (2006.01)
(Continued)

(52) U.S. Cl.
CPC .......... *H01L 21/50* (2013.01); *H01L 21/4803* (2013.01); *H01L 21/52* (2013.01);
(Continued)

(58) Field of Classification Search
CPC ..... H01L 21/4803; H01L 21/50; H01L 21/52; H01L 25/0753; H01L 33/486; H01L 33/62
See application file for complete search history.

(56) References Cited

U.S. PATENT DOCUMENTS 6,987,034 B1* 1/2006 Chiang ............... H01L 21/4825
257/E23.033
2010/0045963 A1* 2/2010 Yamaguchi ............. G01C 3/08
356/4.01
(Continued)

FOREIGN PATENT DOCUMENTS

CN 105765743 A 7/2016
DE 102013224581 A1 6/2015
(Continued)

OTHER PUBLICATIONS

Japanese Office Action issued in Japanese Application No. 2020-526365 dated Aug. 3, 2021.
(Continued)

*Primary Examiner* — Feifei Yeung Lopez
(74) *Attorney, Agent, or Firm* — ArentFox Schiff

(57) ABSTRACT

The invention relates to a method for producing optoelectronic components. The invention comprises: provision of a metal substrate, the substrate having a front side and a rear side opposite the front side; front-side removal of substrate material such that the substrate comprises substrate sections protruding in the region of the front side and recesses arranged there between; formation of a plastic body adjacent to substrate sections; arrangement of optoelectronic semiconductor chips on substrate sections; rear-side removal of substrate material in the region of the recesses, such that the substrate is structured into separate substrate sections; and performance of a separation process. The plastic body is divided into separate substrate sections and individual optoelectronic components with at least one optoelectronic semiconductor chip are formed. The invention also relates to an optoelectronic component.

13 Claims, 41 Drawing Sheets

(51) Int. Cl.
*H01L 25/16* (2023.01)
*H01L 33/48* (2010.01)
*H01L 33/60* (2010.01)
*H01L 33/62* (2010.01)
*H01L 21/48* (2006.01)
*H01L 21/52* (2006.01)

(52) U.S. Cl.
CPC ........ *H01L 25/0753* (2013.01); *H01L 25/167* (2013.01); *H01L 33/486* (2013.01); *H01L 33/60* (2013.01); *H01L 33/62* (2013.01); *H01L 2933/0058* (2013.01); *H01L 2933/0066* (2013.01)

(56) References Cited

U.S. PATENT DOCUMENTS

| | | | | |
|---|---|---|---|---|
| 2012/0037929 A1* | 2/2012 | Ramchen | ............... | H01L 24/34 257/88 |
| 2012/0138967 A1 | 6/2012 | Shimizu et al. | | |
| 2012/0313131 A1 | 12/2012 | Oda et al. | | |
| 2014/0117388 A1* | 5/2014 | Kuo | ............... | H01L 33/54 257/E33.059 |
| 2018/0175267 A1* | 6/2018 | Hirasawa | ............... | H01L 33/60 |

FOREIGN PATENT DOCUMENTS

| | | |
|---|---|---|
| DE | 102015109953 A1 | 12/2016 |
| EP | 1162668 A2 | 12/2001 |
| EP | 2325901 A1 | 5/2011 |
| JP | 2002084004 A | 3/2002 |
| JP | 2003234367 A | 8/2003 |
| JP | 2004119631 A | 4/2004 |
| JP | 2005109172 A | 4/2005 |
| JP | 2010-177329 * | 8/2010 |
| JP | 2010177329 A | 8/2010 |
| JP | 2012160638 A | 8/2012 |
| JP | 2013084700 A | 5/2013 |
| JP | 2013157357 A | 8/2013 |
| JP | 2017005150 A | 1/2017 |
| JP | 2017509155 A | 3/2017 |
| JP | 2017069342 A | 4/2017 |
| JP | 2017098470 A | 6/2017 |
| JP | 2017168691 A | 9/2017 |
| WO | 2012117974 A1 | 9/2012 |
| WO | 2017050913 A1 | 3/2017 |
| WO | 2017174647 A1 | 10/2017 |

OTHER PUBLICATIONS

Japanese Office Action and Search Report issued in Japanese Application No. 2020526365 dated Apr. 5, 2022.
International Search Report and Written Opinion issued in International Application No. PCT/EP2018/082375 dated Feb. 20, 2019.

* cited by examiner

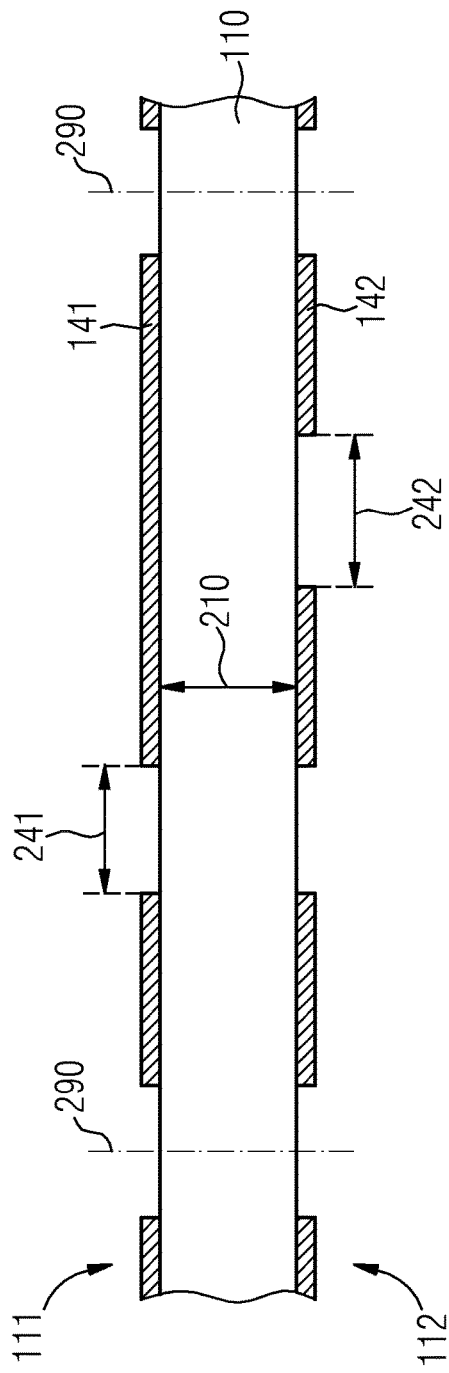
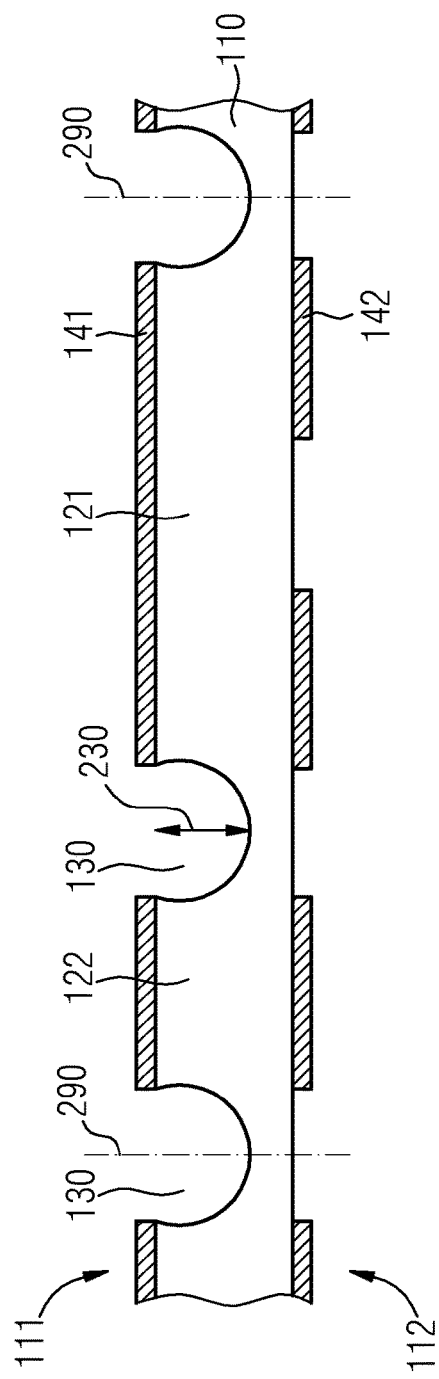
FIG 1
FIG 2

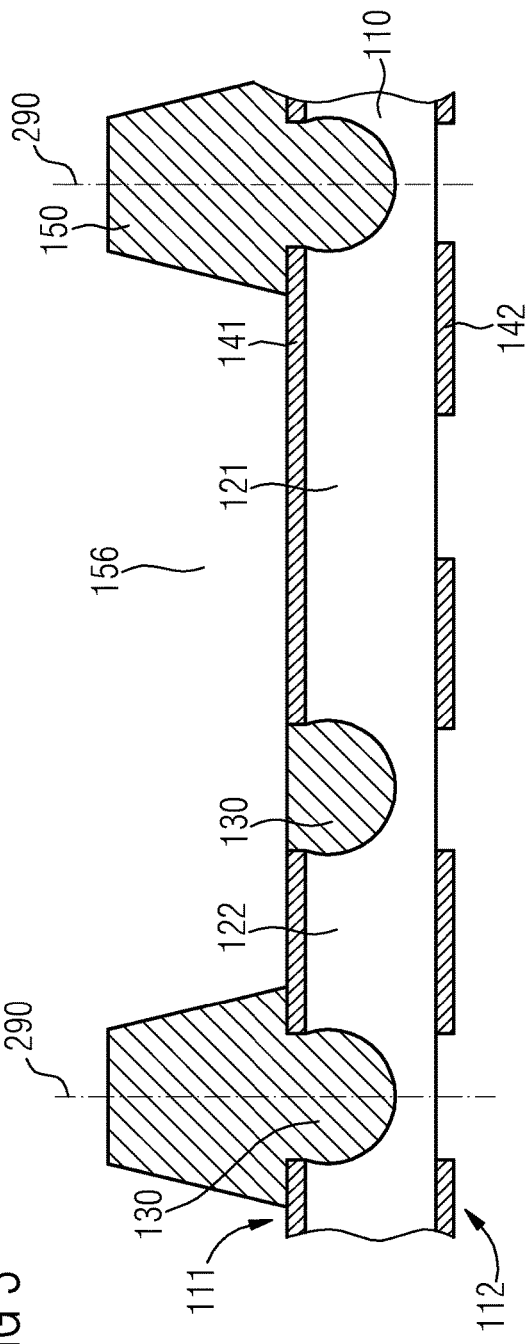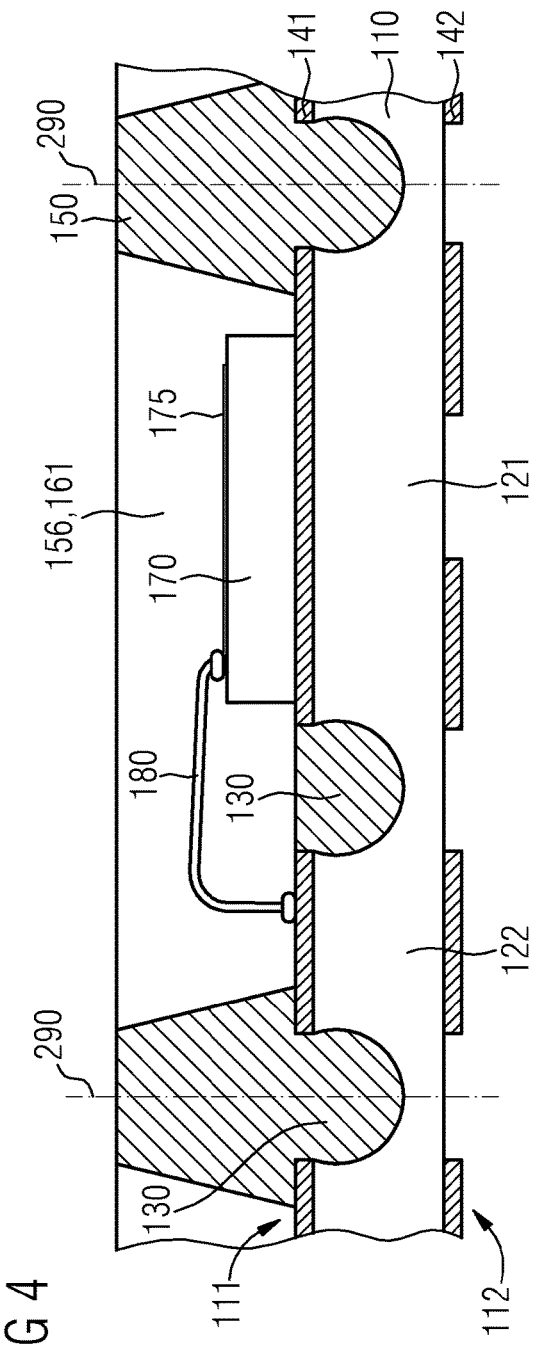

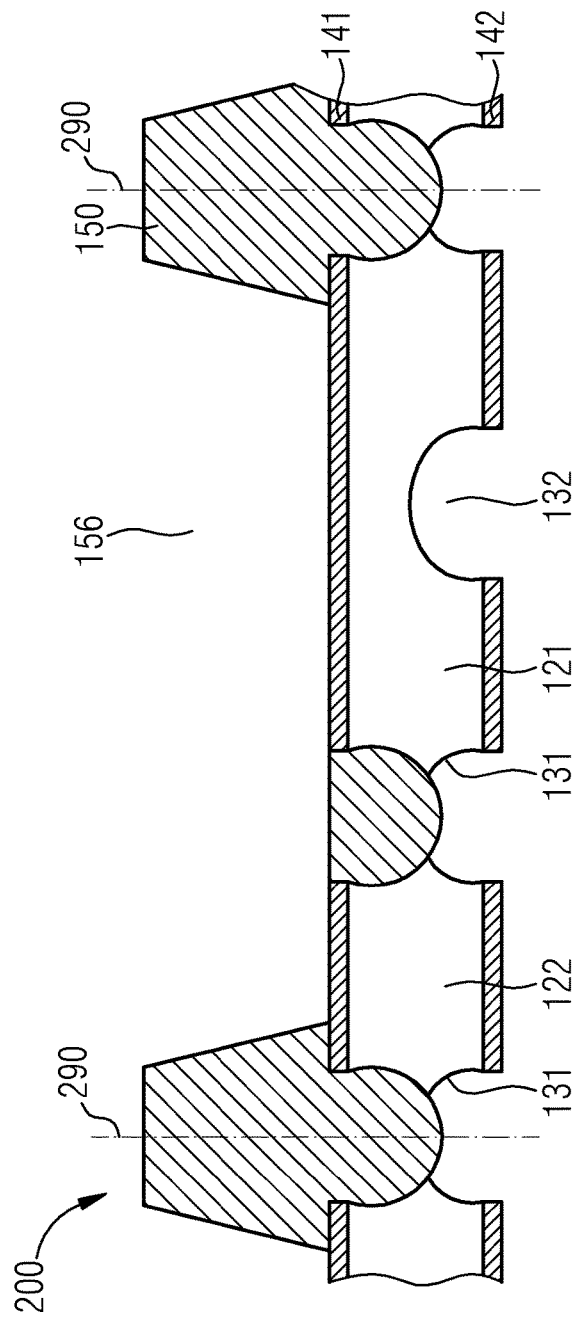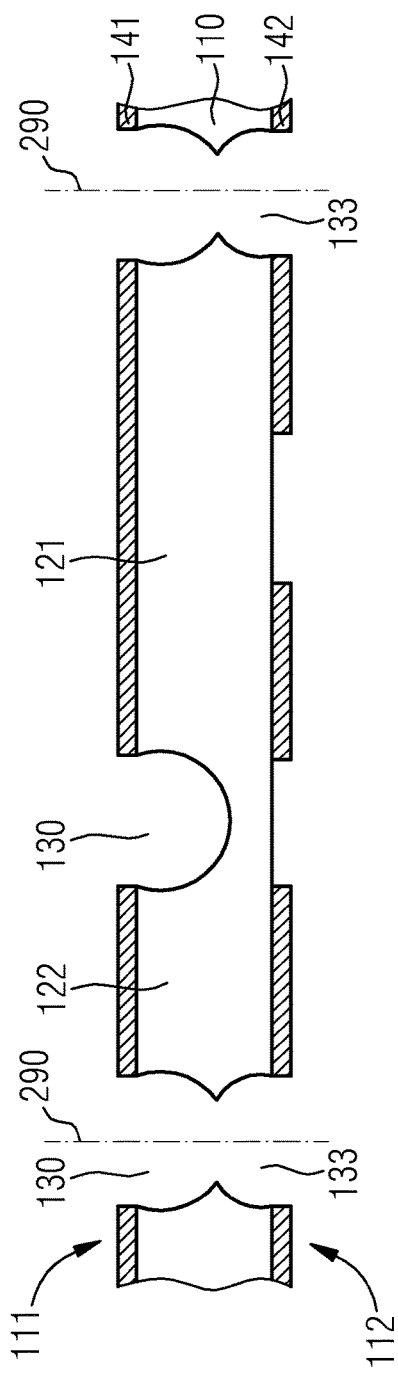

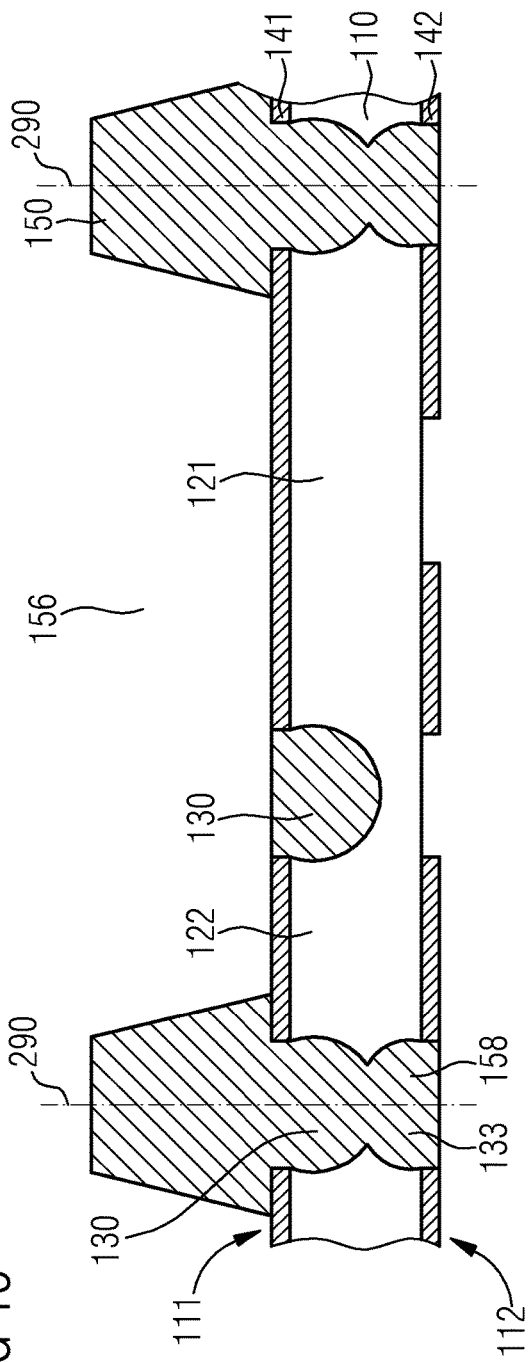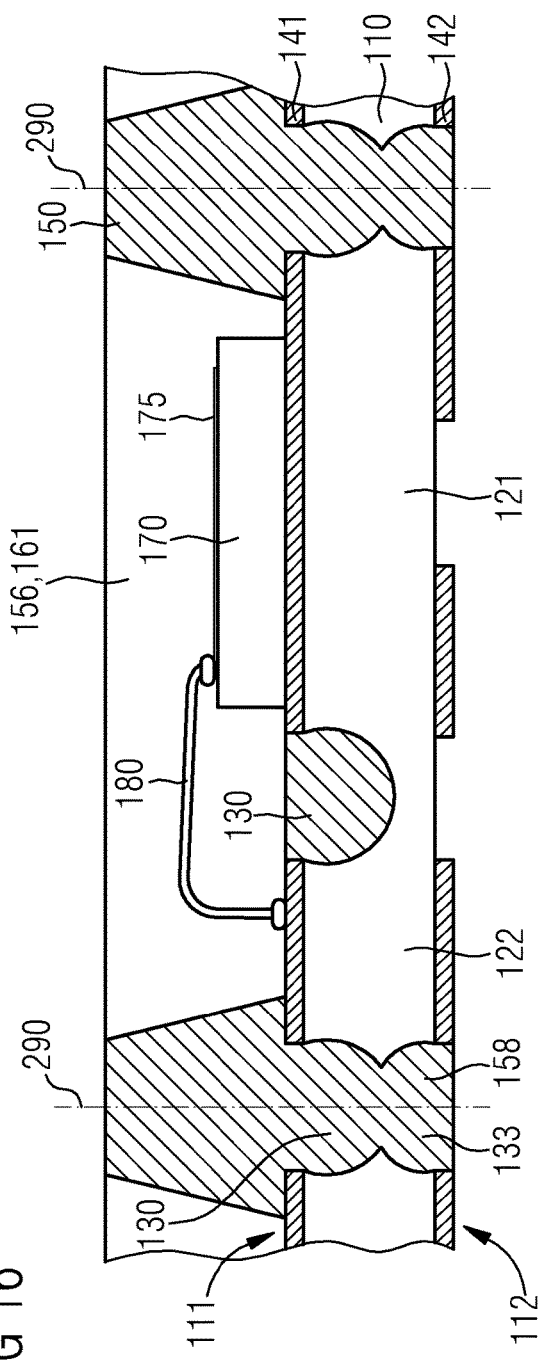

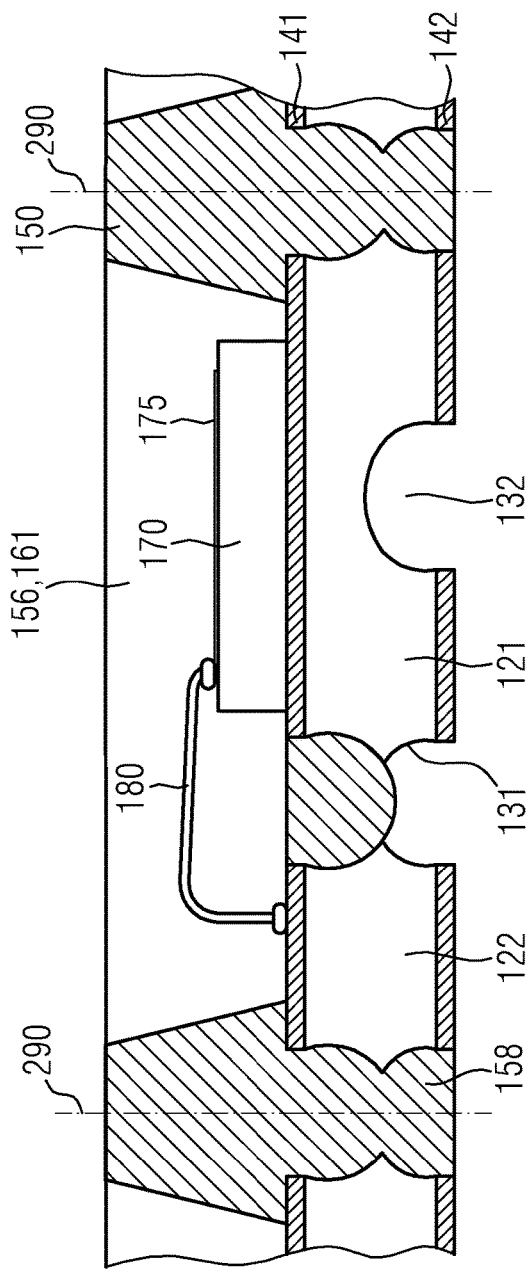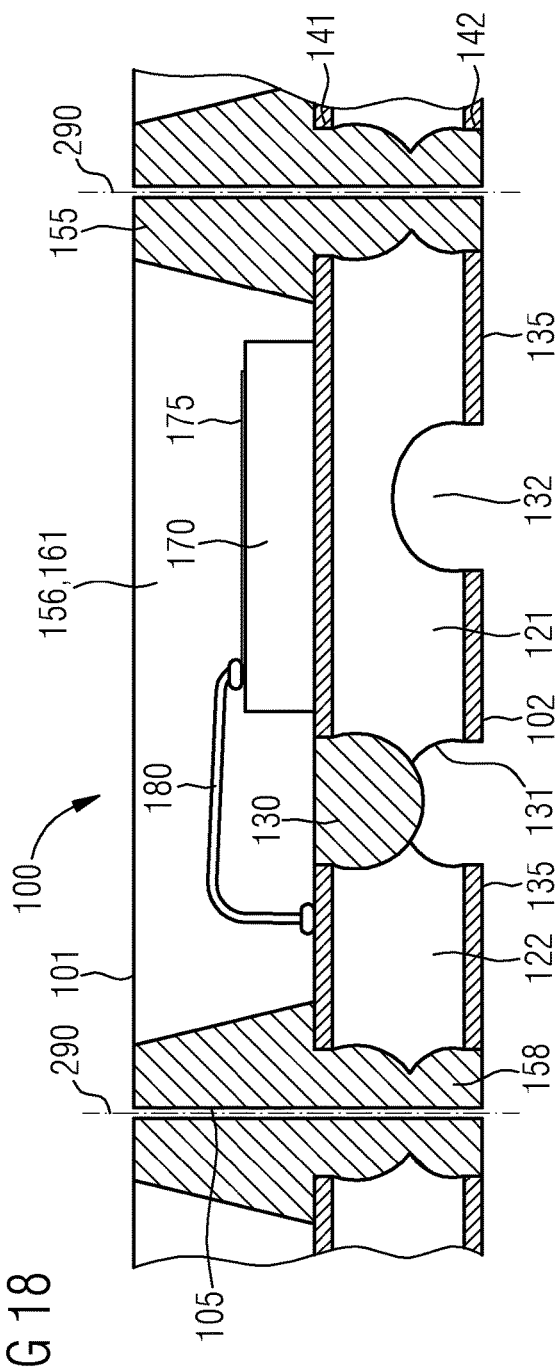

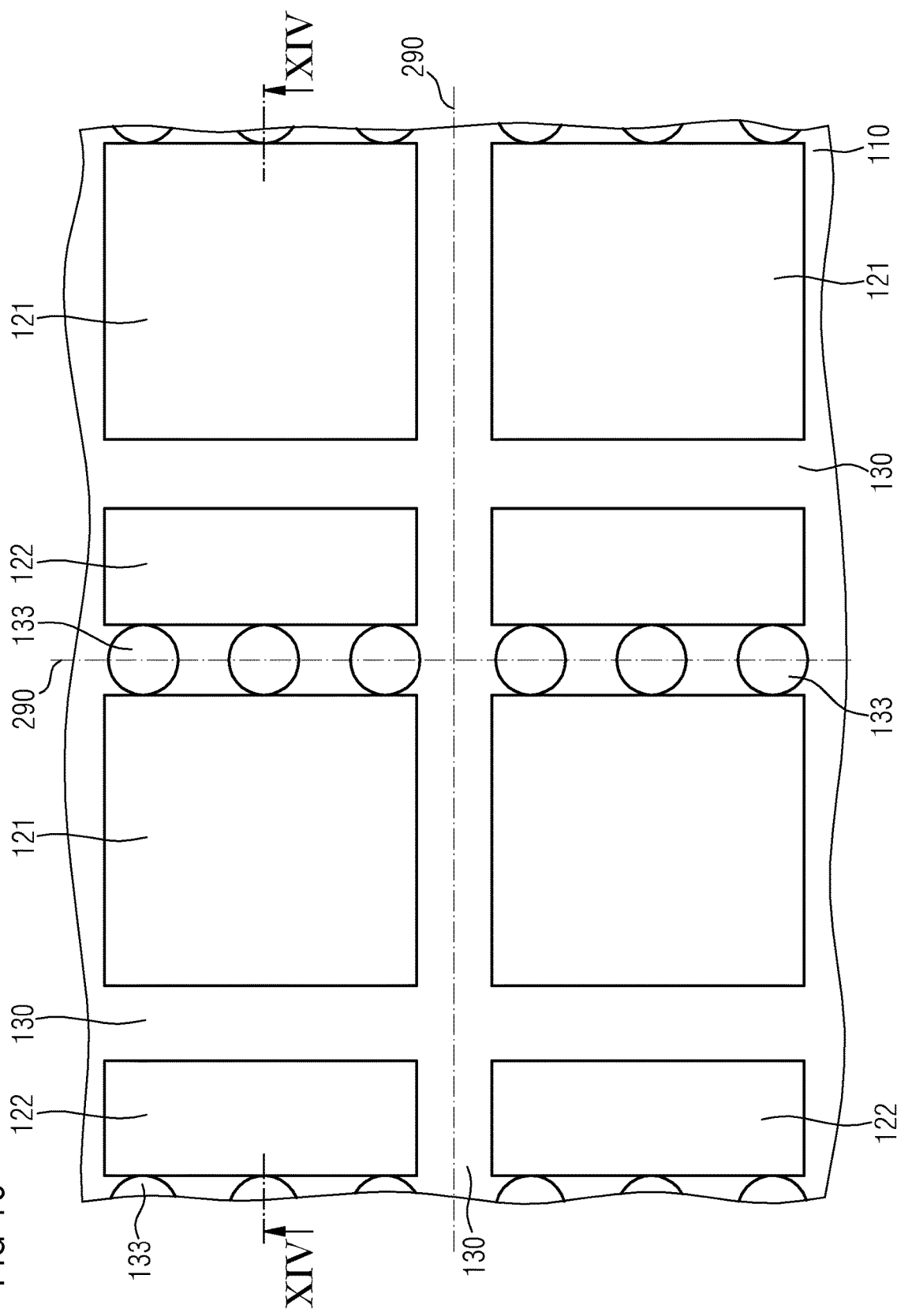

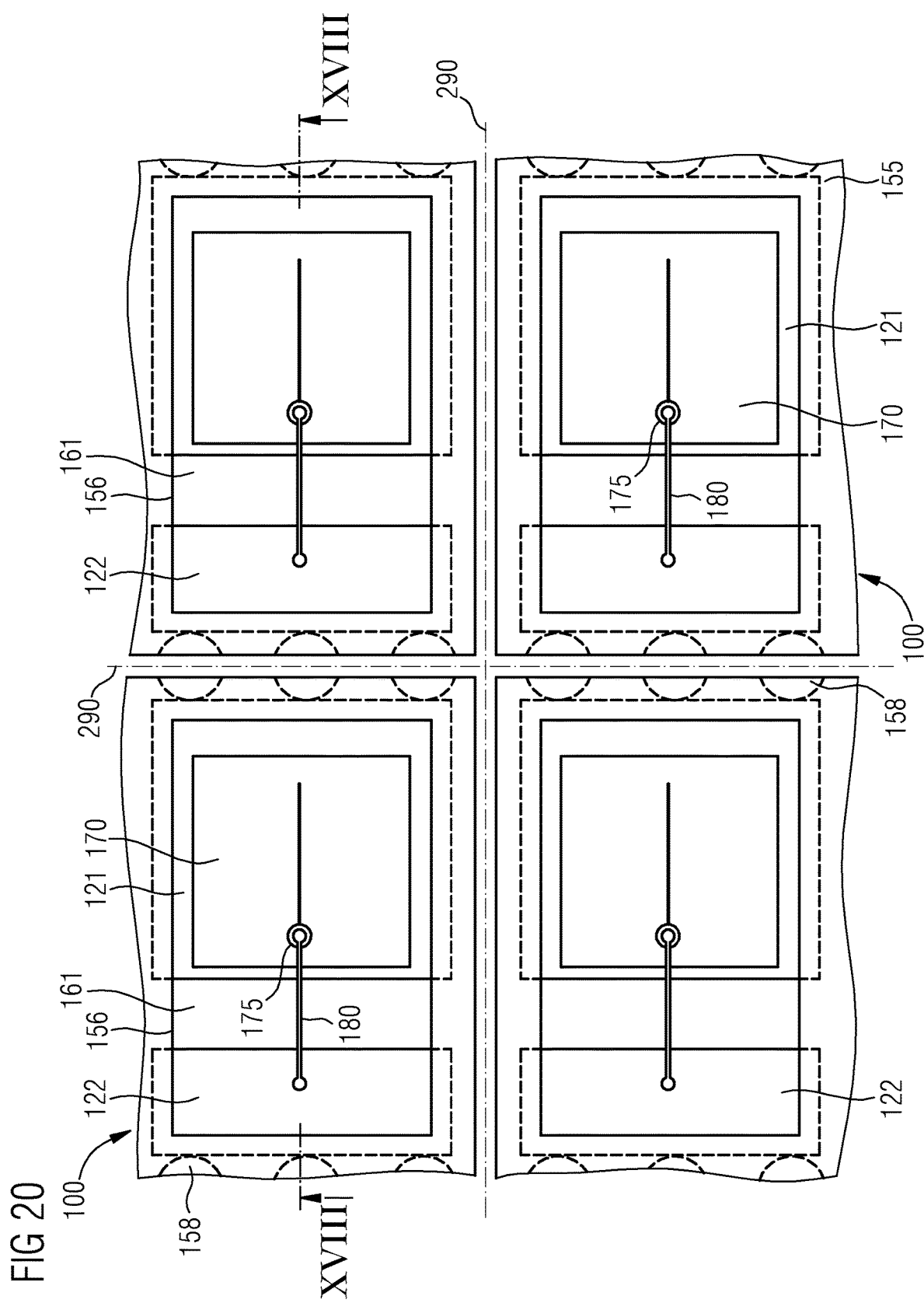

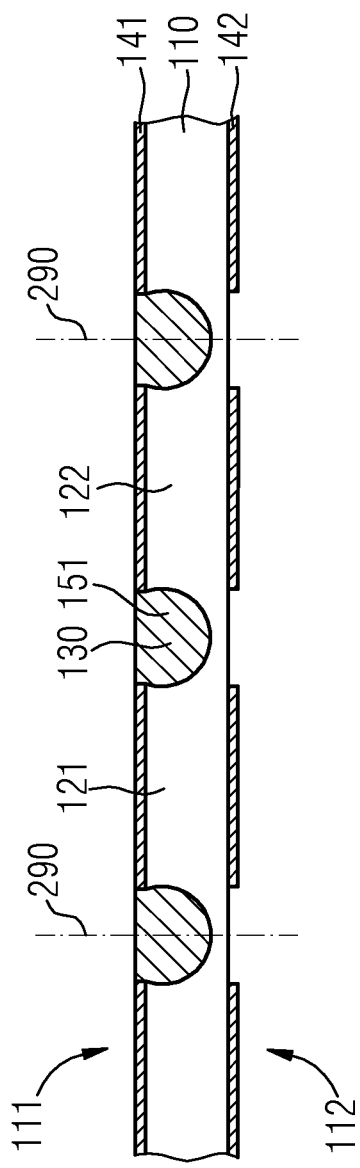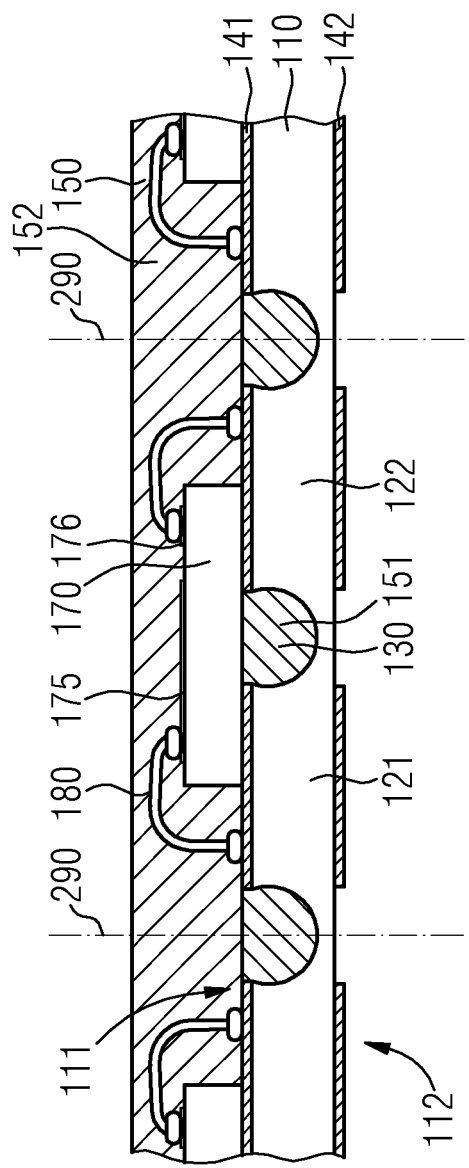

PRODUCTION OF OPTOELECTRONIC COMPONENTS

This application is a 35 U.S.C. § 371 National Phase of PCT Application No. PCT/EP2018/082375, filed Nov. 23, 2018, which claims priority to German Application No. 10 2017 128 457.5, filed Nov. 30, 2017, the disclosures of which are hereby incorporated by reference herein.

The present invention relates to a method for producing optoelectronic components. The invention furthermore relates to an optoelectronic component.

An optoelectronic component for generating light radiation may be implemented in the form of a surface-mountable QFN (Quad Flat No Leads) component. During the production of such components, which may be carried out on a panel, a metal lead frame may be used. The lead frame comprises lead frame sections and connecting bars connecting the lead frame sections (also referred to as tie bars or support bars). The lead frame sections are used for carrying semiconductor chips and for electrical contacting. The connecting bars are used to hold the lead frame together.

The optoelectronic components may be produced with one or more radiation-emitting semiconductor chips, and optionally with a driver chip as well. A package body comprising a cavity for receiving the one or more semiconductor chips may furthermore be formed. To this end, a plastic body connected to the lead frame and comprising cavities may be formed, which is severed together with the connecting bars of the lead frame during singulation carried out at the end of the method.

During production, warping of the connecting bars of the lead frame, and therefore productivity losses, may occur.

Depending on the design of the optoelectronic components and the number of lead frame sections per component, the lead frame may furthermore comprise frame parts assigned to the components. This is associated with a space requirement and corresponding costs. The case of an optoelectronic component comprising a package with a cavity, in which radiation-emitting semiconductor chips and a driver chip are arranged, the driver chip may be illuminated by the radiation-emitting semiconductor chips, which may impair its functionality.

The object of the present invention is to provide a solution for improved production of optoelectronic components, as well as for an improved optoelectronic component.

This object is achieved by the features of the independent patent claims. Further advantageous embodiments of the invention are specified in the dependent claims.

According to one aspect of the invention, a method is provided for producing optoelectronic components. In the method, a metal carrier is provided. The carrier comprises a front side and a rear side opposite to the front side. A further step is front-side removal of carrier material, so that the carrier comprises carrier sections protruding in the region of the front side and depressions arranged between them. The method furthermore comprises formation of a plastic body adjoining carrier sections, and arranging of optoelectronic semiconductor chips on carrier sections. A further step is rear-side removal of carrier material in the region of the depressions, so that the carrier is structured into separate carrier sections. The method furthermore comprises carrying out singulation. In this step, the plastic body is severed between separate carrier sections and singulated optoelectronic components comprising at least one optoelectronic semiconductor chip are formed.

In the method, prestructuring of the mechanical carrier provided is carried out by metal carrier material of the carrier being removed on the front side. The metal carrier prestructured in this way comprises carrier sections protruding in the region of the front side and depressions arranged between them. In this state, the protruding carrier sections are still connected to one another by rear-side carrier material. The protruding carrier sections may be enclosed circumferentially by the depressions. The depressions may merge into one another and form a continuous trench structure.

The plastic body may be formed after the front-side removal of metal carrier material, and therefore on the prestructured metal carrier. The formation of the plastic body may comprise arranging of a plastic material on the prestructured carrier. In this case, the plastic material may be arranged at least in the depressions of the carrier.

By the rear-side removal of metal carrier material of the carrier, which may be carried out after the arranging of a plastic material of the plastic body, or after the formation of the plastic body, the carrier is structured into separate metal carrier sections, i.e. ones which are no longer connected to one another by carrier material. This process is carried out at predetermined positions in the region of the previously produced depressions. In this way, the carrier sections protruding in the region of the front side of the carrier may merge into the separate carrier sections, or may be converted into them, or in other words the carrier sections previously connected to one another may be separated from one another. In this way, short open circuit connections of carrier sections may be broken. After the prestructuring and after the structuring of the carrier, there is respectively a matching number of carrier sections. The separate carrier sections may be held together at least by the plastic body.

During the singulation, the plastic body, and therefore the previously produced component panel, are severed between the separate metal carrier sections. In this way, singulated optoelectronic components comprising at least one optoelectronic semiconductor chip are formed. The optoelectronic components may comprise a plurality of separate carrier sections and a plastic package body obtained from the plastic body by the severing. The at least one optoelectronic semiconductor chip may be arranged on at least one carrier section.

The optoelectronic components produced according to the method may be QFN components which are suitable for surface mounting (SMT, Surface Mounting Technology). In the optoelectronic components, the metal carrier sections, or at least some of the carrier sections, may form rear-side connection surfaces of the components. These carrier sections may furthermore protrude on a rear side of the components. In this way, the components may comprise a structured rear side.

The proposed method offers a range of advantages. The prestructured metal carrier may have a high stability and robustness. The stability may be higher than in the case of a conventional lead frame comprising lead frame sections and connecting bars. Consequently, the method may be carried out with high reliability and productivity. Furthermore, the method may be carried out economically. This is because besides connecting bars, use of frame parts may also be obviated. The omission of connecting bars furthermore makes it possible to produce the optoelectronic components with small external dimensions. In addition, high flexibility is made possible in relation to the configuring of the carrier sections. For example, a configuration may therefore be implemented in which, for each of the components produced, at least one metal carrier section is enclosed by a group of carrier sections. Furthermore, the singulation, during which the plastic body is severed between the separate metal carrier sections, may be carried out simply and economically. This is because slow vision or sawing of metal carrier material is not carried out in this case.

Because of the use of the metal carrier, which is structured into separate carrier sections in the course of the method, the optoelectronic components may be distinguished by efficient dissipation of heat and a low thermal resistance. Furthermore, because of the severing of the plastic body between separate metal carrier sections, the optoelectronic components may comprise a circumferential lateral surface (totality of the lateral outer sides) which is formed exclusively by the plastic package body. In this way, it is possible to avoid problems (for example, corrosion, sealing defects) such as may arise in the case of conventional components with metal connecting bars to be severed which extend as far as lateral outer sides.

Further possible embodiments and details, which may be envisioned for the method and for optoelectronic components produced according to the method, are described below.

The metal carrier provided may have a plate-shaped or strip-shaped configuration. The carrier may also have a planar or substantially planar front side, as well as a planar or substantially planar rear side. Furthermore, the carrier may for example be made from copper, or comprise copper. Also possible is a configuration in which the carrier is made from a different metal material, or comprises a different metal material, example iron-nickel, aluminum or molybdenum.

In a further embodiment, the front-side removal and the rear-side removal of metal carrier material may be carried out by means of etching. For example, isotropic etching is possible. This may be carried out by a wet chemical etching method. As a result of isotropic etching, the depressions may have a round cross-sectional profile. The depressions may also comprise an undercut, so that interlocking is possible between the carrier and the plastic body, and therefore also between the separate carrier sections and the plastic body. Furthermore, the separate carrier sections, or at least some of the carrier sections, may comprise side flanks with two curved partial flanks forming a common edge.

In respect of the etching, the metal carrier may be provided with an etching mask on the front side and an etching mask on the rear side. The etching masks may comprise separate layer sections, with which regions of the front side and of the rear side of the carrier are covered.

Furthermore, the front-side etching mask and/or the rear-side etching mask may be metal etching masks. Such etching masks may be formed on the metal carrier by using at least one metallization method (plating). The metal etching masks may still remain on the carrier and the carrier sections after the removal of carrier material, and may to this extent be regarded as an integral part of the carrier and of the carrier sections. In this case, the etching masks may be used as contactable coatings, which are suitable for example for soldering, connection of contact structures, for example bond wires, etc.

It is also possible to use a resist mask, consisting of a photoresist material, as an etching mask. Such an instance may be envisioned for a rear-side etching mask and for the case, explained below, in which the rear-side etching mask is removed and metal carrier sections are subsequently provided with a wetting layer. The configuration consisting of a photoresist material allows simple removal of the etching mask. A front-side etching mask may also be used in the form of a resist mask consisting of a photoresist material.

During the structuring of the metal carrier into separate carrier sections, there is furthermore the possibility of removing, or etching, carrier material on the rear side not only in the region of the depressions but also at other positions. This may be done using a rear-side etching mask adapted therefor. In this way, for example, it is possible to form separate carrier sections that comprise a rear-side depression, a stepped configuration or a smaller thickness in comparison with other carrier sections.

In a further embodiment, the arranging of the optoelectronic semiconductor chips and carrier sections may be carried out before the rear-side removal of metal carrier material, and therefore before the structuring of the carrier into separate carrier sections. In this embodiment, chip mounting of the optoelectronic semiconductor chips is therefore carried out on the prestructured metal carrier. This process may be carried out after the application of a plastic material of the plastic body on the carrier, or after the formation of the plastic body.

In an alternative embodiment, the arranging of the optoelectronic semiconductor chips and carrier sections is carried out after the rear-side removal of metal carrier material, and therefore after the structuring of the carrier into separate carrier sections. In this embodiment, mounting of the optoelectronic semiconductor chips is therefore carried out on separate metal carrier sections. This process may possibly be carried out after the arranging of a plastic material of the plastic body on the carrier, or after the formation of the plastic body. The arranging of optoelectronic semiconductor chips on already separated carrier sections offers the possibility of avoiding damage to semiconductor chips during the rear-side removal of carrier material.

In respect of the embodiment described above, the mounting of the optoelectronic semiconductor chips may be carried out on an arrangement that comprises separate metal carrier sections and the plastic body. This arrangement may form a prefabricated package, also referred to as a premolded package.

In a further embodiment, the optoelectronic semiconductor chips used in the method are radiation-emitting semiconductor chips. In this way, radiation-emitting optoelectronic components may be produced with the aid of the method. The semiconductor chips may for example be light-emitting diode chips, which are also referred to below as LED chips.

The mounting of the optoelectronic semiconductor chips may be carried out in such a way that the semiconductor chips are respectively placed on only one or on a plurality of carrier sections. In this process, the semiconductor chips may, for example, be fastened on carrier sections by adhesive bonding, soldering or sintering. If the semiconductor chips comprise one or more rear-side contacts, the semiconductor chips, or their rear-side contacts, may in this way be electrically connected to carrier sections. In a configuration of the semiconductor chips with one or more front-side contacts, it is furthermore possible to form electrical contact structures, by means of which the front-side contacts are electrically connected to carrier sections. For example, connection of bond wires or formation of metal contact layers, which are also referred to as PI (planar interconnect) contacts or RDL layers (redistribution layers), is possible. In the scope of the formation of contact layers, one or more insulating layers reaching laterally as far as the semiconductor chips may furthermore be formed with recesses in order to keep regions to be contacted of carrier sections free. The contact layers may be formed thereon.

In a further embodiment, the formation of the plastic body is carried out in such a way that the plastic body comprises cavities. The optoelectronic semiconductor chips are subsequently arranged on carrier sections in cavities of the plastic body. The formation of such a plastic body may be carried out with the aid of a molding process, in which a plastic material is applied on the prestructured metal carrier by using a molding tool. For example, a reflective plastic material may be used. Such a plastic material may contain reflective particles and have a white color. It is also possible to use a black plastic material. By means of the cavities of the plastic body, carrier sections are at least partially exposed so that optoelectronic semiconductor chips may be arranged on them. The cavities may have a cross-sectional shape widening in the direction of a front side of the optoelectronic components to be produced, for example with oblique side walls. In this way, the cavities may be used as reflectors in the optoelectronic components. During the singulation, the plastic body may be subdivided into plastic package bodies comprising at least one cavity.

In a further embodiment, a filler material is introduced into cavities of the plastic body. In this way, semiconductor chips located in the cavities may be encapsulated and thereby protected against external influences. In respect of the optoelectronic, or radiation-emitting, semiconductor chips used in the method, the filler material may be a radiation-transmissive, or clear, plastic material. It is also possible to use a radiation-transmissive plastic material containing phosphor particles as the filler material. In this way, radiation conversion of the radiation emitted by at least one radiation-emitting semiconductor chip during operation may be brought about.

In respect of the achieving of radiation conversion, there is furthermore the possibility of using radiation-emitting semiconductor chips that already comprise a conversion element in layer form or in platelet form for radiation conversion. Furthermore, a conversion layer of this type, or a conversion element, may also be formed or arranged on semiconductor chips after the chip mounting.

With the aid of the method, it is possible to manufacture optoelectronic components comprising a single optoelectronic, or radiation-emitting, semiconductor chip, or components comprising a plurality of optoelectronic, or radiation-emitting, semiconductor chips. The plurality of semiconductor chips may optionally be configured for generating different light radiations. In relation to the latter variant, for example, it is possible to implement RGB components that comprise a semiconductor chip for emitting red light radiation, a semiconductor chip for emitting green light radiation and a semiconductor chip for emitting blue light radiation. Correspondingly, the chip mounting is in this carried out with red-emitting, green-emitting and blue-emitting semiconductor chips. If a plastic body comprising cavities is formed, a plurality of optoelectronic, or radiation-emitting, semiconductor chips, which form part of an optoelectronic component, may respectively be placed in a common cavity.

In a further embodiment, in addition to optoelectronic semiconductor chips, driver chips are arranged on carrier sections. Furthermore, the singulation is carried out in such a way that the optoelectronic components thereby formed comprise a driver chip. With the aid of the driver chips, the optoelectronic semiconductor chips of the optoelectronic components may be electrically driven.

The mounting of the driver chips may be carried out before or after the rear-side removal of metal carrier material.

Furthermore, the carrier chips and the driver chips may be mounted together with the optoelectronic semiconductor chips, or alternatively before the optoelectronic semiconductor chips. The second variant may be carried out for the purpose of providing a prefabricated package (premolded package) with driver chips, and only subsequently carrying out the mounting of the optoelectronic semiconductor chips.

In respect of the mounting of the driver chips, features and details described above for the optoelectronic semiconductor chips may be used accordingly. For example, the driver chips may be fastened on one or more carrier sections by adhesive bonding, soldering or sintering. The driver chips may comprise a plurality of front-side contacts. Electrical contact structures, by means of which the front-side contacts of the driver chip are electrically connected to carrier sections, may be formed, for example in the form of bond wires or metal contact layers. Electrical connections between the driver chips and optoelectronic semiconductor chips may be produced in this way. In the optoelectronic components manufactured in this way, a driver chip and an optoelectronic semiconductor chip may be electrically connected at least by means of a metal carrier section, and optionally by means of a further component part, for example a bond wire.

In a further embodiment, the formation of the plastic body is carried out in such a way that the driver chip is embedded in the plastic body. If the plastic body is formed with cavities, according to an alternative embodiment, the driver chips may also be arranged in cavities of the plastic body. These may be cavities that are provided only for the driver chips and not for the optoelectronic semiconductor chips. A filler material may also be introduced into such cavities. This may be a radiation-opaque plastic material. In the aforementioned embodiments, irradiation of driver chips with radiation of optoelectronic semiconductor chips, and therefore impairment of the functionality of the driver chips, may be suppressed.

In respect of the use of driver chips, there is the possibility of producing optoelectronic components that comprise a radiation-emitting semiconductor chip and a driver chip for driving of the radiation-emitting semiconductor chip.

Furthermore, it is possible to produce optoelectronic components that comprise a plurality of radiation-emitting semiconductor chips and at least one driver chip for driving of the radiation-emitting semiconductor chips. The semiconductor chips may be configured for generating different light radiations, for example a red, a green and a blue light radiation. In this configuration, the optoelectronic components may, for example, be used as intelligent RGB illumination components for the interior of motor vehicles. In this case, the components may be operated from the battery voltage of a motor vehicle. The battery voltage may be substantially higher than the forward voltage of the radiation-emitting semiconductor chips, so that a high thermal loss power may be generated. By configuration of the components with the metal carrier sections, the heat energy produced may be dissipated efficiently.

In a further embodiment, through-holes are formed in the metal carrier. Furthermore, the subsequent formation of the plastic body is carried out in such a way that the plastic body comprises rear-side anchoring sections arranged in the through-holes. This configuration allows anchoring and therefore reliable fastening of the plastic body on the metal carrier, and consequently also on the carrier sections which are separate after the structuring of the carrier.

Correspondingly, the plastic package bodies, which are obtained after the singulation, of the optoelectronic components may comprise one or more rear-side anchoring sections, with which the plastic package bodies may be anchored on separate carrier sections. During the singulation, anchoring sections of the plastic body may be severed and thereby distributed between a plurality of plastic package bodies. By the anchoring, high reliability of the method and high mechanical stability and robustness of the optoelectronic components may be achieved.

In respect of the embodiment described above, there is the possibility of forming through-holes in the region of depressions of the prestructured metal carrier, and therefore by rear-side removal of metal carrier material. Such through-holes may merge into the depressions. In addition or as an alternative, through-holes may also be provided inside the protruding carrier sections of the prestructured carrier. This may be done by front-side and rear-side removal of carrier material. In this case, the front-side removal of carrier material may be carried out in the scope of formation of the depressions. The removal of carrier material may respectively be carried out by means of etching.

The anchoring sections may at least in part have a shape widening in the direction of the rear side of the carrier, and after the structuring of the carrier, or after the singulation, in the direction of the rear side of separate carrier sections. In this way, reliable anchoring may be achieved. This configuration may be implemented by carrying out the formation of the through-holes by means of etching, or isotropic etching. In this way, the through-holes may have a shape widening at least in part in the direction of the rear side of the carrier. The rear-side removal, or etching, of carrier material may furthermore be carried out in such a way that the through-holes have a shape widening in steps, or widening in steps relative to the depressions, in the region of the rear side of the carrier. Correspondingly, the anchoring sections may have a shape widening in steps in the region of the rear side.

In a further embodiment, the formation of the plastic body is carried out in such a way that the optoelectronic semiconductor chips are embedded in the plastic body. In this way as well, the semiconductor chips may be encapsulated and thereby protected against external influences.

For the formation of such an encapsulated plastic body, a plastic material may be arranged on the prestructured metal carrier equipped with optoelectronic semiconductor chips. The plastic material may be applied in the form of a continuous layer covering the optoelectronic semiconductor chips. To this end, for example, a molding process or a casting process may be carried out. In respect of the optoelectronic, or radiation-emitting, semiconductor chips used in the method, the plastic material may be radiation-transmissive, or clear. It is also possible for the plastic material to be radiation-transmissive and contain phosphor particles. In this way, radiation conversion of the radiation emitted by at least one radiation-emitting semiconductor chip during operation of the optoelectronic components may be brought about.

In respect of the embedding of the optoelectronic semiconductor chips in the plastic body, the following embodiment may furthermore be envisioned. In this case, the formation of the plastic body comprises arranging of a first and a second plastic material. The first plastic material is a reflective plastic material, and is arranged in the depressions of the prestructured carrier before the arranging of the optoelectronic semiconductor chips. In this case, the first plastic material may be flush with carrier sections protruding in the region of the front side. After the arranging of the optoelectronic semiconductor chips, the second plastic material is arranged on the first plastic material, the optoelectronic semiconductor chips and carrier sections. In this way, the optoelectronic semiconductor chips are embedded in the second plastic material.

In the embodiment described above, the plastic body is formed from two different plastic materials, i.e. the first and second plastic materials. Correspondingly, the plastic package bodies, obtained after the singulation, of the optoelectronic components comprise the first and second plastic materials. In this case, rear-side radiation emission during operation of the optoelectronic components may be prevented with the aid of the reflective first plastic material. The first plastic material may contain reflective particles and have a white color. The second plastic material may be radiation-transmissive, or clear. It is also possible for the second plastic material to be radiation-transmissive and contain phosphor particles, so that radiation conversion may be brought about.

As indicated above, in the optoelectronic components produced with the method, at least some of the metal carrier sections may protrude through on a rear side of the components. These carrier sections may form rear-side connection surfaces of the optoelectronic components, with the aid of which the components may be arranged by soldering in the scope of surface mounting on connection surfaces of a further device, for example a circuit board. For reliable surface mounting, the relevant carrier sections may furthermore be configured in such a way that defined wetting of the carrier sections with a solder may be achieved at predetermined positions. In this context, the following embodiments may be envisioned.

In a further embodiment, after the structuring of the metal carrier into separate carrier sections, a metal wetting layer is formed on a rear side and on side flanks of carrier sections. To this end, an etching mask (if present) still present on the rear side on carrier sections may initially be removed, and subsequently, or after additional cleaning of the carrier sections, the formation of the metal wetting layer may be carried out by using at least one metallization method. These processes may be carried out before the singulation. The configuration of carrier sections with a wetting layer present on a rear side and on side flanks makes multiside wetting of the carrier sections with a solder possible over a relatively large wetting area. In this way, a high shear strength of the surface-mounted optoelectronic components may be achieved. Furthermore, solder control is possible.

In an alternative embodiment, after the structuring of the metal carrier into separate carrier sections, an antiwetting layer is applied on side flanks and a metal wetting layer is applied on a rear side of carrier sections. The antiwetting layer is a layer on which no or only slight wetting with a solder can take place. To this end, an etching mask (if present) still present on the rear side on carrier sections may initially be removed, and subsequently, or after additional cleaning of the carrier sections, the antiwetting layer may be formed on side flanks and on a rear side of carrier sections. To this end, a metal layer, for example a nickel layer) may be formed by a metallization method on the relevant carrier sections and subsequently oxidized. The antiwetting layer thereby formed may subsequently be removed at least partially on the rear side of the carrier sections, for example mechanically by means of grinding or lapping. Following this, the metal wetting layer may be formed on the rear side of the carrier sections by using at least one metallization method. In this configuration, merely rear-side planar wetting of carrier layers with a solder may be brought about in a controlled way. This provides the possibility of providing small carrier sections and small distances between carrier sections, and consequently of producing optoelectronic components with small dimensions.

According to one aspect of the invention, an optoelectronic component is provided. The optoelectronic component comprises a plurality of separate metal carrier sections, a plastic package body adjoining the carrier sections and at least one optoelectronic semiconductor chip. The optoelectronic semiconductor chip is arranged on at least one carrier section. A circumferential lateral surface of the optoelectronic component is formed by the plastic package body.

The optoelectronic component comprises a lateral surface formed by the plastic package body. There is therefore no metal material on the lateral surface. The optoelectronic component may be produced according to the method described above or according to one or more of the above-described embodiments of the method. Some or several of the embodiments and features mentioned below may therefore be present in the optoelectronic component.

The optoelectronic component may be a surface-mountable component. The component may be a QFN component. A rear side of the component, which may be formed by the plastic package body and the metal carrier sections, may be structured and nonplanar. At least some of the carrier sections may protrude on the rear side. The carrier sections protruding on the rear side may form rear-side connection surfaces of the component. The carrier sections, or at least some of the carrier sections, may also comprise side flanks with two curved partial flanks forming a common edge.

With reference to the structured rear side, the carrier sections may protrude relative to the plastic package body, or plastic material of the plastic package body. The overhang may, for example, lie in the two-figure micrometer range. For example, an overhang in the range of 50 µm is conceivable. Other overhangs, for example in the range of 20 µm or 30 µm, are also possible.

At least some of the metal carrier sections may comprise a metal wetting layer on a rear side and on side flanks. It is also possible for at least some of the metal carrier sections to comprise an antiwetting layer on side flanks. These carrier sections may furthermore comprise a metal wetting layer on a rear side. In this case, the connection surfaces of the optoelectronic component may be formed by the wetting layers of the carrier sections.

The at least one optoelectronic semiconductor chip may be a radiation-emitting semiconductor chip, or an LED chip. The optoelectronic component may be an RGB component comprising a red-emitting, a green-emitting and a blue-emitting semiconductor chip.

The plastic package body may be formed from a plastic material, for example a white reflective or a black plastic material. A front side of the optoelectronic component may be formed at least in part by the plastic package body.

In a further embodiment, the plastic package body comprises a cavity in which the at least one optoelectronic semiconductor chip is arranged. The cavity may be filled with a filler material, which may be radiation-transmissive and may optionally contain phosphor particles.

In a further embodiment, the at least one optoelectronic semiconductor chip is embedded in the plastic package body. In this case, the plastic package body may at least in part be formed from a radiation-transmissive plastic material optionally containing phosphor particles. Furthermore, the plastic package body may be formed from a first and a second plastic material. The first plastic material may be a reflective plastic material and being located laterally next to and between the carrier sections. In this case, the first plastic material may be flush with front sides of the carrier sections.

The second plastic material may be arranged on the first plastic material, the carrier sections and the at least one optoelectronic semiconductor chip, so that the semiconductor chip is embedded in the second plastic material. The second plastic material may be radiation-transmissive and optionally contain phosphor particles.

In a further embodiment, the plastic package material comprises at least one rear-side anchoring section. The anchoring section may be flush on the rear side with at least one metal carrier section, or at least with a rear-side connection surface formed by a carrier section. The anchoring section may be laterally adjoining at least one carrier section. The anchoring section may furthermore be located at the edge of the component, or in a region between a plurality of metal carrier sections of the component. A position inside the carrier section is also possible. The anchoring section may at least in part have a shape widening in the direction of the rear side of the component. A configuration in which the anchoring section has a shape projecting in steps in the region of the rear side is also possible. In a configuration of the plastic package material comprising a plurality of anchoring sections, these may be present laterally with respect to and/or inside one or more carrier sections.

In a further embodiment, the optoelectronic semiconductor chip comprises a driver chip for electrical driving of the at least one optoelectronic semiconductor chip. The driver chip may be arranged on at least one carrier section. The driver chip may be embedded in the plastic package body or be arranged in a cavity, provided specifically for the driver chip, of the plastic package body. This cavity may also be filled with a filler material, which may be radiation-transmissive.

The driver chip and the at least one optoelectronic semiconductor chip of the optoelectronic component may furthermore be electrically connected at least by means of a metal carrier section, and optionally a further component part, for example a bond wire. The relevant carrier section may in part be exposed by means of a cavity, in which the optoelectronic semiconductor chip may be located, of a plastic package body of the component.

It is to be pointed out that aspects and details mentioned in relation to the production method may also be used correspondingly for the optoelectronic component, and aspects and details mentioned in relation to the optoelectronic component may also be used for the production method.

The configurations and refinements of the invention, which are explained above and/or presented in the dependent claims, may—except for example in cases of unique dependencies or incompatible alternatives—be used individually but also in any desired combination with each other.

The above-described properties, features and advantages of this invention, as well as the way in which they are achieved, will become more clearly and readily comprehensible in conjunction with the following description of the exemplary embodiments, which will be explained in more detail in connection with the schematic drawings, in which:

FIGS. 1 to 10 show a method sequence for the production of optoelectronic components with the aid of lateral representations and plan representations, wherein a metal layer is prestructured, a plastic body comprising cavities is formed, optoelectronic semiconductor chips are arranged on carrier sections in cavities, the cavities are filled, the carrier is structured, and a singulation process is carried out;

FIG. 13 shows a lateral representation of a prefabricated package;

FIGS. 14 to 20 show a further method sequence for the production of optoelectronic components with the aid of lateral representations and plan representations, wherein the optoelectronic components comprise anchoring structures;

Figure 38:
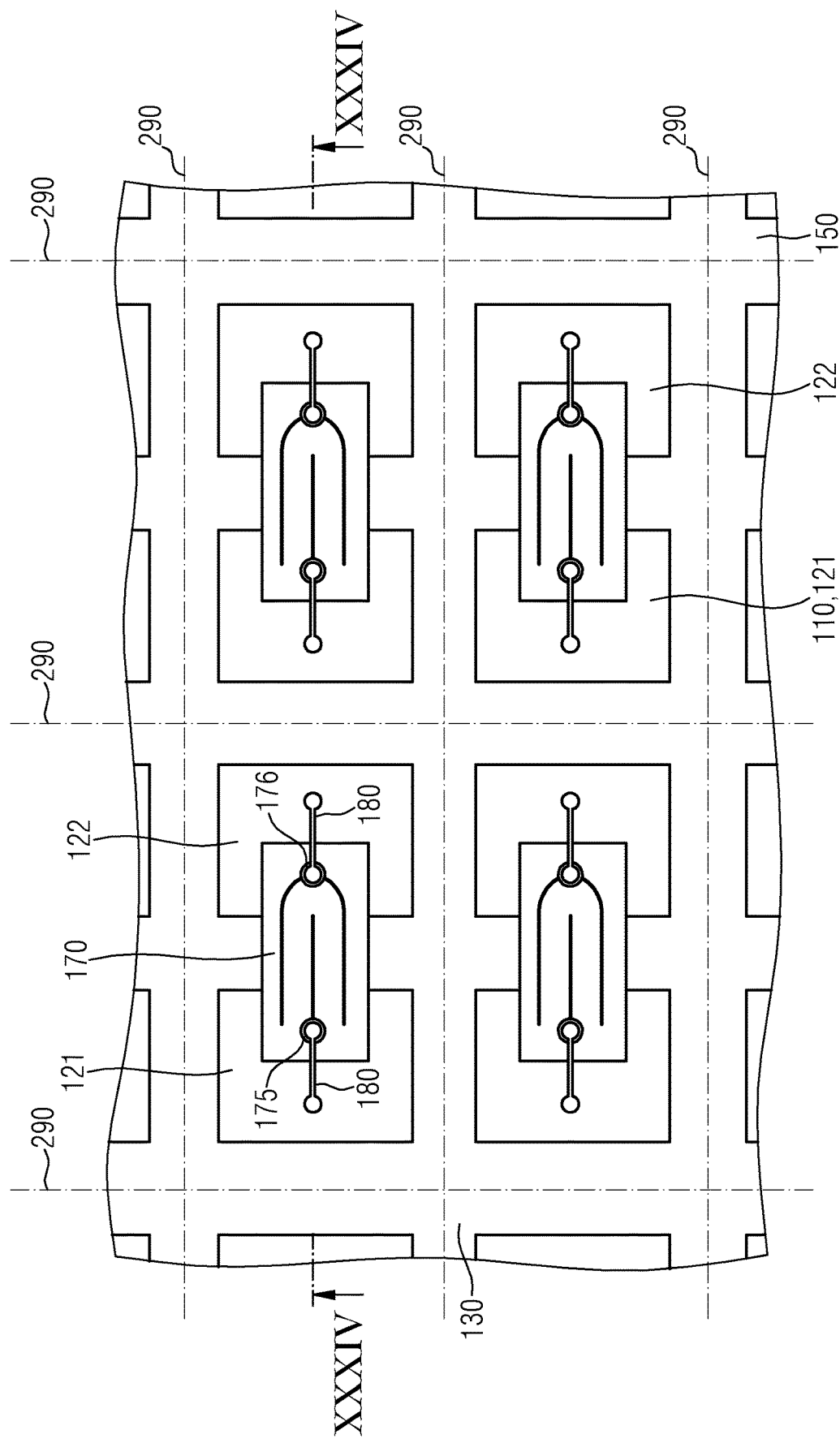
Figure 39:
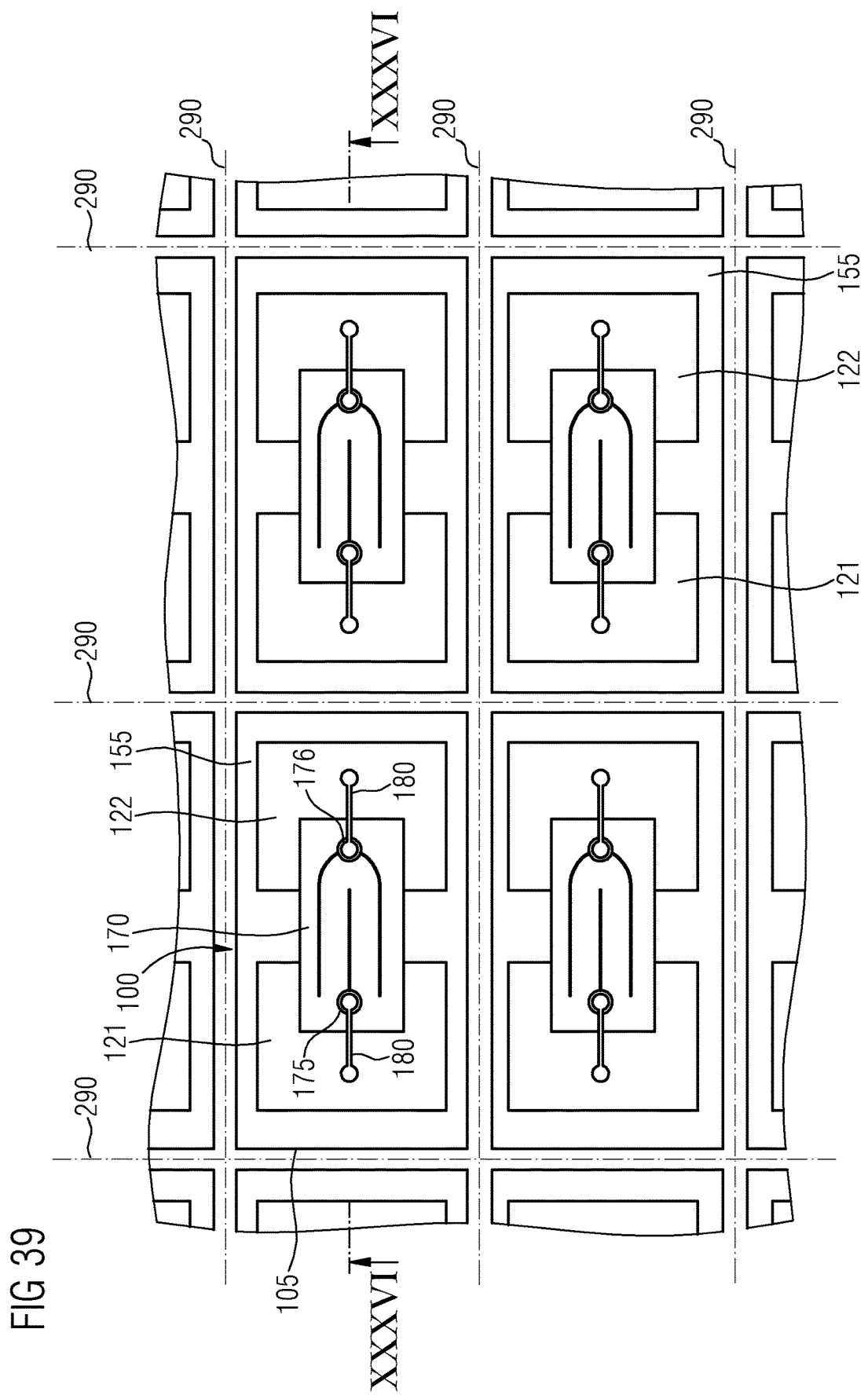
Figure 40:
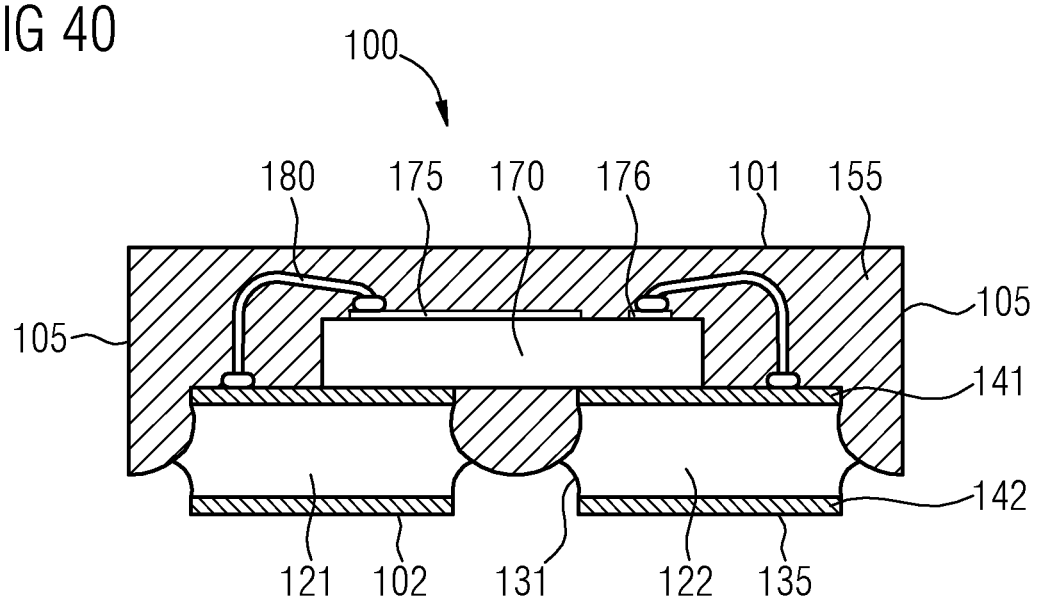
Figure 41:
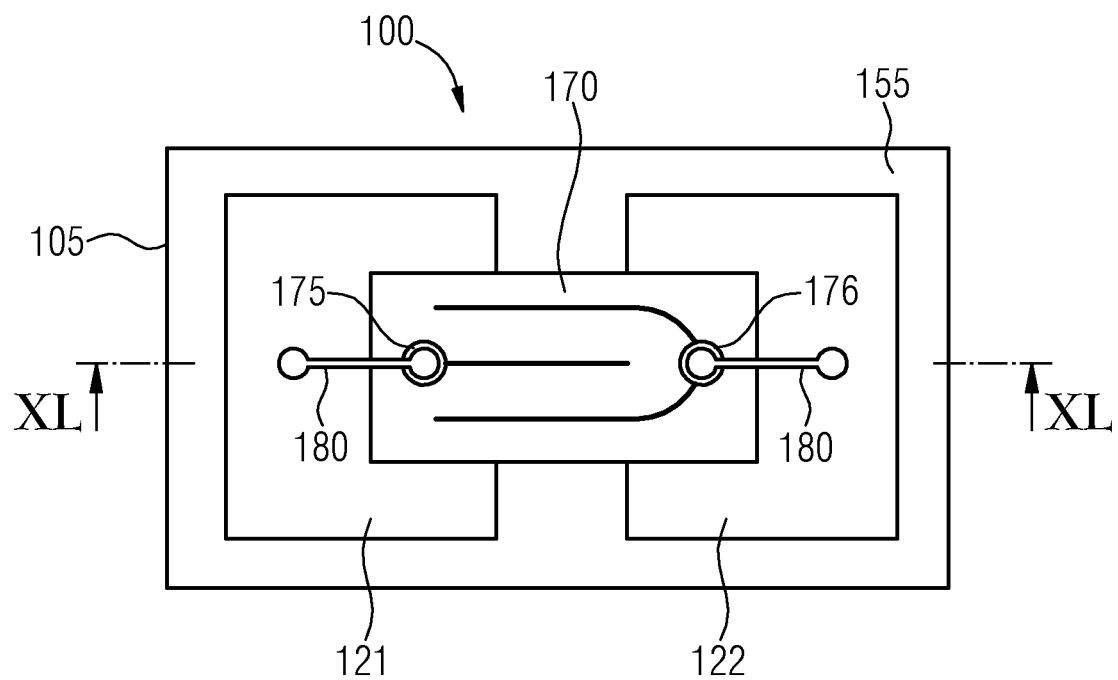
Figure 42:
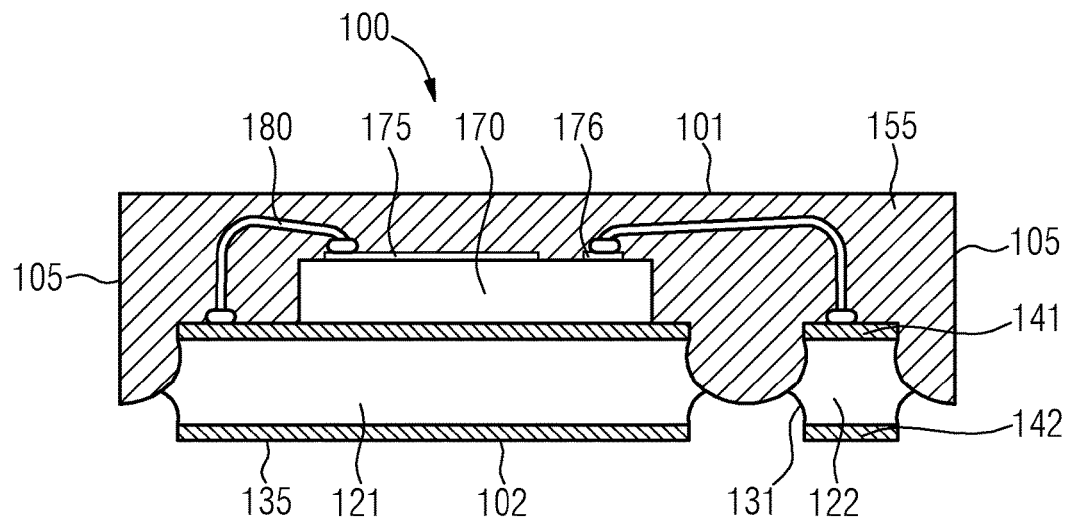
Figure 43:
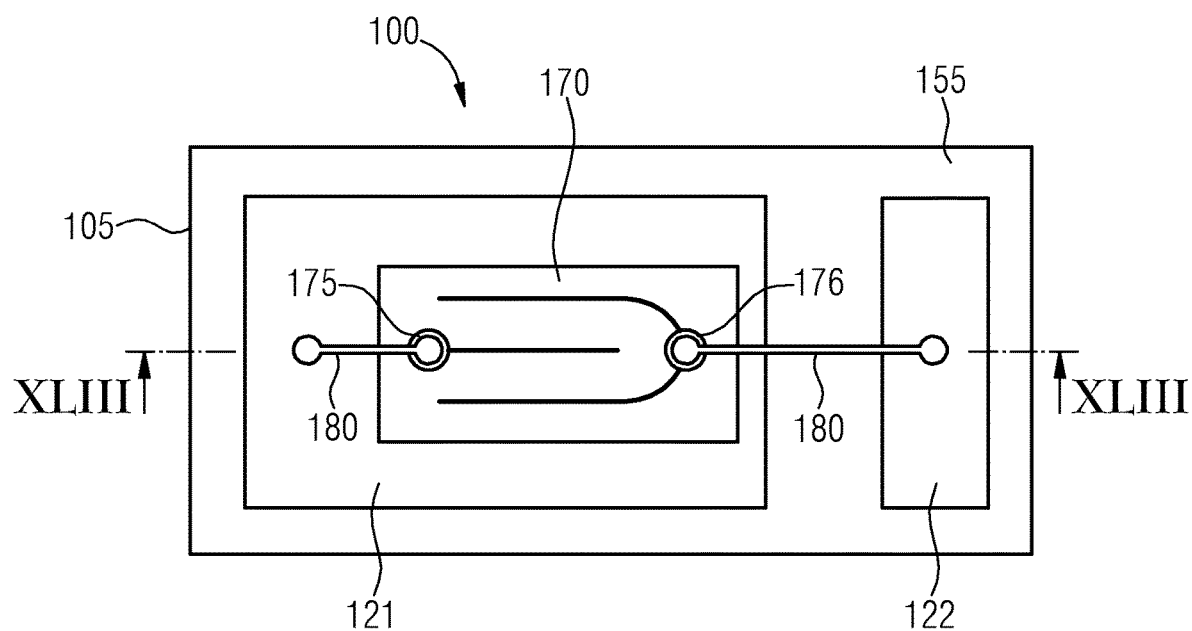
Figure 44:
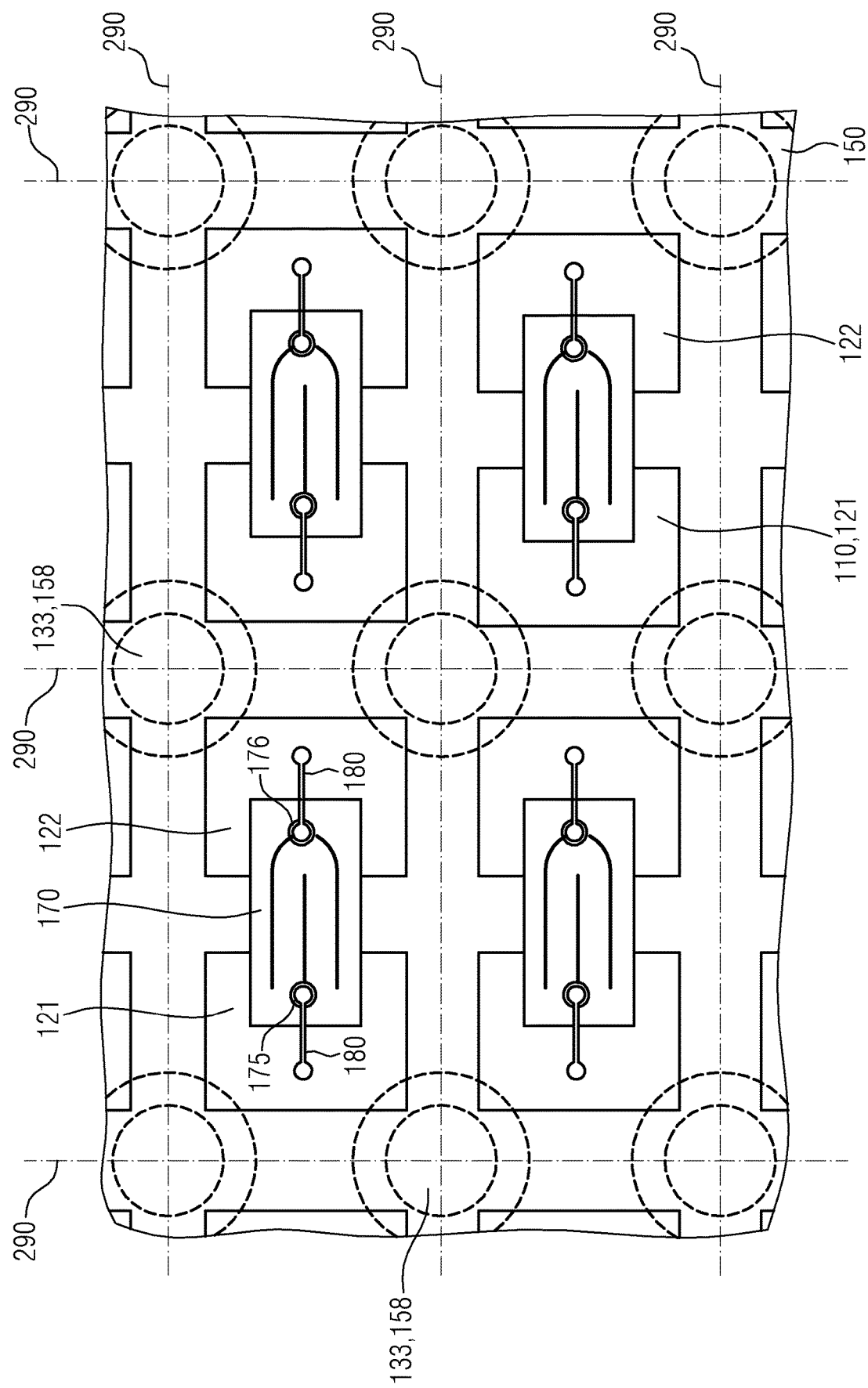
Figure 45:
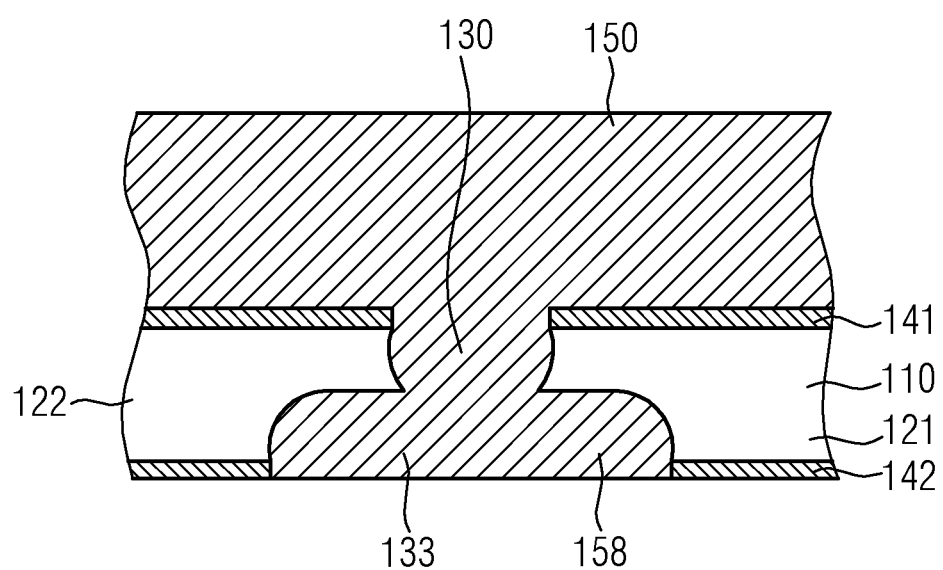
Figure 48:
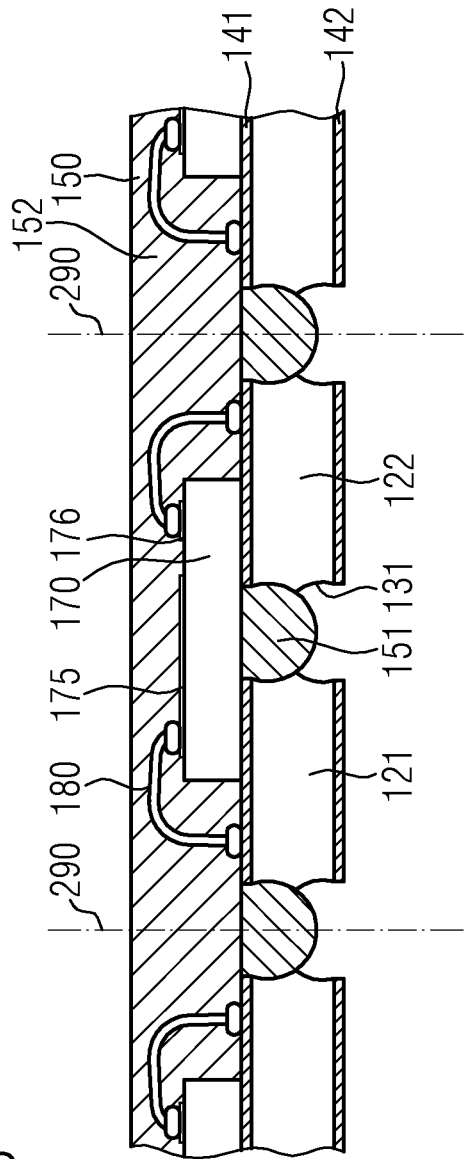
Figure 49:
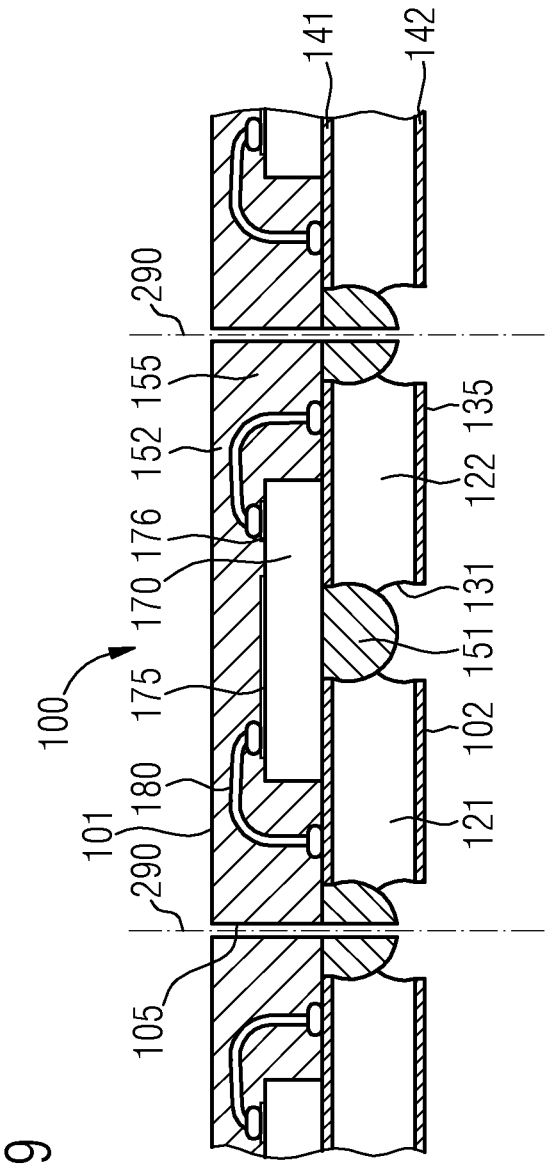
Figure 50:
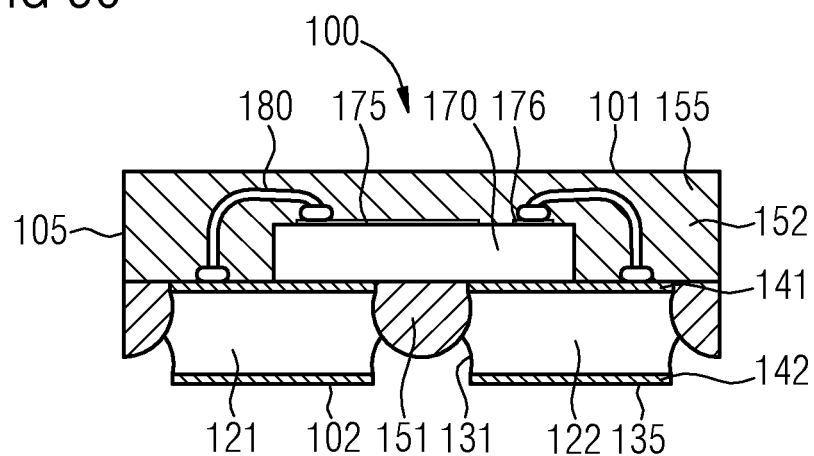
Figure 51:
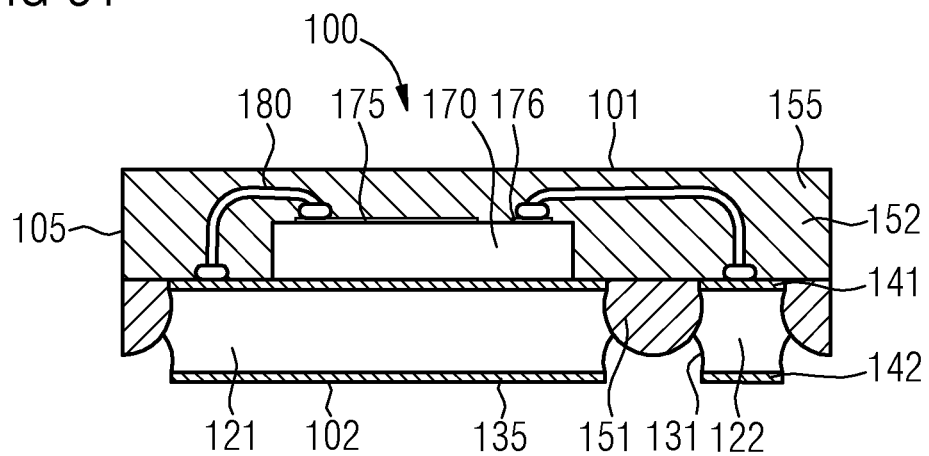
Figure 52:
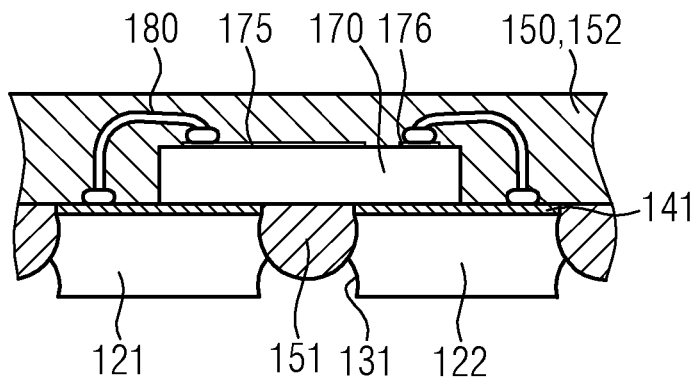
Figure 53:
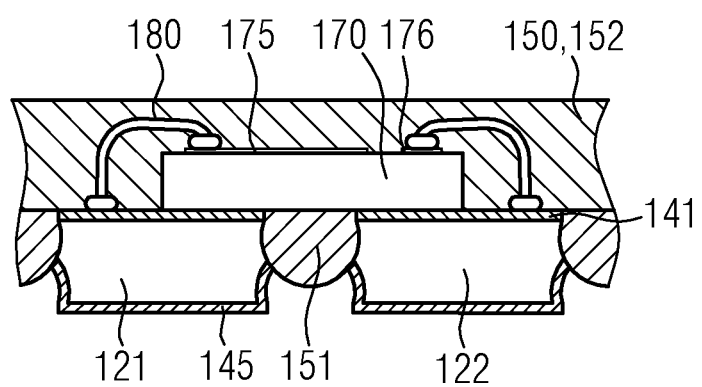
Figure 54:
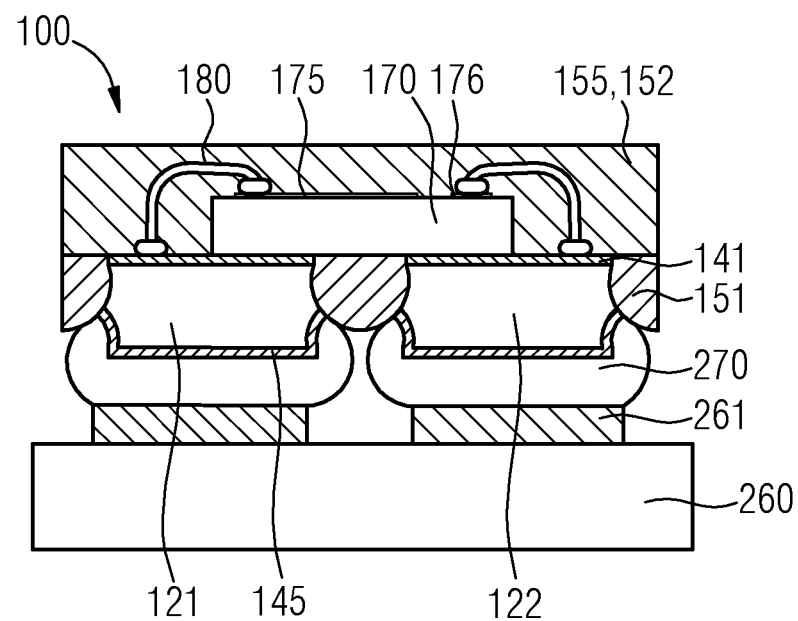
Figure 55:
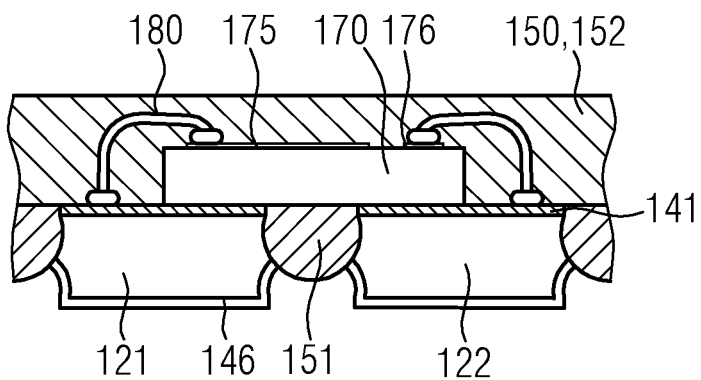
Figure 56:
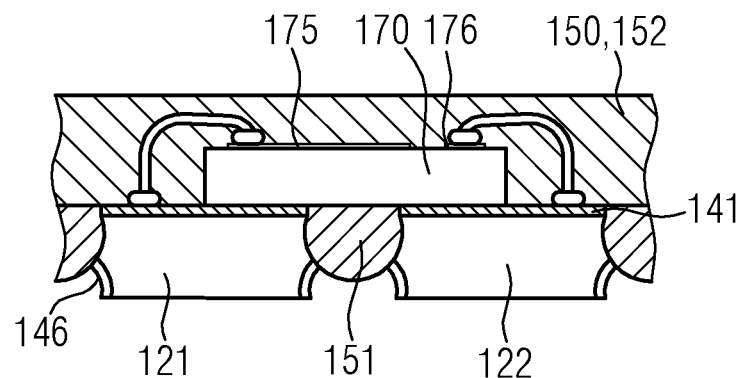
Figure 57:
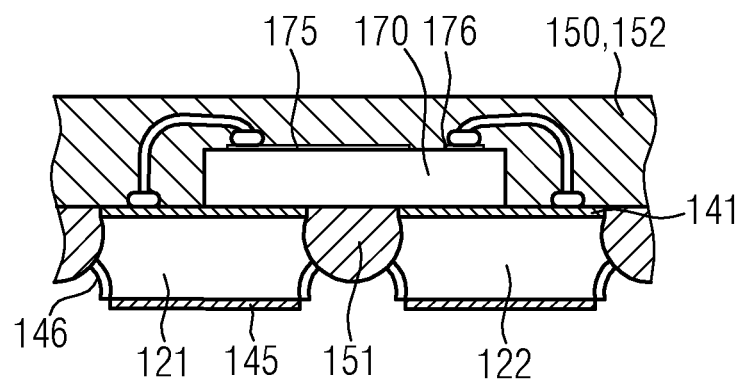
Figure 58:
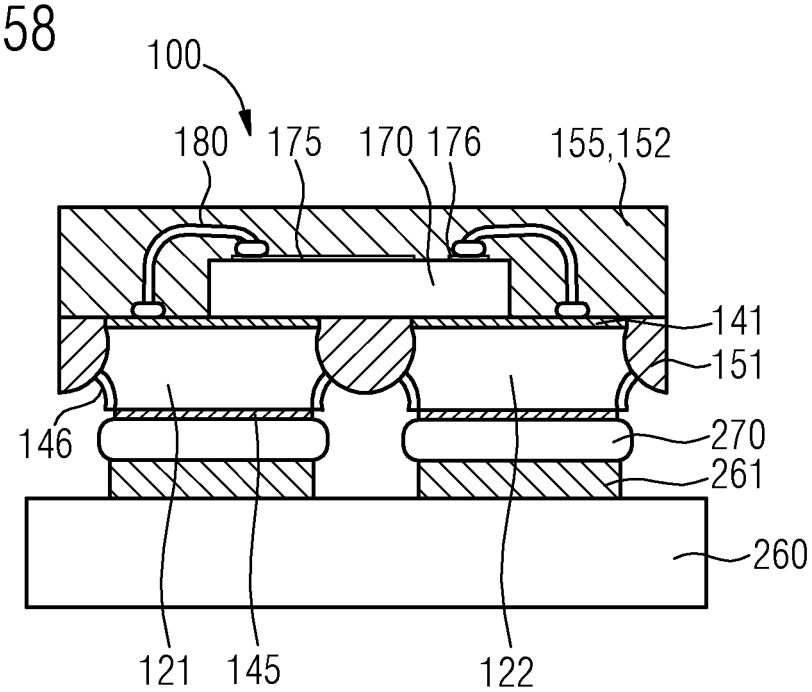
Figure 59:
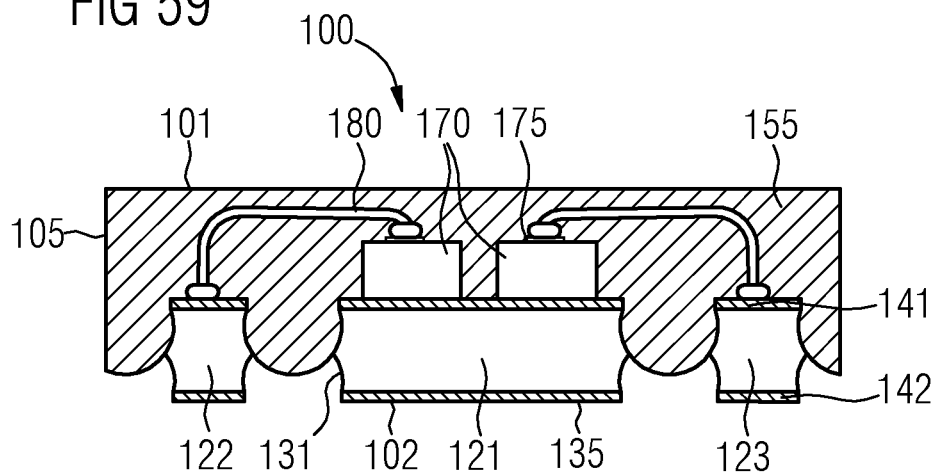
Figure 60:
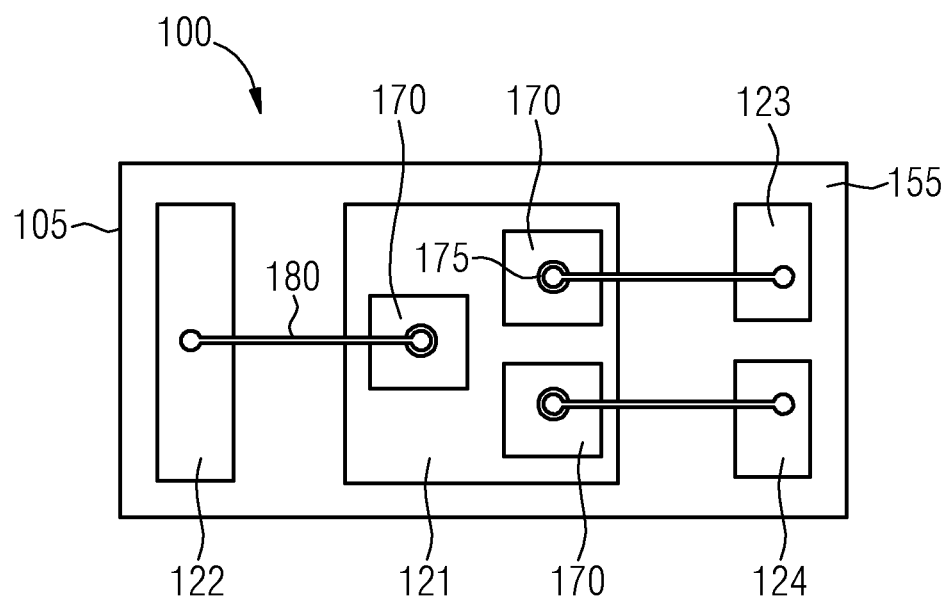
Figure 61:
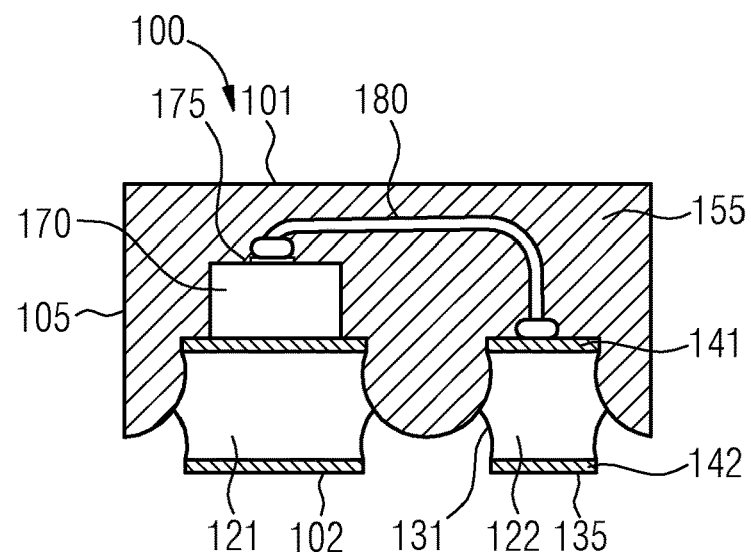
Figure 62:
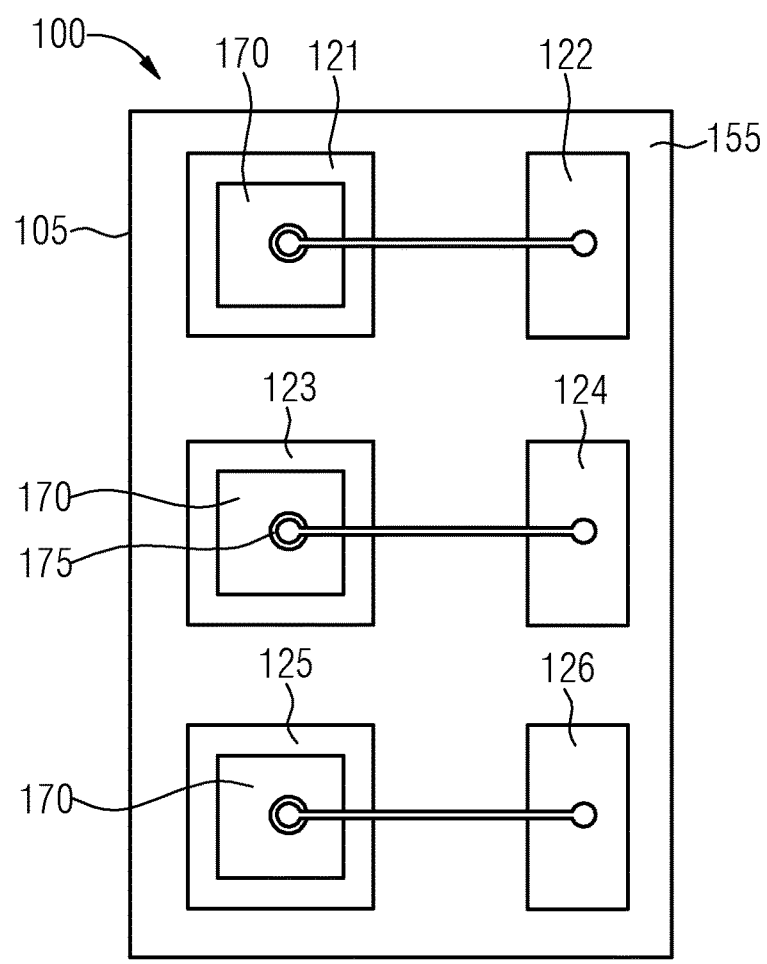

FIGS. 33 to 39 show a further method sequence for the production of optoelectronic components with the aid of lateral representations and plan representations, wherein a metal carrier is prestructured, optoelectronic semiconductor chips are arranged on carrier sections, a plastic body encapsulating the semiconductor chips is formed, the carrier is structured, and a singulation process is carried out;

FIGS. 40 and 41 show a lateral representation and a plan representation of an optoelectronic component produced by the method sequence of FIGS. 33 to 39;

FIGS. 42 and 43 show a lateral representation and a plan representation of a further optoelectronic component;

FIG. 44 shows a plan representation of a metal carrier comprising optoelectronic semiconductor chips, a plastic body and anchoring structures;

FIG. 45 shows a lateral representation of the carrier and of the plastic body of FIG. 44 in the region of an anchoring structure;

FIGS. 46 to 49 show a further method sequence for the production of optoelectronic components with the aid of lateral representations, wherein a plastic body comprising a first and a second plastic material is formed;

FIG. 50 shows a lateral representation of an optoelectronic component produced by the method sequence of FIGS. 46 to 49;

FIG. 51 shows a lateral representation of a further optoelectronic component;

FIGS. 52 to 53 show a method sequence for the production of optoelectronic components with the aid of lateral representations, wherein carrier sections comprising a wetting layer are formed;

FIG. 54 shows a lateral representation of an optoelectronic component which comprises carrier sections comprising a wetting layer and is arranged on a circuit board;

FIGS. 55 to 57 show a method sequence for the production of optoelectronic components with the aid of lateral representations, wherein metal carrier sections comprising an antiwetting layer and a wetting layer are formed;

FIG. 58 shows a lateral representation of an optoelectronic component which comprises carrier sections comprising an antiwetting layer and a wetting layer and is arranged on a circuit board;

FIGS. 59 and 60 show a lateral representation and a plan representation of an optoelectronic component comprising three optoelectronic semiconductor chips; and FIGS. 61 and 62 show a lateral representation and a plan representation of a further optoelectronic component comprising three optoelectronic semiconductor chips.

With the aid of the following figures, possible configurations of radiation-emitting optoelectronic components 100 and of associated production methods will be described. The optoelectronic components 100 are surface-mountable QFN (Quad Flat No Leads) components. In the scope of production, processes known from semiconductor technology and from the manufacturer of optoelectronic components may be carried out, and materials that are conventional in these fields may be used, so that this will only be partially discussed. In the same way, in addition to the processes shown and described, further processes may be carried out and the components 100 may be manufactured with further component parts and structures in addition to the component parts shown and described.

It is to be pointed out that the figures are merely schematic in nature and not true to scale. The component parts and structures shown in the figures may therefore be represented exaggeratedly large or reduced in size. The method sequences explained below are represented in a detail in the figures. The parts respectively shown may be repeated many times. Some of the figures show separating lines 290, along which a component panel is provided at the end of the method. With the aid of the separating lines 290, the situations previously existing in relation to the respective components 100 become clear. The plan representations in part contain section lines that relate to section planes of the associated lateral sectional representations. In respect of the plan representations, it is furthermore to be pointed out that concealed parts and structures are sometimes indicated with the aid of dashed lines.

With the aid of lateral sectional representations and plan representations, FIGS. 1 to 10 show a possible method for the common production of radiation-emitting optoelectronic components 100. In the method, as shown in FIG. 1, a plate-shaped or strip-shaped metal carrier 110 is provided. The carrier 110 may, for example, be made from copper and have a thickness 210 of for example 0.15 mm. The carrier 110 comprises two opposite main sides 111, 112, i.e. a front side 111 and a rear side 112.

As is furthermore represented in FIG. 1, the metal carrier 110 provided comprises a front-side etching mask 141 and a rear-side etching mask 142. The two etching masks 141, 142 are implemented in the form of structured coatings of the carrier 110 and comprise layer sections arranged next to one another, with which regions of the front side 111 and of the rear side 112 of the carrier 110 are covered. In this way, selective etching removal at predetermined positions of the front side 111 and rear side 112 of the carrier 110 can be achieved in etching processes subsequently carried out. The etching masks 141, 142 have opening widths and distances 241, 242 between the layer sections that may be at least 0.1 mm. Smaller distances 241, 242 of, for example, at least 0.025 mm are also possible. In this case, the carrier 110 may have a thickness 210 smaller than the aforementioned thickness 210, of for example 0.05 mm.

The etching masks 141, 142 are metal etching masks, which may be formed by carrying out at least one metallization method (plating) on the metal carrier 110. The etching masks 141, 142, or their layer sections, may for example be implemented in the form of layer stacks consisting of NiAu, NiPdAu or NiAg. Before the metallization, regions of the front side 111 and rear side 112 of the carrier 110, in which metallization is not intended to take place, may be covered by forming a photoresist mask in the form of a structured photoresist layer. After the metallization, the photoresist masks may be removed (respectively not shown).

In the present method sequence, the etching masks 141, 142 are not removed from the carrier 110, and still remain in the optoelectronic components 100 produced. The etching masks 141, 142 are therefore regarded below as an integral part of the carrier 110, and therefore also of the carrier sections 121, 122 obtained later. In this sense, the front side 111 and the rear side 112 of the carrier 110 are in part formed by the etching masks 141, 142 themselves. Furthermore, the etching masks 141, 142 form contactable coatings of the carrier 110 and of the carrier sections 121, 122 obtained later, which are suitable for example for soldering and connection of contact structures, for example bond wires 180.

Figure 7:
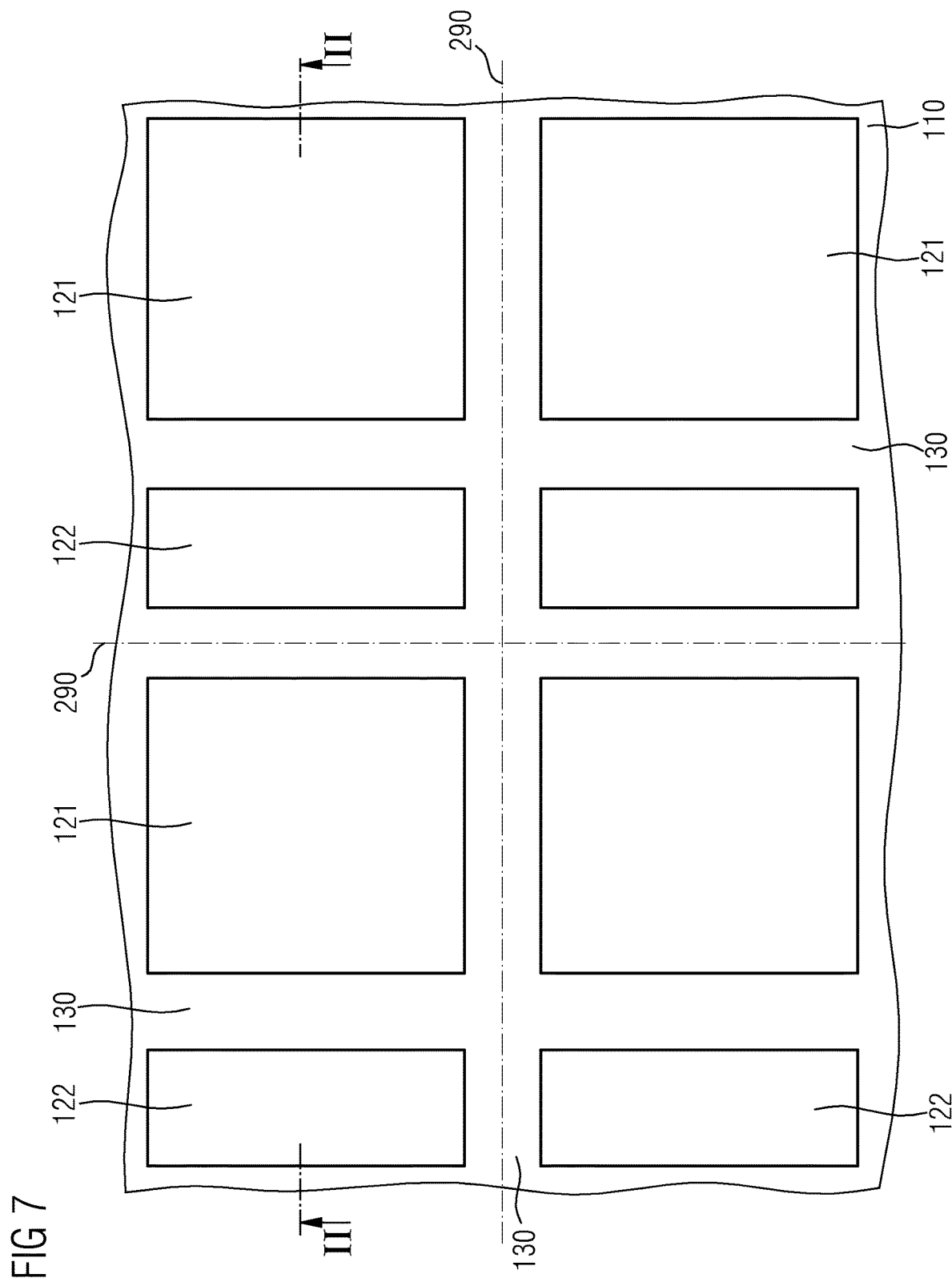

After the provision of the metal carrier 110 with the etching masks 141, 142, as is shown in FIGS. 2 and 7, prestructuring of the carrier 110 is carried out by front-side removal of metal carrier material. To this end, front-side isotropic etching of the carrier 110 is carried out. This may be done by a wet chemical etching method. In this step, the carrier 110 is etched at those positions that are not covered with the front-side etching mask 141. The prestructured metal carrier 110 obtained after the etching comprises carrier sections 121, 122 protruding in the region of the front side 111 and depressions 130 present between them. The protruding carrier sections 121, 122 are still held together by rear-side carrier material. The carrier sections 121, 122 are also enclosed circumferentially by the depressions 130. In this case, the depressions 130 merge into one another and form a continuous grid-shaped trench structure.

As is shown in FIG. 7, the carrier sections 121, 122 are in the present case formed with different lateral dimensions. For each optoelectronic component 100 to be produced, a carrier section 121 and a smaller carrier section 122 is produced.

Because of the isotropic etching, the depressions 130 have a round cross-sectional profile, as is shown in FIG. 2. The depressions 130 may also comprise a slight lateral undercut. The front-side etching of the metal carrier 110 may be carried out to such an extent that the depressions 130 have a depth 230 that may be two-thirds of the thickness 210 of the original carrier 110 provided (cf. FIGS. 1 and 2). A different depth 230 is also possible, which may for example be one half of the thickness 210 of the carrier 110.

Figure 8:
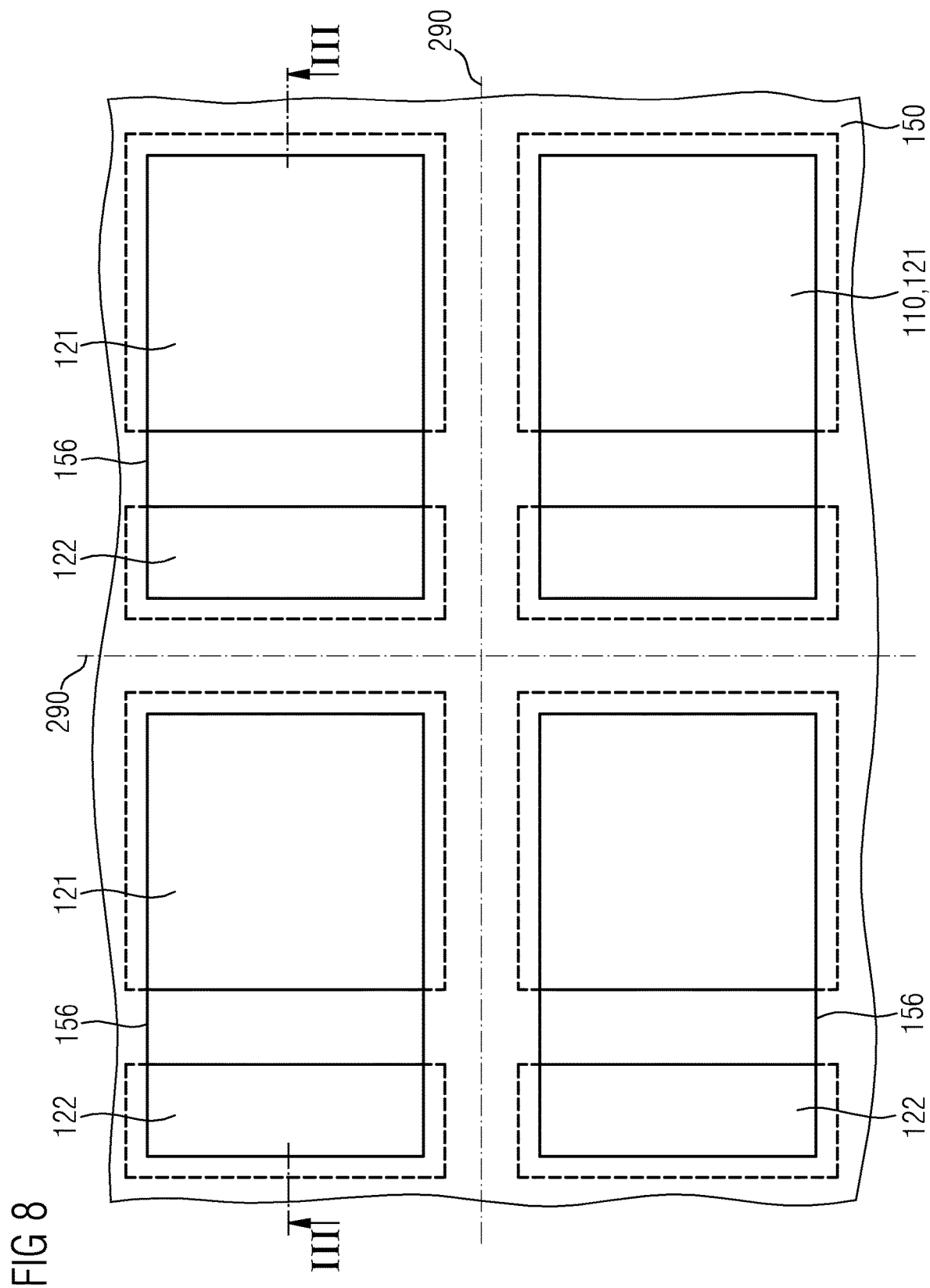

Subsequently, as is represented in FIGS. 3 and 8, a plastic body 150 is formed on the front side 111 of the prestructured metal carrier 110. The plastic body 150 comprises cavities 156, by means of which the carrier 110, or its etching mask layer sections 141, are in part exposed on the front side. For the formation of the plastic body 150, a plastic material is applied (not represented) on the carrier 110 by carrying out a molding process with the aid of a molding tool.

The plastic material used for the plastic body 150 may, for example, be a thermoset or a thermoplastic. It may furthermore be a reflective plastic material, which may contain (not represented) reflective particles embedded in the plastic material, and which may therefore have a white color. As an alternative, the plastic material may have a black color.

During the formation of the plastic body 150, the plastic material is arranged in the depressions 130 of the metal carrier 110, and at the edge of the cavities 156 in part also on the carrier sections 121, 122 (cf. FIGS. 3 and 8). Because of the lateral undercut of the depressions 130, interlocking is possible between the carrier 110 and the plastic body 150.

The plastic body 150 comprises a separate cavity 156 for each optoelectronic component 100 to be produced. By means of the cavities 156, a carrier section 121 and a carrier section 122 are therefore respectively exposed in part on the front side. In the region of the cavities 156, the depressions 130 present between the carrier sections 121,122 are filled with the plastic material of the plastic body 150 in such a way that the plastic body 150 is flush at this position with the metal carrier 110, or with its front-side etching mask 141. In this way, as is shown in FIG. 3, the cavities 156 comprise a planar bottom. With the aid of FIG. 3, it may furthermore be seen that the cavities 156 have a cross-sectional shape widening in the direction of a front side of the optoelectronic components 100 to be produced, with side walls extending obliquely with respect to the carrier 110. By virtue of this configuration, the cavities 156 may be used as reflectors for the components 100.

Figure 9:
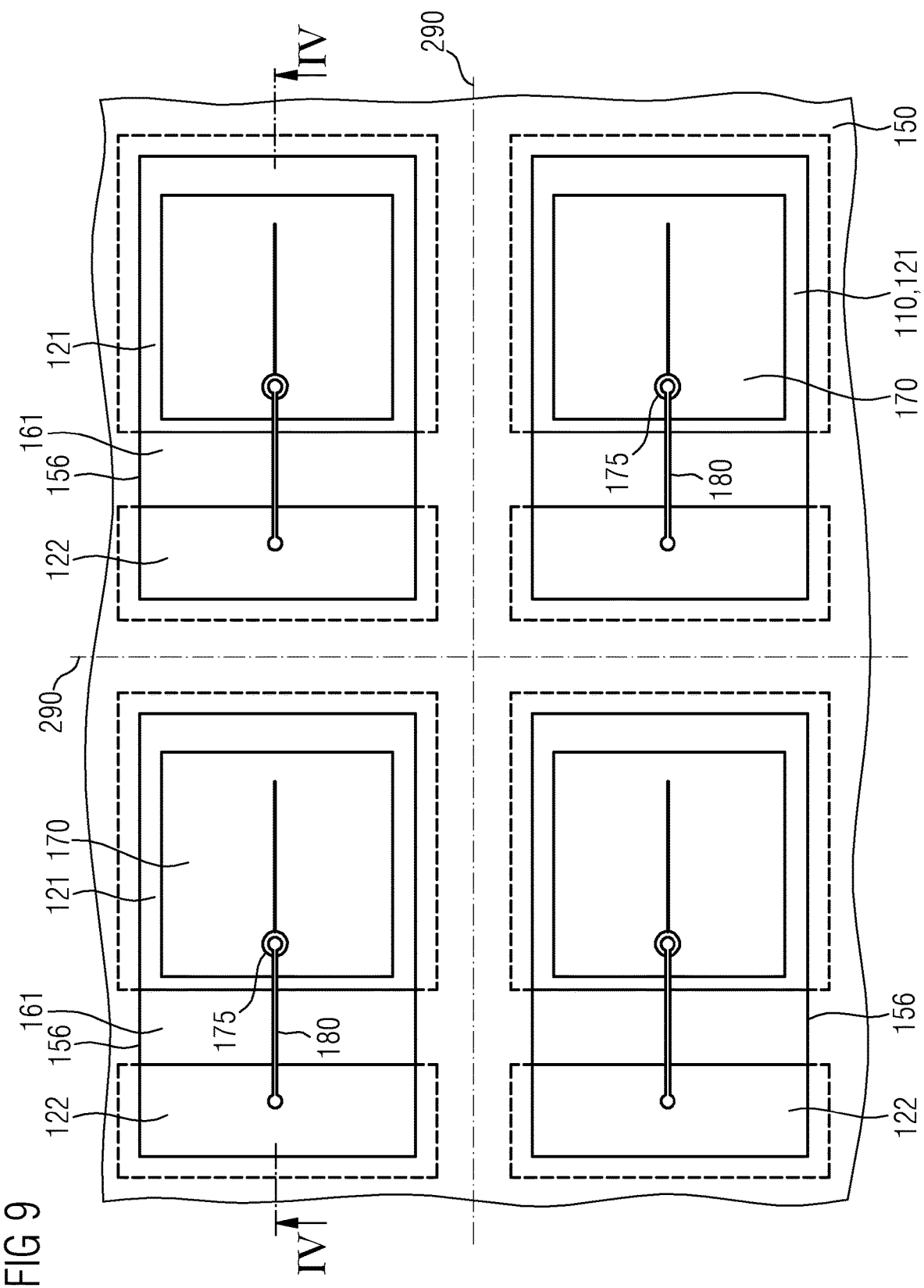

After the formation of the plastic body 150, as is represented in FIGS. 4 and 9, radiation-emitting optoelectronic semiconductor chips 170 are arranged in the cavities 156 of the plastic body 150 on the front side 111 of the metal carrier 110 and electrically connected to the carrier 110. A single semiconductor chip 170 is mounted in each cavity 156.

The semiconductor chips 170 used may, for example, be LED chips. Furthermore, in the present method sequence, a configuration is used in which the semiconductor chips 170 comprise a front-side contact 175 and a rear-side contact (not shown). The front-side contact 175 may, as is represented in FIG. 9, comprise one circular contact section and one linear contact section extending therefrom.

During the chip mounting, the radiation-emitting semiconductor chips 170 are placed on the carrier sections 121 of the carrier 110. In this case, the semiconductor chips 170 may be fastened on the carrier sections 121 for example by adhesive bonding, soldering or sintering. In this way, the rear-side contacts of the semiconductor chips 170 may be electrically connected to the carrier sections 121 by an electrically conductive connecting material (adhesive, solder or sintering paste) (not shown) used in the respective process. The front-side contacts 175 of the semiconductor chips 170 are electrically connected by contact structures in the form of bond wires 180 to the respectively neighboring carrier sections 122 accessible via the same cavities 156. In this case, the bond wires 180 are connected to the circular contact sections of the chip contacts 175.

After the chip mounting, the cavities 156 of the plastic body 150, as is likewise shown in FIG. 4, are filled with a filler material 161. This is carried out in such a way that the filler material 161 is flush with the plastic body 150 on the front side. With the aid of the filler material 161, the radiation-emitting semiconductor chips 170 located in the cavities 156 may be encapsulated and therefore protected against external influences. The introduction of the filler material 161 into the cavities 156 may, for example, be carried out with the aid of a dispenser (this is not represented).

The filler material 161 used may be a radiation-transmissive, or clear, plastic material, for example a silicone material or an epoxide material. Optionally, the filler material 161 may additionally contain phosphor particles (this is not represented). In this way, radiation conversion of light radiation emitted by the semiconductor chips 170 during operation may be brought about. In the plan representation of FIG. 9, and in subsequent plan representations, the filler material 161 is represented as a clear material.

Figure 5:
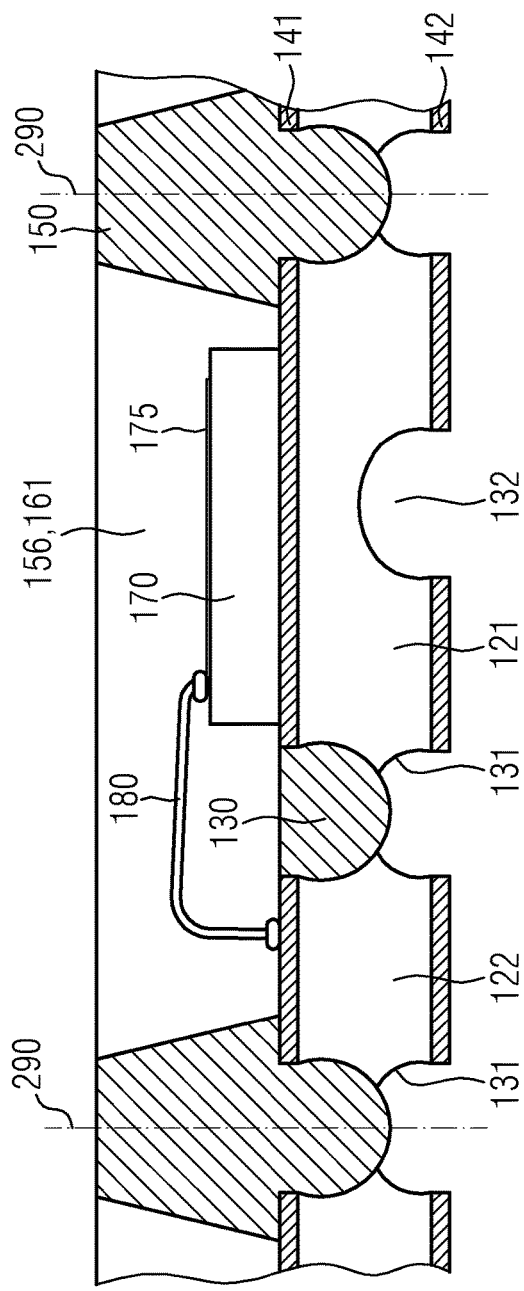

Following this, as is represented in FIG. 5, structuring of the carrier 110 is carried out by rear-side removal of metal carrier material in the region of the depressions 130 until the plastic body 150 is reached. During this process, the plastic body 150 is partially exposed on the rear side, and the carrier 110 is structured into metal carrier sections 121, 122 which are separate, i.e. no longer connected to one another by metal carrier material. In this case, the carrier sections 121, 122 previously protruding in the region of the frontside 111 of the carrier 110 merge into the separate carrier sections 121, 122, or in other words the carrier sections 121, 122 previously connected to one another are separated from one another. In accordance with the prestructuring, during the structuring of the carrier 110 a separate carrier section 121 and a smaller carrier section 122 are produced for each optoelectronic component 100 to be produced. In this state, the separate carrier sections 121, 122 are held together by the plastic body 150 and the filler material 161.

In order to structure the metal carrier 110 into the separate carrier sections 121, 122, rear-side isotropic etching of the carrier 110 is carried out. This may likewise be carried out by a wet chemical etching method. In this step, the carrier 110 is etched at those positions that are not covered with the rear-side etching mask 142. Because of the isotropic etching, the carrier sections 121, 122 have in cross section, as is represented in FIG. 5, side flanks 131 with two curved partial flanks forming a common laterally protruding edge.

During the structuring of the metal carrier 110, carrier material may be etched on the rear side not only in the region of the depressions 130 but also at other positions. In the present method sequence, this is illustrated by way of example in relation to the carrier section 121 shown in FIG. 5. In this case, the rear-side etching mask 142 comprises an opening in the region of the carrier section 121. The result of this is that a depression 132 is produced during the rear-side etching. Because of the isotropic etching, the rear-side depression 132 has a round cross-sectional profile. Such a depression 132 may be provided in all the carrier sections 121.

Figure 6:
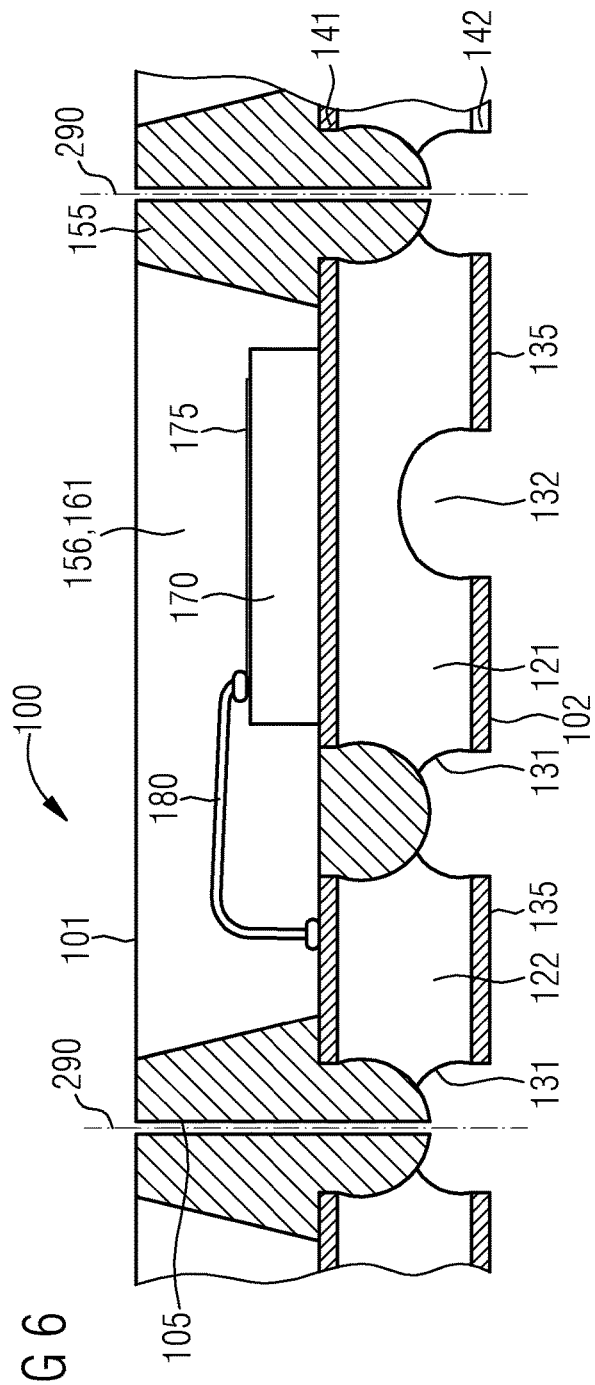
Figure 10:
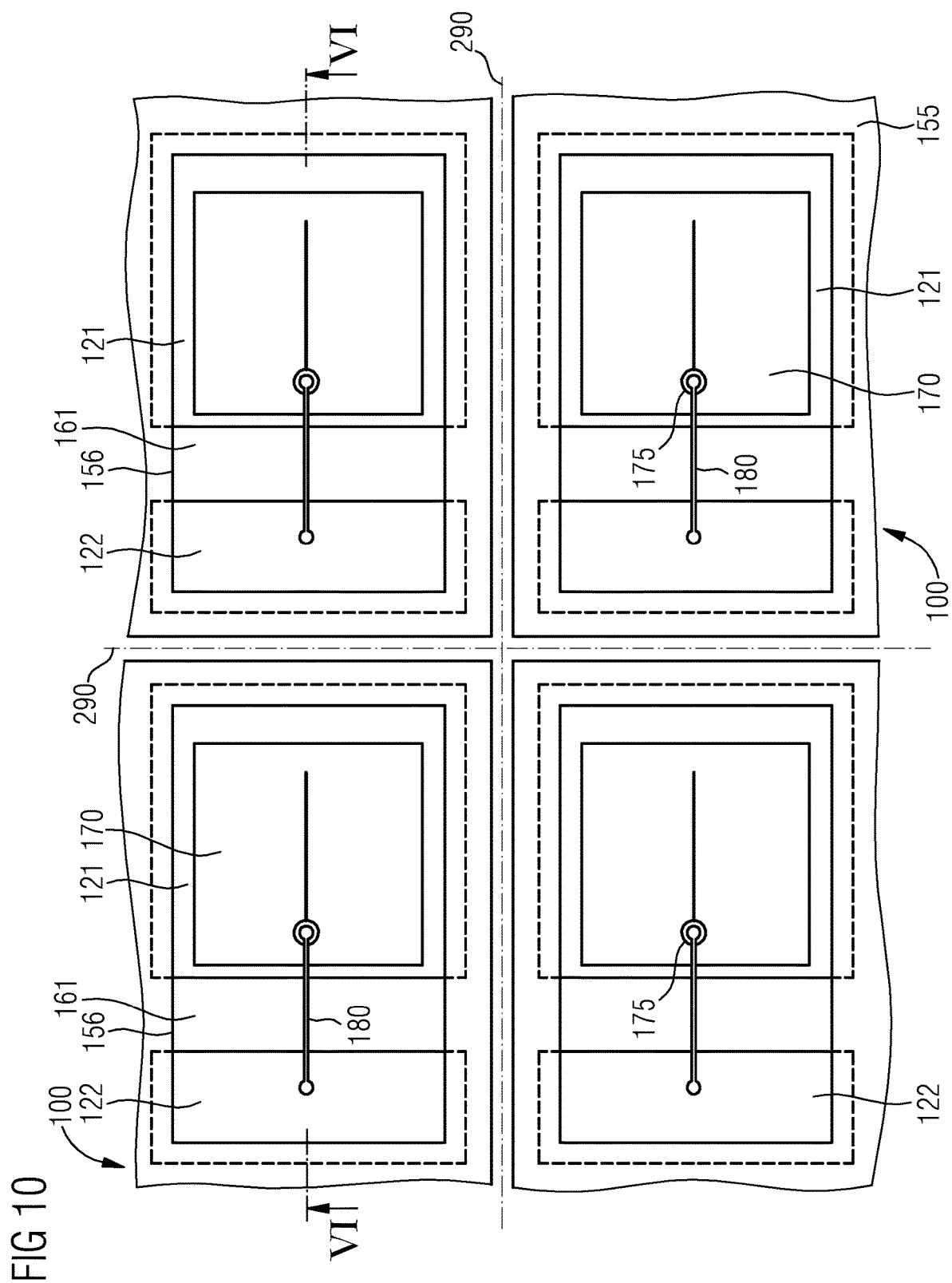

The present component panel obtained after the structuring of the metal carrier 110 is subsequently, as is represented in FIGS. 6 and 10, singulated into separate optoelectronic components 100. During this process, severing of the plastic body 150 is carried out between separate carrier sections 121, 122 along the separating lines 290. In this way, the plastic body 150 is separated into plastic package bodies 155 belonging to the individual components 100. The severing of the plastic body 150 may be carried out mechanically, for example by means of sawing (this is not represented).

Figure 11:
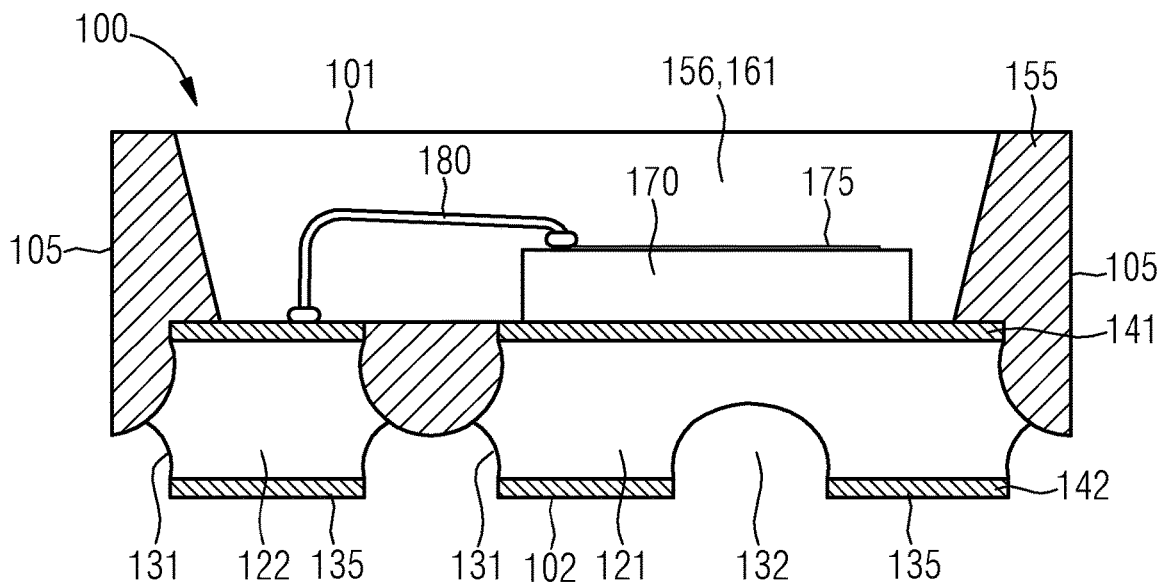
FIGS. 11 and 12 show a lateral representation and a plan representation of an optoelectronic component produced by the method sequence of FIGS. 1 to 10.
Figure 12:
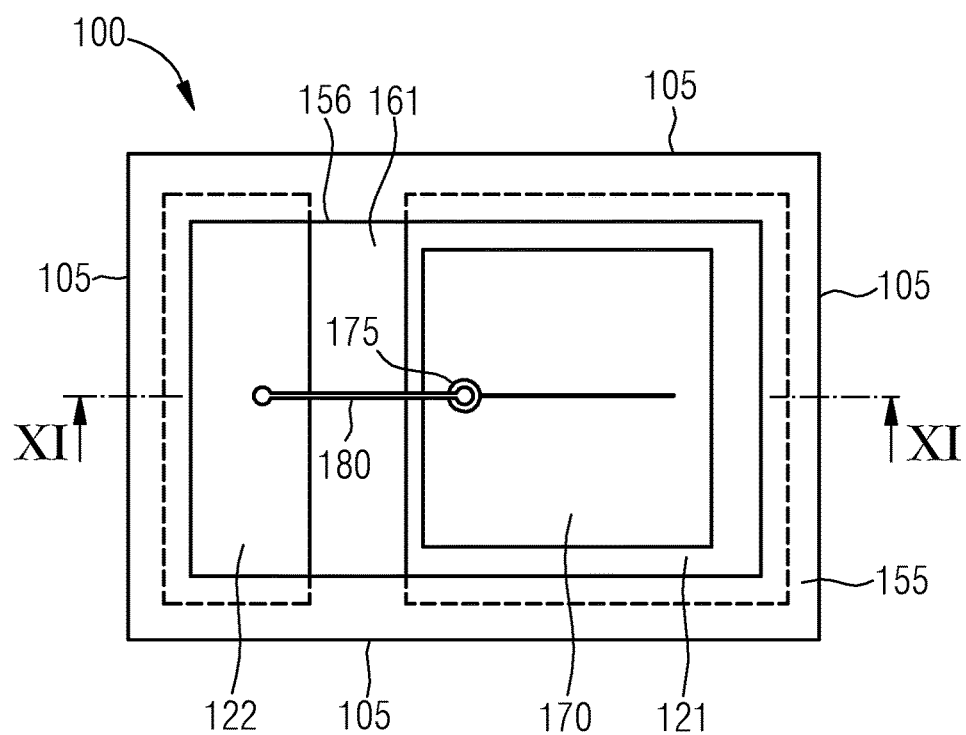

An individual radiation-emitting optoelectronic component 100, which has been produced with the aid of the method of FIGS. 1 to 10, is depicted in a lateral sectional representation and in a plan representation in FIGS. 11 and 12. The component 100 comprises two separate metal carrier sections 121, 122 that can be contacted on the rear side, a plastic package body 155 adjacent and connected to the carrier sections 121, 122 and comprising a cavity 156, and a single radiation-emitting semiconductor chip 170 located in the cavity 156. The cavity 156 is filled with a filler material 161. The semiconductor chip 170 is arranged on and electrically connected to the carrier section 121. By means of a bond wire 180, the semiconductor chip 170 is electrically connected to the other carrier section 122. In this way, the semiconductor chip 170 can be supplied with electrical energy via the carrier sections 121, 122 during operation of the component 100.

With the aid of FIG. 11, it may furthermore be seen that the optoelectronic component 100 comprises a structured rear side 102, which is formed by the plastic package body 155 and the carrier sections 121, 122. The carrier sections 121, 122 protrude on the rear side relative to the plastic package body 155. In this case, the overhang may, for example, lie in the two-figure micrometer range. The overhang may, for example, be 50 µm. Other overhangs, for example in the range of 20 µm or 30 µm, are also possible. The carrier sections 121, 122, or their etching mask layer sections 142, furthermore form rear-side connection surfaces 135 of the component 100, with the aid of which the component 100 may be mounted in the scope of surface mounting (SMT, Surface Mounting Technology) on a further device (this is not represented). The component 100 comprises a circumferential lateral surface 105, which is composed of all the lateral outer sides of the component 100 and which is formed exclusively by the plastic package body 155. A front side 101 of the component 100 is formed by the plastic package body 155 and the filler material 161. During operation of the component 100 light radiation may be omitted on the front side through the filler material 161.

The method explained with the aid of FIGS. 1 to 10 may be carried out economically and with high reliability. This results from the use of the metal carrier 110, which may be distinguished by high stability and robustness in comparison with a conventional lead frame. The singulation, during which only the plastic body 150 is severed, may also be carried out simply and economically. The method furthermore offers the possibility of manufacturing optoelectronic components 100 having compact dimensions. Because of the carrier sections 121, 122, the optoelectronic components 100 may furthermore be distinguished by efficient dissipation of heat and a low thermal resistance. Because of the lateral surface 105 formed only by the plastic package body 155, the components 100 may furthermore have high robustness.

Possible variants and modifications that may be envisioned in relation to the method sequence explained above and optoelectronic components 100 thereby produced will be described below. Corresponding method steps and features, as well as component parts that are the same or have the same effect, will not be explained again in detail below. For details thereof, reference is instead made to the description above. Furthermore, aspects and details that are mentioned in relation to one configuration may also be used in relation to another configuration, and features of two or more configurations may be combined with one another.

Instead of the optoelectronic semiconductor chips 170 shown in the preceding figures, comprising a front-side contact 175 and a rear-side contact, other designs may be used. Possible, for example, are semiconductor chips 170 comprising two front-side contacts 175, 176, such as used in method sequences explained below (cf. for example FIG. 34). In this case, the two front-side contacts 175, 176 may be electrically connected to metal carrier sections with the aid of bond wires 180. Furthermore, it is also possible to use optoelectronic semiconductor chips comprising two rear-side contacts, which may be implemented in the form of so-called flip-chips. Such semiconductor chips may be mounted on two carrier sections by adhesive bonding, soldering or sintering, so that at the same time the rear-side contacts may be electrically connected respectively to one of the carrier sections (this is not represented).

A further modification consists in connecting front-side contacts 175, 176 of semiconductor chips 170 to metallic carrier sections by means of other contact structures rather than by means of bond wires 180. One example is metallic contact layers, which are also referred to as PI contacts (Planar Interconnect) or RDL layers (Redistribution Layer). With regard to such contact structures, one or more insulating layers reaching laterally as far as the semiconductor chips 170 may be formed with recesses in order to keep regions to be contacted of carrier sections free. The contact layers may subsequently be formed in order to electrically connect the front-side chip contacts 175, 176 to the carrier sections (not illustrated).

A further variant consists in carrying out the method steps in a different order. For example, it is conceivable to carry out chip mounting not before but after the rear-side etching of a metal carrier 110 in order to structure the latter into separate carrier sections, and consequently to arrange semiconductor chips on already separated metal carrier sections. This procedure makes it possible to avoid damage to semiconductor chips possibly occurring during the rear-side etching. In this way, the chip mounting may be carried out on a prefabricated package which may also be referred to as a premolded package or a semifinished product.

For exemplary illustration, FIG. 13 shows such a prefabricated package 200 in a lateral sectional representation. The prefabricated package 200 comprises separate metal carrier sections 121, 122 and a plastic body 150 connected to the carrier sections 121, 122 comprising cavities 156. The production of the prefabricated package 200 may initially be carried out in a similar way to the method explained above, i.e. a metal carrier 110 comprising etching masks 141, 142 is provided (cf. FIG. 1), the carrier 110 is prestructured by front-side etching and consequently comprises carrier sections 121, 122 protruding in the region of the front side 111 and depressions 130 between them (cf. FIGS. 2 and 7), and the plastic body 150 is formed with cavities 156 on the carrier 110 (cf. FIGS. 3 and 8). Subsequently, the carrier 110 is structured into separate carrier sections 121, 122 by rear-side etching in order to provide the prefabricated package 200 shown in FIG. 13. The further production of optoelectronic components 100 may likewise be carried out in accordance with the method explained above, i.e. optoelectronic semiconductor chips 170 are mounted on carrier sections 121 in the cavities 156 of the plastic body 150 and connected to carrier sections 122 by means of bond wires 180, the cavities 156 are filled with a filler material 161, and the present component panel subsequently obtained is singulated into separate optoelectronic components 100 by severing the plastic body 150 along the separating lines 290 between carrier sections 121, 122 (cf. FIGS. 5, 6 and 10).

As indicated above, the depressions 130 produced by the front-side etching of a carrier 110 may comprise an undercut, so that interlocking can be brought about between the carrier 110 and a plastic body 150. There is, however, furthermore the possibility of providing anchoring in a controlled way.

In order to illustrate this aspect, FIGS. 14 to 20 show a further method sequence for the production of radiation-emitting optoelectronic components 100 with the aid of lateral sectional representations and plan representations. It essentially corresponds to the method sequence of FIGS. 1 to 10. In the method, as is shown in FIGS. 14 and 19, a prestructured metal carrier 110 comprising front-side and rear-side etching masks 141, 142 is provided. The carrier 110 again comprises carrier sections 121, 122 protruding in the region of the front side 111 and depressions 130 between them. In addition, the carrier 110 comprises through-holes 133 present in the region of the rear side 112 and merging into depressions 130. In the configuration shown, three through-holes 133 are respectively located between neighboring carrier sections 121, 122 provided for different components 100 to be produced, and therefore in the region of separating lines 290 (cf. FIG. 19).

The through-holes 133 may be produced by rear-side removal of metal carrier material by means of isotropic etching. In this way, as is shown in FIG. 14, the through-holes 133 may have a round cross-sectional profile. It is possible to prestructure the carrier 110 in the manner described above and subsequently to form the through-holes 133. As an alternative, rear-side recesses may initially be produced in the carrier 110 and the prestructuring of the carrier 110 may subsequently be carried out, so that the through-holes 133 may be obtained from the recesses.

Subsequently, as is shown in FIG. 15, a plastic body 150 comprising cavities 156 is formed on the prestructured metal carrier 110. In this step, which is carried out with the aid of a molding process, the plastic material of the plastic body 150 is arranged in the depressions 130, in the through-holes 133 and at the edge of the cavities 156 in part on the carrier sections 121, 122. In this case, the plastic material formed in the through-holes 133 forms anchoring sections 158 of the plastic body 150 with which the plastic body 150 is anchored on the carrier 110. The anchoring sections 158 are flush on the rear side with the carrier 110 or with its etching mask 142. Because of the round cross-sectional profile of the through-holes 133, the anchoring sections 158 have a cross-sectional shape widening in the direction of the rear side 112 carrier 110. This configuration allows reliable anchoring of the plastic body 150.

Following this, steps are carried out such as arranging a radiation-emitting optoelectronic semiconductor chip 170 on carrier sections 121 in the cavities 156 of the plastic body 150, connecting the semiconductor chip 170 on neighboring carrier sections 122 by means of bond wires 180, filling the cavities 156 of the plastic body 150 with a filler material 161 (cf. FIG. 16), and rear-side etching of the carrier 110 so that the carrier 110 is structured into separate carrier sections 121, 122 (cf. FIG. 17). The component panel is subsequently, as is shown in FIGS. 18 and 20, singulated into separate optoelectronic components 100 by severing the plastic body 150 the along separating lines 290 between carrier sections 121, 122. During this process, the plastic body 150 is separated into plastic package bodies 155 belonging to the individual components 100. The anchoring sections 158, which are located in the region of separating lines 290, are also severed, and thereby in the present case distributed respectively between two plastic package bodies 155.

Figure 21:
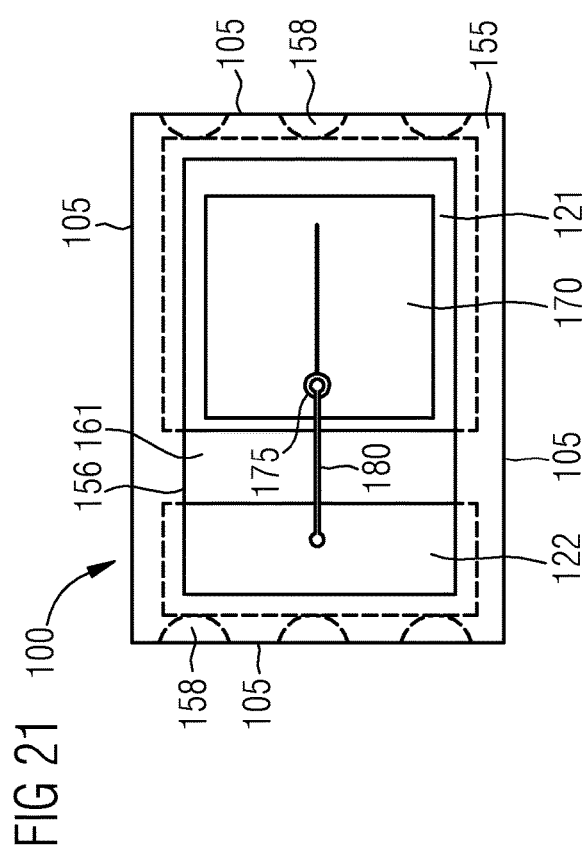
FIG. 21 shows a plan representation of an optoelectronic component produced by the method sequence of FIGS. 14 to 20.

The optoelectronic components 100 produced in this way, or their plastic package bodies 155, comprise additional anchoring sections 158, which are engaged with the carrier sections 121, 122, at their edge. The anchoring sections 158, which have a cross-sectional shape widening in the direction of the rear side 102 of the component 100, are respectively laterally adjoining a carrier section 121, 122 and are flush on the rear side with the relevant carrier section 121, 122, or with a connection surface 135 thereby formed. An individual optoelectronic component 100 produced in this way is depicted in the plan representation of FIG. 21. Because of the anchoring sections 158, the component 100 may have high mechanical stability.

In respect of the provision of anchoring sections 158, modifications may correspondingly be envisioned. This relates, for example, to the location of the anchoring sections 158. For example, the production of optoelectronic components 100 may be carried out in such a way that, in contrast to FIG. 21, such anchoring sections 158 are present not only in the region of short sides, but in addition or as an alternative in the region of long sides of the components 100. Furthermore, anchoring sections 158 may be provided not only at the edge, but also between carrier sections of components 100 (this is not represented). Further possible positions are the corners of components 100 or even inside carrier sections, as is the case in method sequences explained below (cf. FIGS. 26 and 44).

Figure 22:
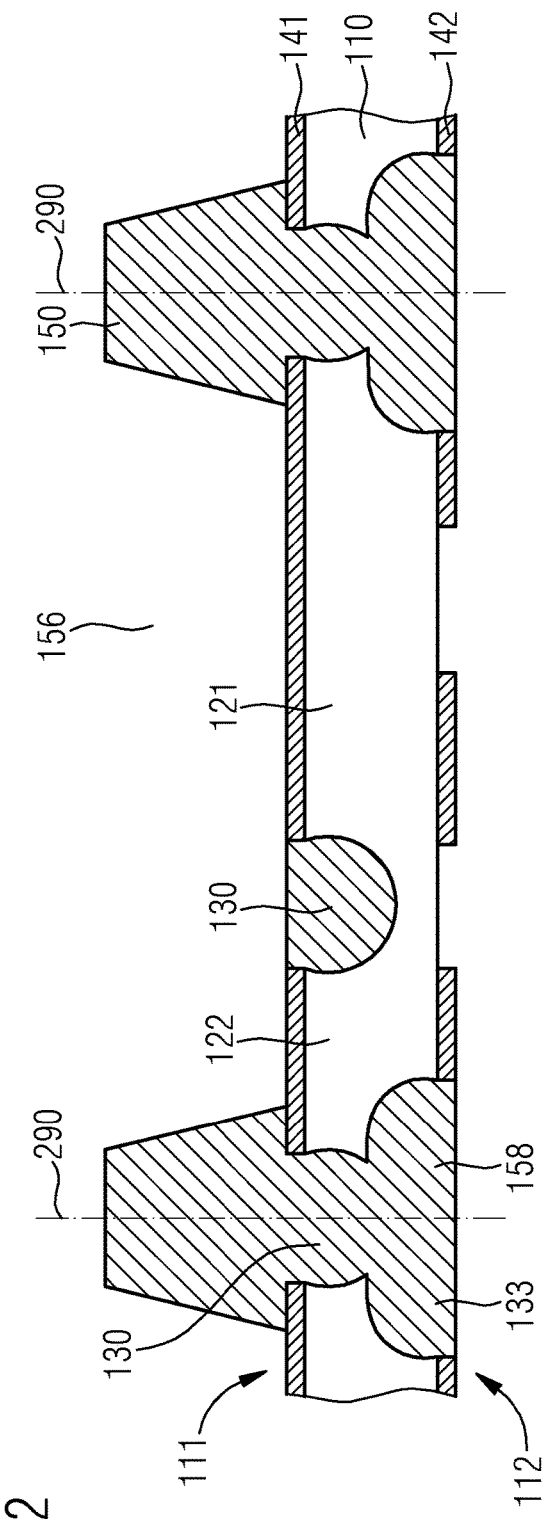
FIG. 22 shows a lateral representation of a metal carrier comprising a plastic body and anchoring structures.

FIG. 22 shows, with the aid of a lateral sectional representation of a prestructured metal carrier 110 provided with a plastic body 150, a further possible configuration that is conceivable in relation to anchoring sections 158. In this case, the carrier 110 comprises rear-side through-holes 133 that merge into the depressions 130 and have a shape projecting in steps relative to the depressions 130. Correspondingly, the anchoring sections 158 arranged in the through-holes 133 have a shape projecting in steps relative to subsections of the plastic body 150 that are located in the depressions 130. This configuration allows stable anchoring of the plastic body 150. During singulation carried out at the end of the method, such anchoring sections 158 may correspondingly be severed and thereby distributed between a plurality of, or two, plastic package bodies 155. The anchoring sections 158 thereby formed of the plastic package bodies 155 may in this case respectively have a shape projecting laterally in the direction of a carrier section 121, 122 (this is not represented).

Prefabricated packages 200, which may be produced by providing and prestructuring a metal carrier 110, forming a plastic body 150 and structuring the carrier 110 into separate carrier sections, may correspondingly be provided with anchoring sections 158 of the plastic body 150. Furthermore, optoelectronic components 100 that additionally comprise a driver chip 190 may be manufactured. With the aid of the driver chips 190, which comprise an integrated circuit and may therefore also be referred to as ICs (Integrated Circuits) the optoelectronic semiconductor chips 170 of the components 100 may be electrically driven. In order to implement such components 100, the chip mounting additionally comprises mounting of driver chips 190 on corresponding carrier sections.

Figure 23:
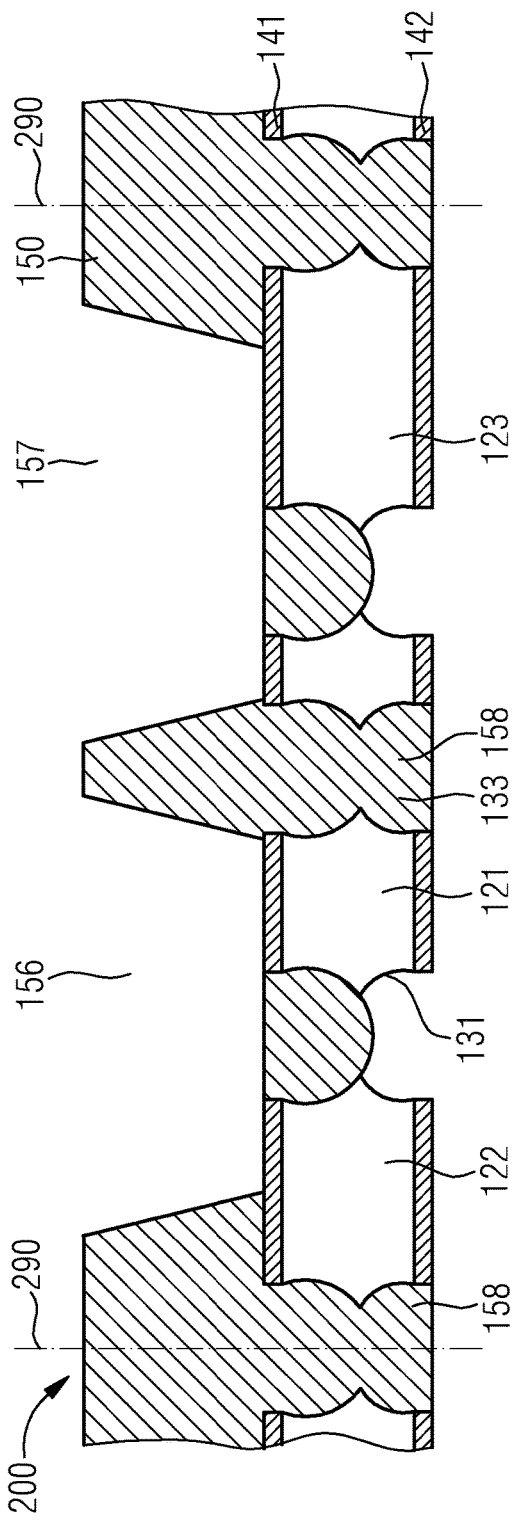
FIGS. 23 to 28 show a further method sequence for the production of optoelectronic components with the aid of lateral representations and plan representations, wherein the optoelectronic components comprise an optoelectronic semiconductor chip and a driver chip.
Figure 24:
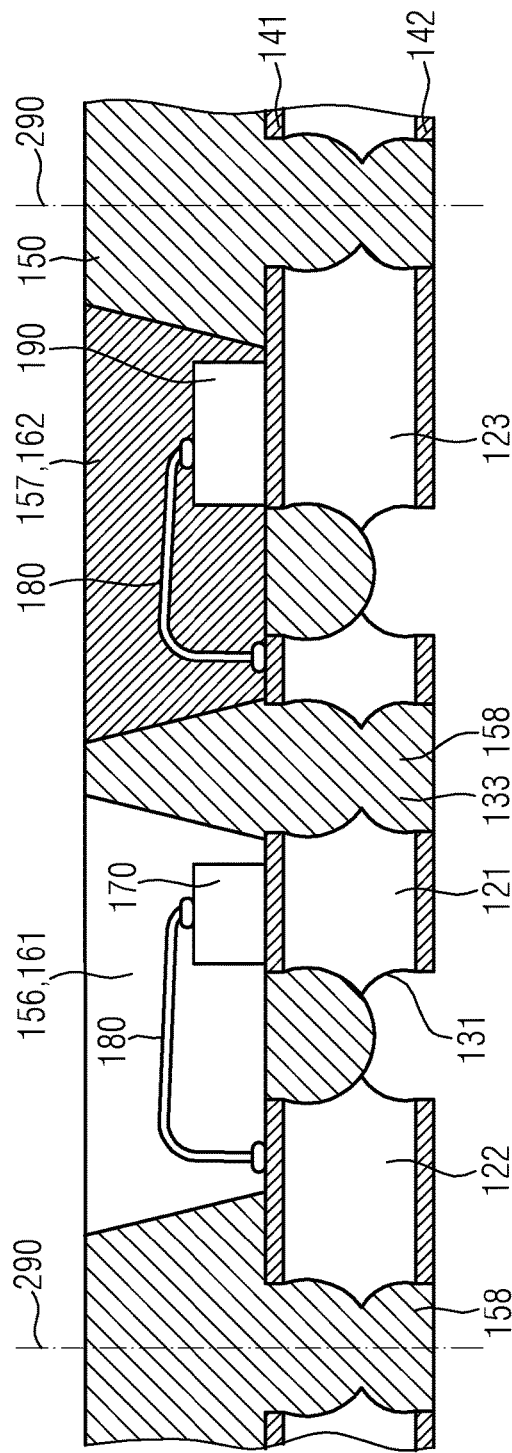
Figure 25:
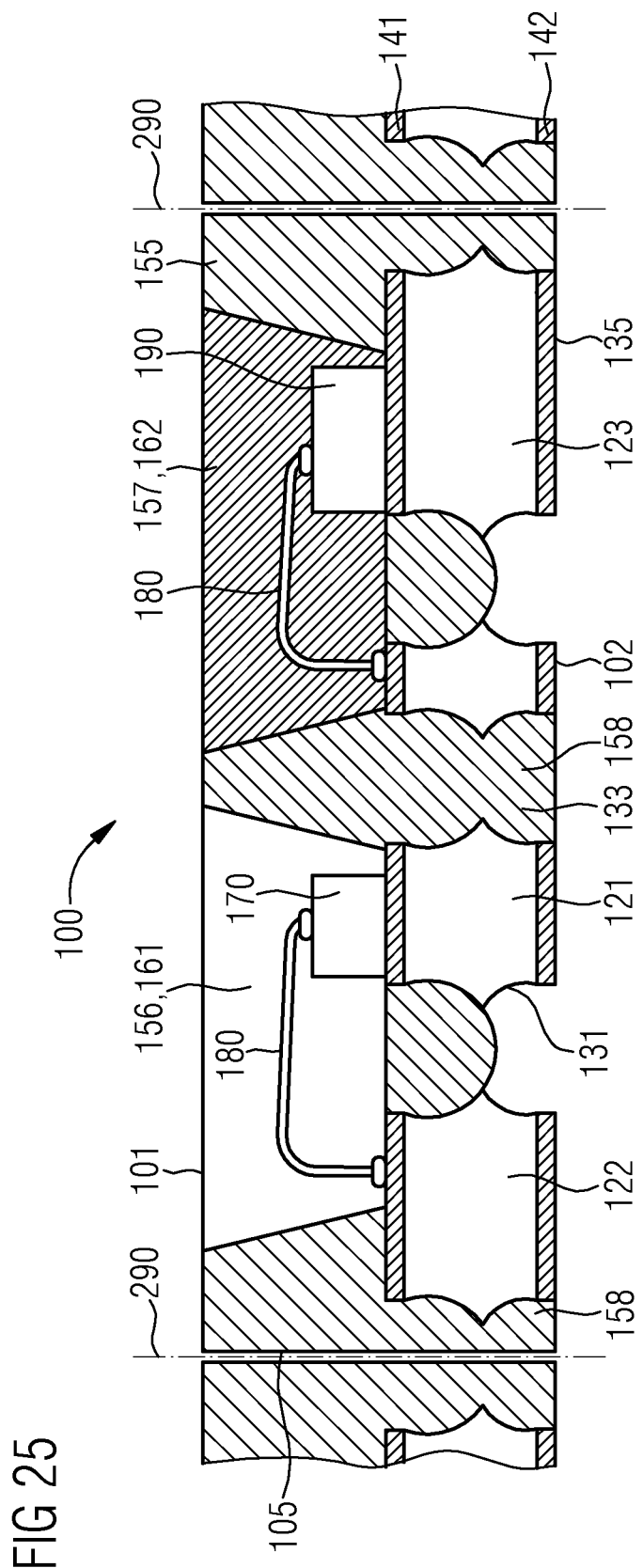
Figure 26:
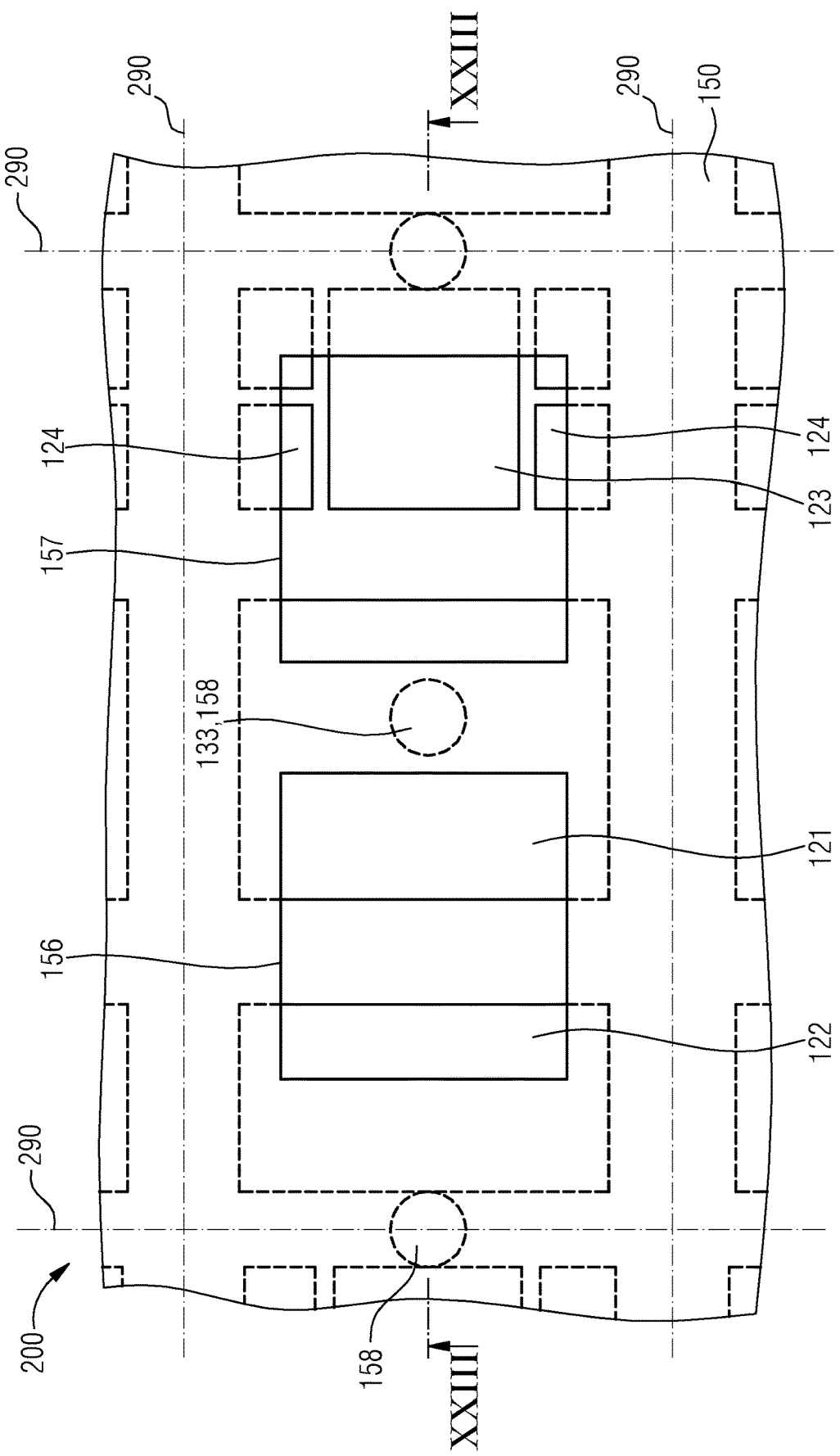

FIGS. 23 to 28 show, with the aid of lateral sectional representations and plan representations, a further method sequence for the production of radiation-emitting optoelectronic components 100, in which the two aspects mentioned above may be used together. In the method, as is shown in FIGS. 23 and 26, a prefabricated package 200 is provided, which comprises separate metal carrier sections 121, 122, 123, 124 and a plastic body 150 connected thereto and comprising cavities 156, 157. In the configuration shown, the package 200 comprises, for each component 100 to be produced, a carrier section 121, a carrier section 122, a carrier section 123 and four carrier sections 124. The plastic body 150 comprises two cavities 156, 157 for each component 100 to be produced, the carrier sections 121, 122 being exposed on the front side in part by means of the cavity 156, and the carrier sections 121, 123, 124 being exposed on the front side in part by means of the other cavity 157. The prefabricated package 200, or its plastic body 150, furthermore comprises anchoring sections 158. These include anchoring sections 158 that are located between neighboring carrier sections 122, 123 provided for different components 100 to be produced, and therefore in the region of separating lines 290, as well as anchoring sections 158 that are respectively arranged inside the carrier sections 121.

The production (not represented) of the prefabricated package 200 shown in FIGS. 23 and 26 may be carried out by providing a prestructured metal carrier 110 that comprises masks 141, 142, carrier sections 121, 122, 123, 124 protruding in the region of the front side 111, depressions 130 enclosing the carrier sections 121, 122, 123, 124 circumferentially, and through-holes 133. In this case, the through-holes 133 provided for the production of anchoring sections 158 in the region of the separating lines 290 merge into the depressions 130. These through-holes 133 may be produced by rear-side etching of the carrier 110. The other through-holes 133, provided for the production of anchoring sections 158 inside the carrier sections 121, may be produced by front-side and rear-side etching of the carrier 110. In this case, the depressions 130 enclosing the protruding carrier sections 121, 122, 123, 124 may be formed simultaneously by the front-side etching. Subsequently, the plastic body 150 with the cavities 156, 157 may be formed on the prestructured carrier 110. The anchoring sections 158 may be produced by the arranging, which takes place in this case, of the plastic material of the plastic body 150 in the through-holes 133. In order to complete the prefabricated package 200, the carrier 110 may be structured by rear-side etching, and the separate metal carrier sections 121, 122, 123, 124 may thereby be provided.

Figure 27:
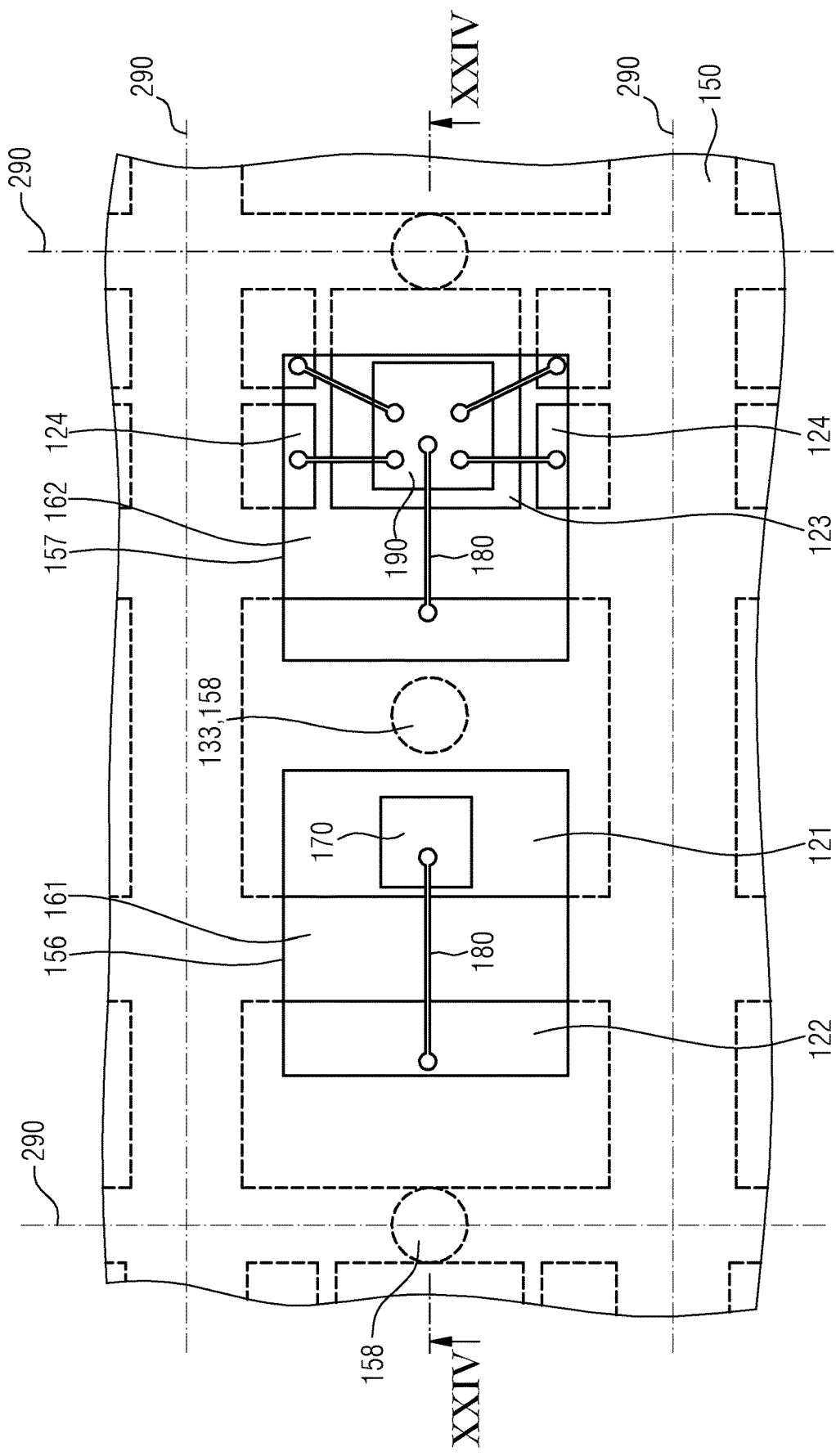

During the subsequent chip mounting, as is shown in FIGS. 24 and 27 in relation to a component 100, for each optoelectronic component 100 to be produced, a radiation-emitting optoelectronic semiconductor chip 170 is mounted on a carrier section 121 in a cavity 156 and is connected to a neighboring carrier section 122 by means of a bond wire 180, and a driver chip 190 is mounted on a carrier section 123 and connected to neighboring carrier sections 121, 124 by means of bond wires 180. In the present configuration, the driver chip 190 comprises five front-side contacts (not shown), of which one contact is connected by means of a bond wire 180 to the carrier section 121 and the other contacts are connected by means of bond wires 180 to the carrier sections 124. In the optoelectronic components 100, the carrier sections 124 may be used for the energy supply of the driver chip 190 and transmission of information in the form of control signals to the driver chip 190.

After the chip mounting, as is likewise shown in FIG. 24, the cavities 156, 157 are filled, so that the semiconductor chips 170 and driver chips 190 are encapsulated and thereby protected against external influences. To this end, a dispenser (not shown) may be used. In relation to the cavities 156 containing the radiation-emitting semiconductor chips 170, the filler material 161 described above is used (radiation-transmissive plastic material, which optionally contains phosphor particles). In relation to the cavities 157 containing the driver chips 190, a different filler material 162 is used. This may, for example, be a radiation-opaque plastic material. In the plan view of FIG. 27, as well as in FIG. 28, both filler materials 161, 162 are represented as clear materials.

Figure 28:
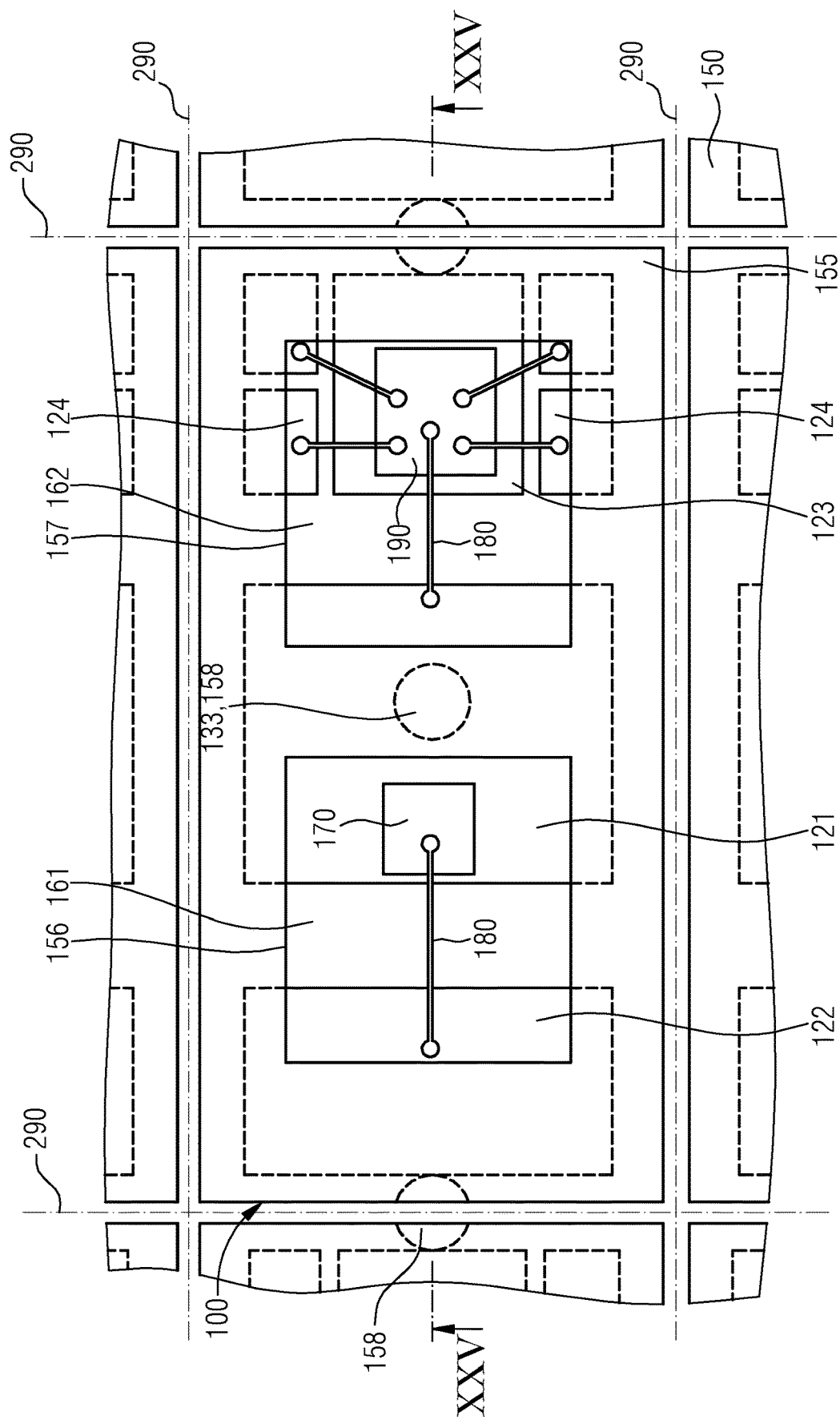

The present component panel obtained after the filling of the cavities 156, 157 is subsequently, as is shown in FIGS. 25 and 28, singulated into separate optoelectronic components 100 by severing the plastic body 150 along separating lines 290 between carrier sections 121, 122, 123, 124. In this way, the plastic body 150 is separated into the plastic package bodies 155 belonging to the individual components 100. Some of the anchoring sections 158, which are located in the region of separating lines 290, are also severed and distributed respectively between two plastic package bodies 155.

The optoelectronic components 100 produced in this way comprise separate metal carrier sections 121, 122, 123, 124 and a plastic package body 155 comprising three anchoring sections 158 and two cavities 156, 157, a radiation-emitting semiconductor chip 170 being arranged in the cavity 156 and a driver chip 190 being arranged in the other cavity 157. By this configuration, and by the use of a radiation-opaque filler material 162 in the driver chip cavity 157, it is possible to avoid the driver chip 190 being irradiated by light radiation generated by the semiconductor chip 170 and optionally converted. As a result of this, impairment of the functionality of the driver chip 190 can be avoided. The metal carrier sections 121, 122, 123, 124 form rear-side connection surfaces 135. The driver chip 190 is electrically connected by means of a bond wire 180 to the carrier section 121, to which the semiconductor chip 170 arranged thereon is also electrically connected. In this way, there is an indirect electrical connection between the semiconductor chip 170 and the driver chip 190, so that the semiconductor chip 170 can be electrically driven with the aid of the driver chip 190.

In respect of the use of driver chips 190, one possible modification consists in not arranging the driver chips 190 in cavities 157 of a plastic body 150, but instead embedding driver chips 190 in the plastic body 150 during the formation of a plastic body 150, and thereby encapsulating them. In such a configuration, the mounting of driver chip 190 is carried out before mounting of optoelectronic semiconductor chips 170.

Figure 29:
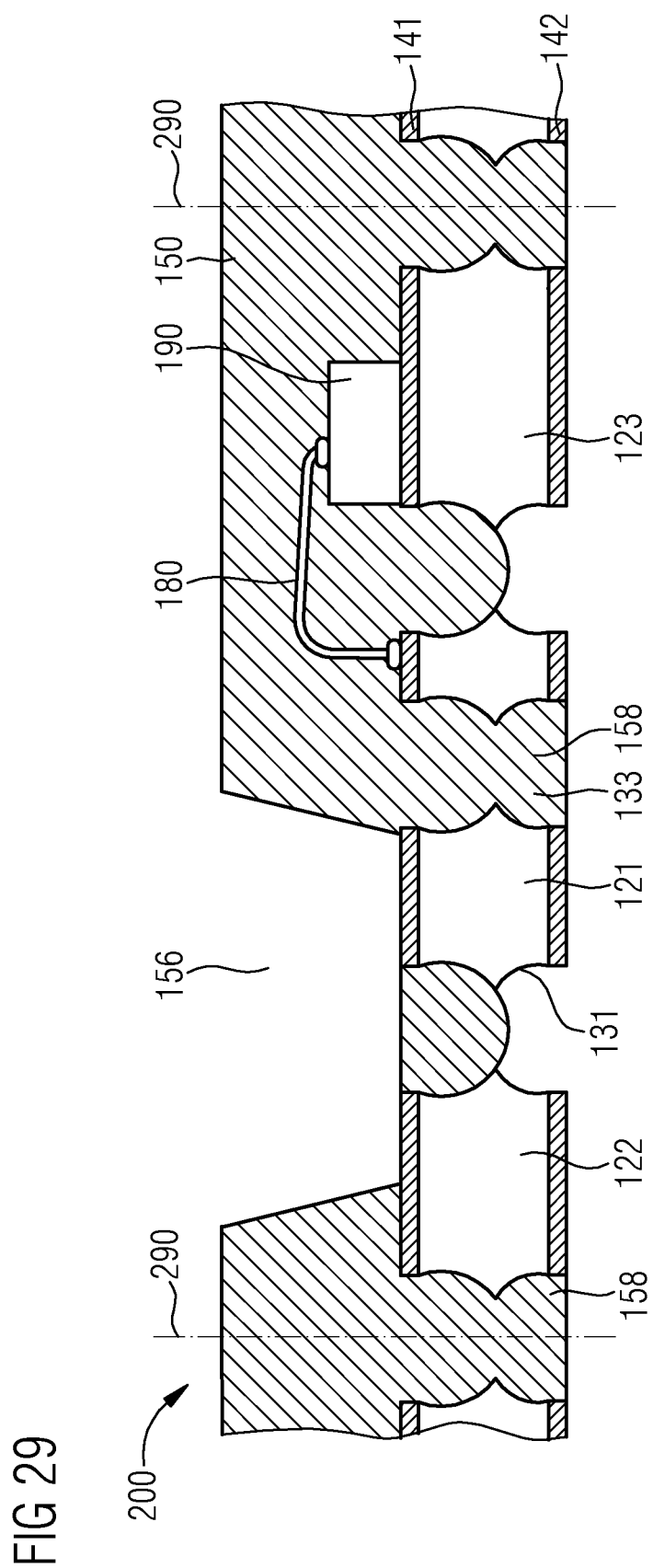
FIG. 29 shows a lateral representation of a prefabricated package comprising a driver chip.

In order to illustrate the aforementioned aspect, FIG. 29 shows a lateral sectional representation of a further prefabricated package 200, which represents a modification of the package 200 used in the method of FIGS. 23 to 28. The package 200 comprises separate metal carrier sections 121, 122, 123, 124, of which only the carrier sections 121, 122, 123 are shown in FIG. 29. In relation to the carrier sections 121, 122, 123, 124 the structure is one that corresponds to FIG. 26. Furthermore, the package 200 comprises a plastic body 150 that, for each optoelectronic component 100 to be produced, comprises only a cavity 156 for receiving an optoelectronic semiconductor chip 170. Furthermore, for each component 100 to be produced, the package 200 comprises a driver chip 190 premounted on the carrier section 123 and embedded in the plastic body 150. The driver chip 190 is connected by means of bond wires 180 to the carrier section 121 and the other carrier sections 124 (not shown in FIG. 29). In relation to the wiring of the driver chip 190 the configuration is one that corresponds to FIG. 27.

The production of the prefabricated package 200 of FIG. 29 may be carried out by providing a prestructured metal carrier 110 comprising protruding carrier sections 121, 122, 123, 124, depressions 130 and through-holes 133, mounting driver chips 190 on carrier sections 123 and connecting them to carrier sections 121, 124 by means of bond wires 180, forming the plastic body 150 on the carrier 110 embedding the driver chips 190, and subsequently structuring the carrier 110 into separate carrier sections 121, 122, 123, 124 by rear-side etching. For the further production of optoelectronic components 100, optoelectronic semiconductor chips 170 may be arranged on carrier sections 121 in the cavities 156 of the plastic body 150 and connected by means of bond wires 180 to carrier sections 122, the cavities 156 may be filled, and the component panel may subsequently be singulated by severing the plastic body 150. Optoelectronic components 100 produced in this way comprise a plastic package body 155 in which a driver chip 190 is embedded (these are respectively not represented). In this configuration, irradiation of the driver chip 190 and therefore impairment of the functionality of the driver chip 190 may also be avoided.

In respect of the production of optoelectronic components 100 comprising driver chips 190, it is also possible for this to be carried out without a prefabricated package 200. In this sense, for example, the method explained with the aid of FIGS. 23 to 28 may be modified in such a way that structuring of a prestructured carrier 110 into separate carrier sections 121, 122, 123, 124 is not carried out until after the mounting of optoelectronic semiconductor chips 170 and driver chips 190 in cavities 156 or 157 of a plastic body 150 formed on the carrier 110. In relation to FIG. 29, structuring of a prestructured carrier 110 into separate carrier sections 121, 122, 123, 124 may not be carried out until after the mounting of optoelectronic semiconductor chips 170 in cavities 156 of a plastic body 150, the plastic body 150 being formed previously on the carrier 110 equipped with driver chips 190.

It is furthermore possible to produce optoelectronic components 100 that comprise a plurality of radiation-emitting optoelectronic semiconductor chips 170 instead of a single one. The plurality of semiconductor chips 170 may be provided together in a cavity 156 in a plastic package body 155. The plurality of semiconductor chips 170 may also be drivable separately, which may be implemented by a configuration, adapted therefor, of metal carrier sections and corresponding interconnection of the semiconductor chips 170. In this context, configurations of components 100 may furthermore be implemented which comprise semiconductor chips 170 for generating different light radiations. These include, for example, RGB components 100 comprising three semiconductor chips 170 for generating red, green and blue light radiation.

Figure 30:
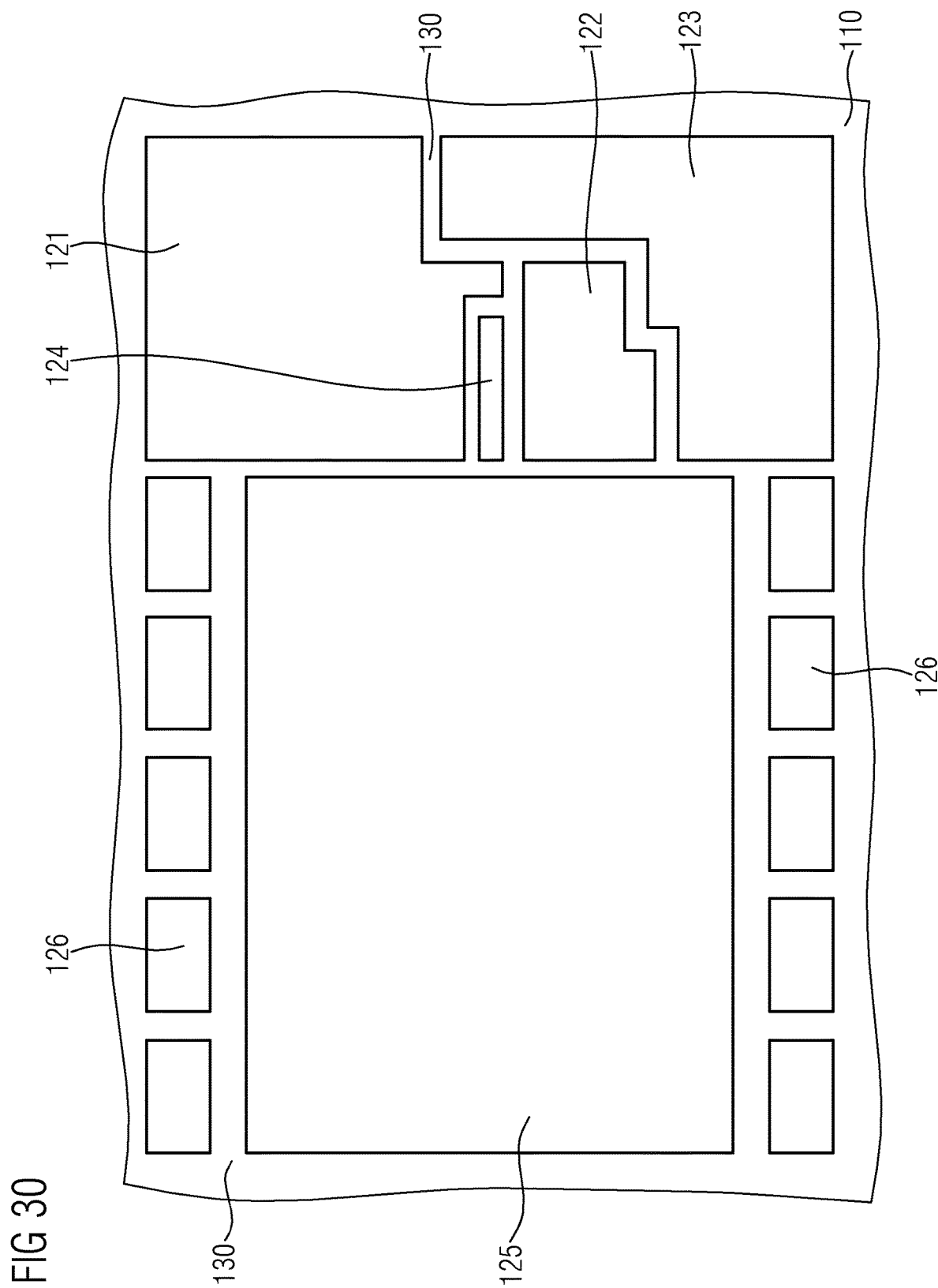
FIG. 30 shows a plan representation of a prestructured carrier for producing an optoelectronic component comprising three optoelectronic semiconductor chips and a driver chip.

In order to illustrate the aforementioned aspect, FIG. 30 shows a plan representation of a prestructured metal carrier 110 comprising carrier sections 121, 122, 123, 124, 125, 126 protruding on the front side and continuous depressions 130 present between them, which is suitable for the production of optoelectronic components 100 comprising three radiation-emitting semiconductor chips 170 and a driver chip 190. FIG. 30 shows a detail of the carrier 110 in the region of a component 100 to be produced. An optoelectronic component 100 produced by using this carrier 110 is shown in the plan representation of FIG. 31. The component 100 comprises three radiation-emitting semiconductor chips 170, which are respectively arranged on one of the carrier sections 121, 122, 123. The three semiconductor chips 170 may be configured for the generation of red, green and blue light radiation, so that the component 100 is an RGB component.

Figure 31:
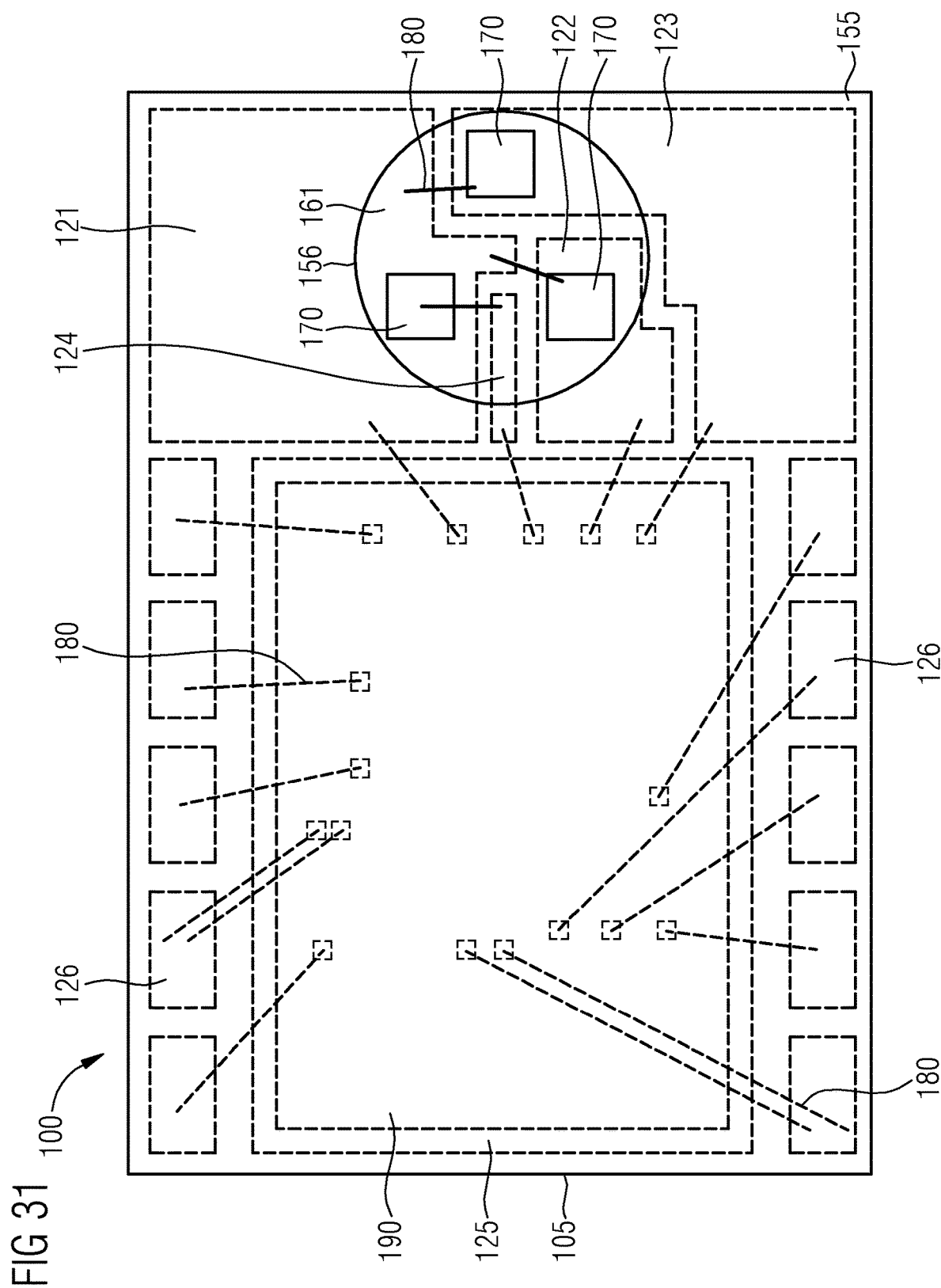
FIG. 31 shows a plan representation of an optoelectronic component comprising three optoelectronic semiconductor chips and a driver chip.

The optoelectronic component 100 of FIG. 31 furthermore comprises a driver chip 190, which is arranged on the carrier section 125. The driver chip 190 is connected by means of bond wires 180 to the carrier sections 126. In this way, the driver chip 190 can be supplied with electrical energy and receive information. The driver chip 190 is furthermore connected by means of bond wires 180 to four carrier sections 121, 122, 123, 124. The semiconductor chips 170 are also connected by means of bond wires 180 to the carrier sections 121, 122, 123, 124. In this way, there are indirect electrical connections, implemented inter alia by means of the carrier sections 121, 122, 123, 124, between the driver chip 190 and the carrier chip 170. In this way, the semiconductor chips 170 may be electrically driven separately from one another with the aid of the driver chip 190.

A further integral part of the component 100 of FIG. 31 is a plastic package body 155, in which the driver chip 190 is embedded. The plastic package body 155 comprises a cavity 156, by means of which the carrier sections 121, 122, 123, 124 are exposed at least in part on the front side. As seen from above, the carrier sections 121, 122, 123, 124 are therefore located in part inside and outside the cavity 156. The semiconductor chips 170 are arranged in the cavity 156. The cavity 156 is furthermore filled with a radiation-transmissive, or clear, filler material 161.

The optoelectronic component 100 of FIG. 31 may be produced in a similar way to the method explained with the aid of FIG. 29, i.e. in that driver chips 190 are initially placed on carrier sections 125 of the prestructured carrier 110 shown as a detail in FIG. 30 and wired. Subsequently, the plastic body 150 encapsulating the driver chips 190 and comprising cavities 156 may be formed on the carrier 110, the carrier 110 may be structured into separate carrier sections 121, 122, 123, 124, 125, 126 by rear-side etching, and semiconductor chips 170 may be mounted in the cavities 156 and wired. Subsequently, the cavities 156 may be filled and singulation may be carried out (these are respectively not represented).

Figure 32:
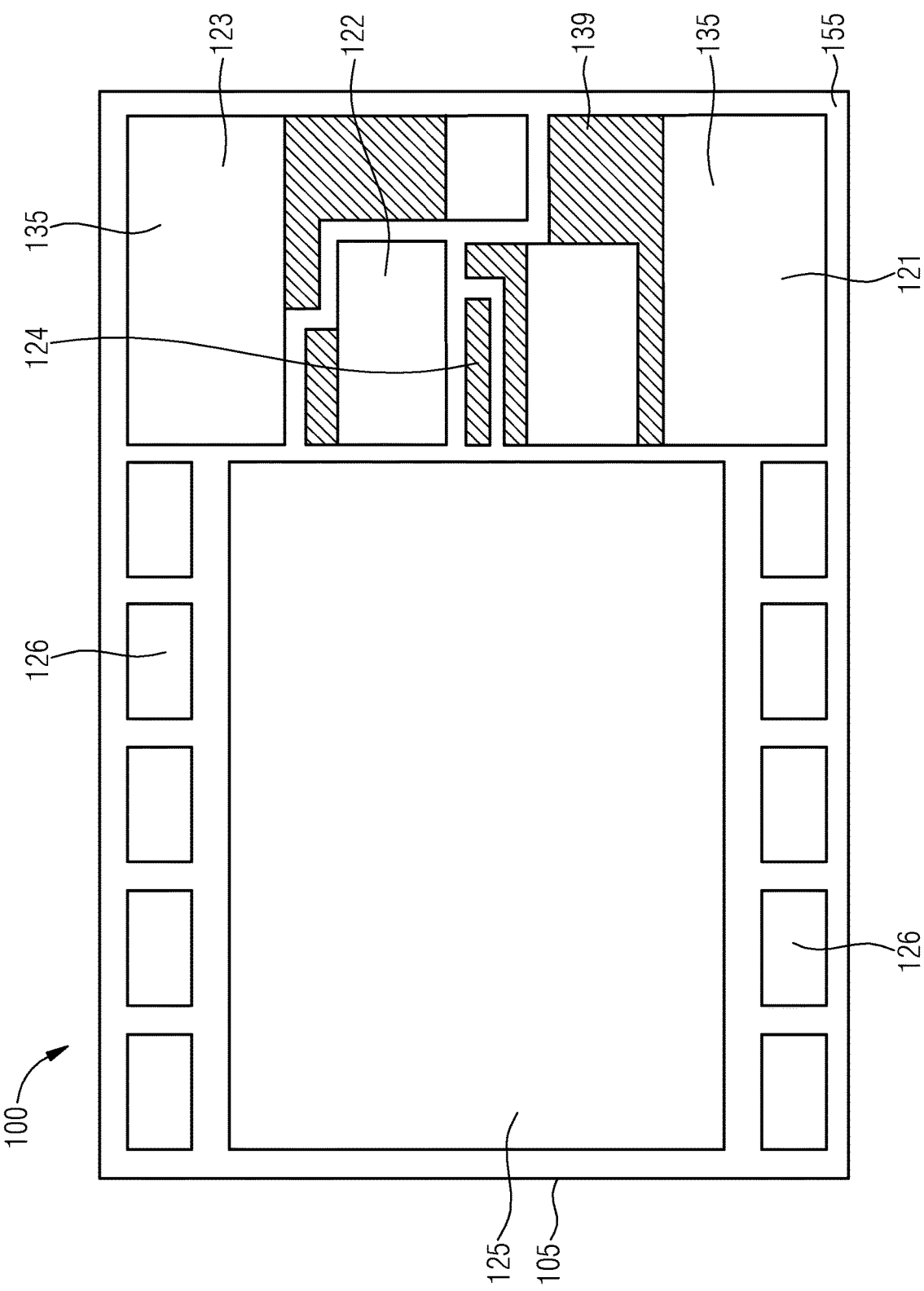
FIG. 32 shows a rear-side representation of the optoelectronic component of FIG. 31.

FIG. 32 shows a rear-side representation of the optoelectronic component 100 of FIG. 31, with the aid of which a further possible configuration may be seen in relation to removal of carrier material, carried out during the rear-side carrier etching, not only in the region of depressions 130 of the prestructured carrier 110 but also in the region of carrier sections, in the present case the carrier sections 121, 122, 123, 124. In FIG. 32, rear-side etching regions in which the relevant carrier sections 121, 122, 123, 124 have additionally been etched are highlighted by hatching. In this way, rear-side connection surfaces 135, which are formed by the carrier sections 121, 122, 123 (as well as 125, 126), and which are not represented by hatching in FIG. 32, have a symmetrical configuration. In this way, reliable surface mounting of the component 100 is possible without displacement thereof. The carrier section 124, which has been fully etched on the rear side, has a smaller thickness than the other carrier sections 121, 122, 123, 125, 126 and does not form a rear-side connection surface 135.

The optoelectronic component 100 of FIGS. 31, 32 may, for example, be used as an intelligent RGB illumination component and in an interior of a motor vehicle. In this case, the driver chip 190 may, for example, receive information via a data bus relating to the brightness and chronological sequence with which the semiconductor chips 170 should emit light. Furthermore, the component 100 may be operated on the battery voltage of the motor vehicle. The battery voltage may be substantially higher than the forward voltage of the semiconductor chips 170, so that a high thermal loss power may be generated. The configuration of the component 100 with the metal carrier sections 121, 122, 123, 124, 125, 126 makes it possible in this context to efficiently dissipate the heat energy produced (these are respectively not represented).

A further method variant, which is conceivable in relation to the production of optoelectronic components 100, consists in forming a plastic body 150 without cavities and embedding optoelectronic semiconductor chips 170 therein. In this way, the components 100 may be manufactured economically.

Figure 33:
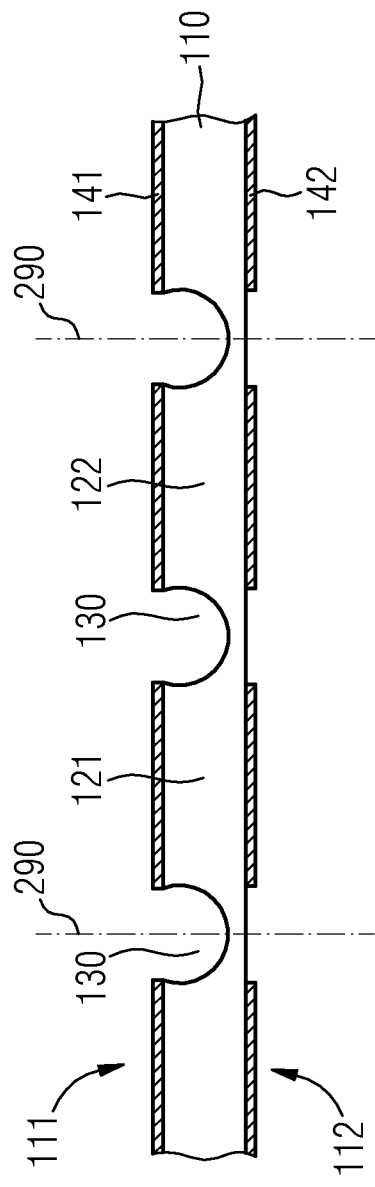
Figure 35:
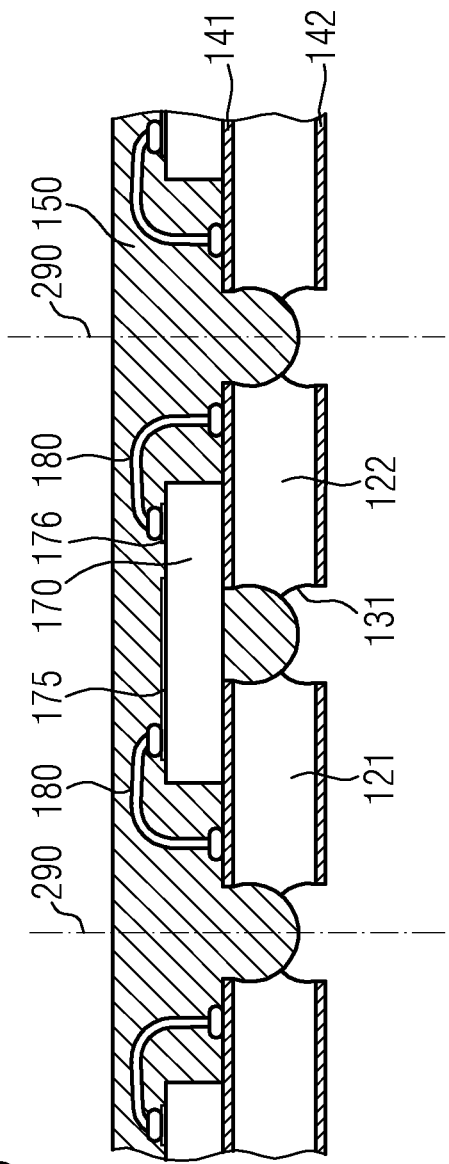
Figure 36:
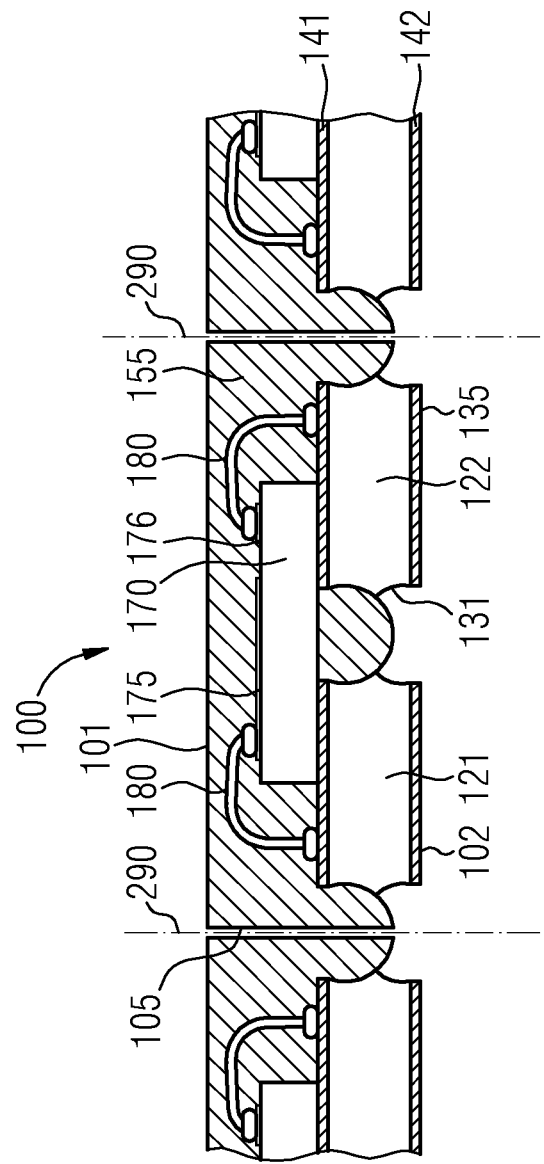
Figure 37:
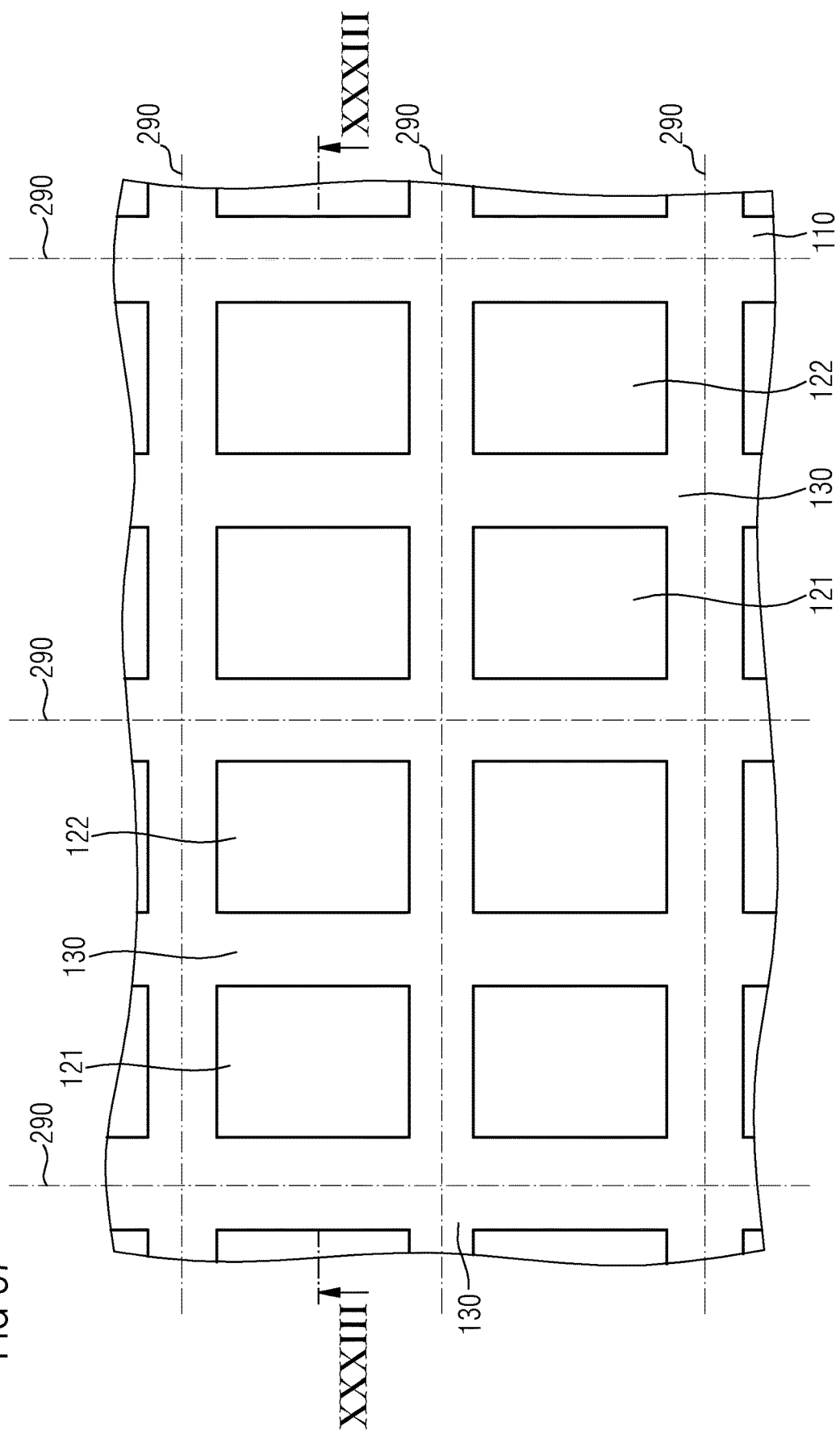

In order to illustrate the aforementioned aspects, FIGS. 33 to 39 represent a further method sequence for the production of radiation-emitting optoelectronic components 100 with the aid of lateral sectional representations and plan representations. In the method, as is shown in FIGS. 33 and 37, a prestructured metal carrier 110 comprising front-side and rear-side etching masks 141, 142 is provided, which comprises carrier sections 121, 122 protruding in the region of the front side 111 and depressions 130 between them. The carrier sections 121, 122 have matching lateral dimensions. For each component 100 to be produced, a carrier section 121 and a carrier section 122 are provided. The prestructuring is carried out in the manner described above by front-side isotropic etching of the carrier 110 by using the etching mask 141.

Figure 34:
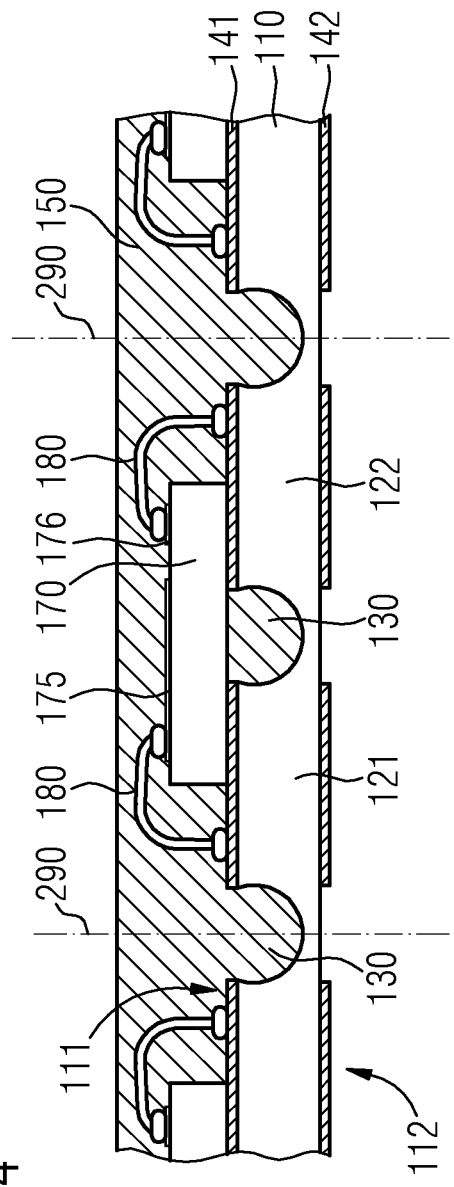

Following this, as is shown in FIGS. 34 and 38, radiation-emitting optoelectronic semiconductor chips 170 are arranged on and electrically connected to the front side 111 of the prestructured metal carrier 110. In the present case, the semiconductor chips 170 comprise two front-side contacts 175, 176. The contact 175 comprises one circular contact section and one linear contact section. The other contact 176 comprises one circular contact section and two linear contact sections. During the chip mounting, the semiconductor chips 170 are respectively fastened on two neighboring carrier sections 121, 122. This process may for example be carried out by adhesive bonding, soldering or sintering. Furthermore, the front-side contacts 175, 176 of the semiconductor chips 170 are electrically connected by means of bond wires 180 respectively to one of the carrier sections 121, 122 on which the semiconductor chips 170 are located. In this case, the bond wires 180 are connected to the circular contact sections of the chip contacts 175, 176.

Subsequently, as is likewise shown in FIG. 34, a plastic body 150 is formed on the front side 111 of the metal carrier 110 equipped with the semiconductor chips 170. This is carried out in such a way that the optoelectronic semiconductor chips 170 are embedded together with bond wires 180 in the plastic body 150. The plastic body 150 is furthermore arranged in the depressions 130 of the carrier 110. Because of the isotropic etching, the depressions 130 may comprise an undercut, so that interlocking is possible between the carrier 110 and the plastic body 150.

For the formation of the plastic body 150, a plastic material in the form of a continuous layer covering the optoelectronic semiconductor chips 170 is applied on the carrier 110. To this end, for example, a molding process may be carried out. Testing of the plastic material is also possible, which may be carried out by using a delimiting structure referred to as a dam (so-called dam & fill method; these are respectively not represented). The plastic material used may be a radiation-transmissive, or clear, plastic material, for example a silicone material or an epoxide material. It is also possible to use a thermoplastic or a thermoset. Furthermore, the plastic material may additionally contain phosphor particles (not shown), so that radiation conversion of light radiation emitted by the semiconductor chips 170 during operation may be brought about. In the plan representation of FIG. 38 and in subsequent plan representations, the plastic material is represented as a clear material.

Subsequently, as shown in FIG. 35, the carrier 110 is structured into separate metal carrier sections 121, 122 by rear-side isotropic etching in the region of the depressions 130 by using the etching mask 142. The etching is carried out until the plastic body 150 is reached, so that the plastic body 150 is exposed on the rear side in part. In this state, the separate carrier sections 121, 122 are held together by the plastic body 150. The carrier sections 121, 122 have, in cross section, side flanks 131 with two curved partial flanks forming a common laterally protruding edge.

The component panel is subsequently, as is shown in FIGS. 36 and 39, singulated into separate optoelectronic components 100 by severing the plastic body 150 along separating lines 290 between carrier sections 121, 122. During this process, the plastic body 150 is separated into plastic package bodies 155 belonging to the individual components 100.

An individual radiation-emitting optoelectronic component 100, which has been produced with the aid of the method of FIGS. 33 to 39, is depicted in a lateral sectional representation and in a plan representation in FIGS. 40 and 41. The component 100 comprises two separate metal carrier sections 121, 122, a radiation-emitting semiconductor chip 170 arranged on the carrier sections 121, 122 and electrically connected to them by means of bond wires 180, and the plastic package body 155 adjoining the carrier sections 121, 122 and the semiconductor chip 170 and encapsulating the semiconductor chip 170. The plastic package body 155 forms a front side 101 and a circumferential lateral surface 105 of the component 100. A structured rear side 102 of the component 100 is formed by the plastic package body 155 and the carrier sections 121, 122. During operation of the component 100, light radiation may be emitted through the plastic package body 155, and therefore through the front side 102, the lateral surface 105 and in part also through the rear side 102 of the component 100.

FIGS. 42 and 43 show a lateral sectional representation and a plan representation of a further optoelectronic component 100, which has a similar structure to the component 100 shown in FIGS. 40, 41. The component 100 comprises two separate metal carrier sections 121, 122 with different lateral dimensions. A radiation-emitting semiconductor chip 170 comprising two front-side contacts 175, 176 is arranged on the carrier section 121 and connected by means of bond wires 180 to the carrier sections 121, 122. A further integral part is a plastic package body 155 adjoining the carrier sections 121, 122 and encapsulating the semiconductor chip 170. The production (not represented) of components 100 having the configuration shown in FIGS. 42,43 may be carried out in accordance with the method sequence of FIGS. 33 to 39, although in this case carrier sections 121, 122 having different lateral dimensions are produced and semiconductor chips 170 are mounted only on carrier sections 121. By the arrangement of the semiconductor chip 170 only on the carrier section 121, in contrast to the configuration shown in FIGS. 40, 41, in which the semiconductor chip 170 is arranged on both carrier sections 121, 122 and therefore covers a subregion, located between the carrier sections 121, 122, of the plastic package body 155, lower rear-side radiation emission may be achieved during operation of the component 100.

In respect of the production of optoelectronic components 100 whose semiconductor chips 170 are embedded in a plastic package body 155, anchoring may correspondingly be implemented by providing a carrier 110 and comprising through-holes 133 and, during the formation of a plastic body 150 on the carrier 110, arranging the plastic material used in the through-holes 133. For illustration, a possible modification of the method of FIGS. 33 to 39 will be discussed in more detail below with the aid of FIGS. 44 and 45.

FIG. 44 shows a plan representation, corresponding to FIG. 38, of a prestructured metal carrier 110 which is equipped with semiconductor chips 170 and on which a plastic body 150 encapsulating the semiconductor chips 170 is formed. The carrier 110 comprises rear-side through-holes 133 merging into depressions 130. In the configuration shown, the through-holes 133 are located in the region of corners of neighboring carrier sections 121, 122 provided for different components 100 to be produced, and therefore in the region of separating lines 290. During the formation of the plastic body 150 on the carrier 110, the plastic material used is introduced into the through-holes 133, as shown in FIG. 45 in the region of a through-hole 133 in a lateral sectional representation. The anchoring sections 158 thereby formed of the plastic body 150 are flush with the carrier 110 on the rear side. In the present case, the through-holes 133 have a shape projecting in steps relative to the depressions 130. Correspondingly, the anchoring sections 158 have a shape projecting in steps relative to subsections of the plastic body 150 that are located in the depressions 130. During the singulation carried out at the end of the method, the anchoring sections 158 may be severed and thereby distributed between a plurality of, or four, plastic package bodies 155 (this is not represented).

FIGS. 46 to 49 show, with the aid of lateral sectional representations, a further method sequence for the production of optoelectronic components 100. This is a further modification of the method of FIGS. 33 to 39, in which a plastic body 150 is formed not from one but from two different plastic materials 151, 152. At the start of the method, as is shown in FIG. 46, a prestructured metal carrier 110 comprising front-side and rear-side etching masks 141, 142 is again provided, which comprises carrier sections 121, 122 protruding in the region of the front side 111 and depressions 130 between them. As seen from above, the prestructured carrier 110 may have a structure corresponding to FIG. 37. Subsequently, as is likewise shown in FIG. 46, a first plastic material 151 is arranged on the front side 111 of the carrier 110. The plastic material 151 is introduced only into the depressions 130 of the carrier 110. This is carried out in such a way that the plastic material 151 is flush with the carrier sections 121, 122, or with the associated front-side etching mask 141. To this end, for example, a molding process may be carried out (this is not represented). The plastic material 151 is a reflective material, which contains reflective particles (not shown) and may therefore have a white color. The plastic material 151 may, for example, be a silicon material or an epoxide material, in which reflective $TiO_2$ particles are embedded.

During the subsequent chip mounting, as is shown in FIG. 47, radiation-emitting optoelectronic semiconductor chips 170 are respectively arranged on two neighboring carrier sections 121, 122 and are connected by means of bond wires 180 respectively to one of the carrier sections 121, 122. Furthermore, as is likewise shown in FIG. 47, a second plastic material 152 is arranged on the first plastic material 151, the carrier sections 121, 122 and the semiconductor chips 170, so that the semiconductor chips 170 are embedded together with bond wires 180 in the plastic material 152. In this way, a plastic body 150 comprising the two plastic materials 151, 152 is provided simultaneously on the carrier 110. The plan representation of FIG. 38 may be used correspondingly in relation to FIG. 47. The second plastic material 152 is applied in the form of a continuous layer covering the semiconductor chips 170. To this end, for example, a molding process or a casting process may be carried out (this is not shown). The second plastic material 152 may be a radiation-transmissive, or clear, plastic material, for example a silicone material or an epoxide material, and may optionally contain phosphor particles (not shown) for radiation conversion.

Following this, as is shown in FIG. 48, the carrier 110 is structured into separate carrier sections 121, 122 by rear-side etching in the region of the depressions 130. The etching is carried out until the first plastic material 151 of the plastic body 150 is reached, so that the plastic material 151 is exposed on the rear side in part.

Subsequently, as is shown in FIG. 49, the component panel is singulated into separate optoelectronic components 100 by severing the plastic materials 151, 152 of the plastic body 150 along separating lines 290 between carrier sections 121, 122. The plan representation of FIG. 39 may be used correspondingly in relation to FIG. 49. During the singulation, the plastic body 150 is separated into the plastic package bodies 155 belonging to the individual components 100.

An individual radiation-emitting optoelectronic component 100, which has been produced with the aid of the method explained above, is shown in the lateral sectional representation of FIG. 50. As seen from above, the component 100 may have a structure corresponding to FIG. 41. The component 100 differs from the configuration shown in FIG. 40 in that the plastic package body 155 comprises two different plastic materials 151, 152. The first plastic material 151 is located laterally next to and between the carrier sections 121, 122. In this case, the first plastic material 151 is flush with the front sides of the carrier sections 121, 122, or with the front-side etching mask 141 present there. The second plastic material 152 is arranged on the first plastic material 151, the carrier sections 121, 122 and the semiconductor chip 170. A front side 101 of the component 100 is formed by the second plastic material 152. A circumferential surface 105 of the component 100 is formed by two plastic materials 151, 152. A structured rear side 102 of the component 100 is formed by the first plastic material 151 and carrier sections 121, 122. During operation of the component 100, light radiation may be emitted through the second plastic material 152 of the plastic package body 155, and therefore through the front side 102 and the lateral surface 105. Rear-side radiation emission may be suppressed with the aid of the reflective first plastic material 151.

FIG. 51 shows a lateral sectional representation of a further optoelectronic component 100, which has a structure similar to FIGS. 42, 43 and which, in accordance with the component 100 explained above, comprises a plastic package body 155 constructed from two plastic materials 151, 152. In this case as well, rear-side radiation emission may therefore be avoided during operation of the component 100. The production (not shown) of components 100 having the configuration 100 shown in FIG. 51 may be carried out in a similar way to the method explained above, although in this case carrier sections 121, 122 having different lateral dimensions are produced and semiconductor chips 170 are mounted only on carrier sections 121.

In the method sequences explained above, optoelectronic components 100 are produced which comprise rear-side connection surfaces 135 formed by carrying sections, or by associated etching mask layer sections 142. In the scope of surface mounting of the optoelectronic components 100, the connection surfaces 135 may be wetted with a solder. Wetting may possibly also take place in relation to the side flanks 131 of the carrier sections, even if a flux is additionally used. This may be desired or undesired. In this context, it is conceivable to modify the method in such a way that wetting layers 145, with the aid of which predetermined wetting with a solder may be achieved, are formed of metal carrier sections.

For illustration, a possible procedure in relation to the method of FIGS. 46 to 49 will be explained in more detail below with the aid of the lateral representations of FIGS. 52 and 53. In this case, after the rear-side etching in order to structure the metal carrier 110 into separate carrier sections 121, 122 (cf. FIG. 48) and before the singulation, as shown in FIG. 52, the rear-side etching mask 142 is removed from the carrier sections 121, 122. In the case of a metal etching mask 142, this process may for example be carried out mechanically by means of grinding or lapping (this is not represented). So that this process can be carried out simply, it is also conceivable, in contrast to the description above, to implement the rear-side etching mask 142 not in the form of a metal etching mask but instead in the form of a photoresist mask consisting of a photoresist material. In this configuration, the removal of the etching mask 142 may for example be carried out by using a solvent (this is not represented).

Subsequently, the carrier sections 121, 122 protruding relative to the plastic body 150 are cleaned (this is not represented), so that the bare original metal carrier material (copper) may be present on the rear side and on the side flanks 131 of the carrier sections 121, 122.

Furthermore, as is shown in FIG. 53, a metal wetting layer 145 may be formed on the rear side and on the side flanks of the carrier sections 121, 122. To this end, an electroless metallization method (electroless plating) may be carried out, in which the wetting layer 145 is produced selectively and without using a mask, or photoresist mask, on the carrier sections 121, 122. For example, an ENEPIG (Electroless Nickel Electroless Palladium Immersion Gold) method is possible, so that a wetting layer 145 is formed from NiPdAu. Subsequently, the component panel may be singulated by severing the plastic body 150 into separate optoelectronic components 100 (this is not represented).

FIG. 54 shows a lateral sectional representation of an optoelectronic component 100 produced in the manner described above, which is arranged on a circuit board 260 after carrying out surface mounting. The circuit board 260 comprises contacts 261. The component 100 is connected to the metal carrier sections 121, 122 and, by using a solder 270, electrically and mechanically to the contacts 261 of the circuit board 260. The configuration of the carrier sections 121, 122 with the wetting layer 145 present on the rear side and on the side flanks makes multiside wetting of the carrier sections 121, 122 with the solder possible 270 over a relatively large wetting area. This results in a high shear strength of the component 100 mounted on the circuit board 260. Furthermore, lateral solder control may be made possible.

FIGS. 55 to 57 show, with the aid of lateral sectional representations, a further procedure which is conceivable in relation to the method of FIGS. 46 to 49. In this case, after the rear-side etching in order to structure the metal carrier 110 into separate carrier sections 121, 122 (cf. FIG. 48) and before the singulation, the rear-side etching mask 142 is removed from the carrier sections 121, 122 (cf. FIG. 52), the carrier sections 121, 122 protruding relative to the plastic body 150 are cleaned (this is not represented), and, as is shown in FIG. 55, an antiwetting layer 146 is formed on the rear side and on the side flanks of the carrier sections 121, 122. For the formation of the antiwetting layer 146, a metal, for example nickel, may be deposited on the carrier sections 121, 122 by an electroless metallization method and subsequently oxidized. The antiwetting layer 146 formed in this way is subsequently removed on the rear side of the carrier sections 121, 122, as is shown in FIG. 56. This process may, for example, be carried out mechanically by means of grinding or lapping. It is also possible to remove or grind down the antiwetting layer 146 only in part (these are respectively not represented). Subsequently, as is shown in FIG. 57, a metal wetting layer 145 is formed on the rear side of the carrier sections 121, 122. This may, as described above, be carried out with the aid of an electroless metallization method, for example an ENEPIG method, in which the wetting layer 145 is produced selectively and without a (photoresist) mask on the rear side of the carrier sections 121, 122. Subsequently, the component panel may be singulated into separate optoelectronic components 100 by severing the plastic body 150 (this is not represented).

FIG. 58 shows a lateral sectional representation of an optoelectronic component 100 produced in the manner described above, which is arranged on a circuit board 260 after carrying out surface mounting. The component 100 is connected to the metal carrier sections 121, 122 and, by using a solder 270, electrically and mechanically to contacts 261 of the circuit board 260. The configuration of the carrier sections 121, 122 with the antiwetting layer 146 arranged on the side flanks and the wetting layer 145 present on the rear side makes planar wetting of the carrier sections 121, 122 with the solder 270 possible. Wetting of the side flanks of the carrier sections 121, 122 may be prevented by the antiwetting layer 146. In this case, use is made of the fact that the antiwetting layer 146 may be distinguished by high stability, even in relation to a flux. This is the case, for example, with formation of the antiwetting layer 146, from nickel oxide. In this way, there is the possibility of providing small carrier sections 121, 122 and small distances between the carrier sections 121, 122.

The other method sequences described above may also be modified correspondingly so that carrier sections are provided with a wetting layer 145 and optionally an antiwetting layer 146 before the singulation (this is not represented).

In relation to the production of optoelectronic components 100 comprising a radiation-emitting semiconductor chip 170 embedded in a plastic package body 155, as were explained with the aid of the method sequences of FIGS. 33 to 39 and the subsequent figures, further possible modifications consist in producing optoelectronic components 100 that comprise a plurality of semiconductor chips 170 instead of a single one. The plurality of semiconductor chips 170 may be separately drivable, which may be implemented by a configuration, adapted therefor, of metal carrier sections and corresponding interconnection of the semiconductor chips 170. Furthermore, the semiconductor chips 170 may be configured for the generation of different light radiations, and the components 100 may for example be implemented in the form of RGB components.

In order to illustrate the aforementioned aspect, FIGS. 59 and 60 show a lateral sectional representation and a plan representation of a further optoelectronic component 100. The component 100 comprises four separate metal carrier sections 121, 122, 123, 124 that can be contacted on the rear side, three radiation-emitting semiconductor chips 170 arranged on the carrier section 121, and a plastic package body 155 adjoining the carrier sections 121, 122, 123, 124 and the semiconductor chips 170 and encapsulating the semiconductor chips 170. The plastic package body 155 is formed from a radiation-transmissive, or clear, plastic material. The semiconductor chips 170 may be configured for the generation of red, green and blue light radiation, so that the component 100 is an RGB component.

In the present case, the semiconductor chips 170 comprise a rear-side contact (not shown) and a front-side contact 175. With the rear-side contact and an electrically conductive connecting material (not shown) (adhesive, solder or sintering paste), the semiconductor chips 170 are electrically connected to the carrier section 121. The front-side contacts 175 of the semiconductor chips 170 are connected by means of bond wires 180 respectively to one of the carrier sections 122, 123, 124. The sectional representation of FIG. 59 differs somewhat from FIG. 60 for reasons of clarity, by the two semiconductor chips 170 being represented together with bond wires 180 as lying in a common section plane. The production (not represented) of optoelectronic components 100 having the configuration shown in FIGS. 59, 60 may be carried out in a similar way to the method sequence of FIGS. 33 to 39, although in this case carrier sections 121, 122, 123, 124 are produced for each component 100 to be produced and semiconductor chips 170 are mounted and wired on carrier sections 121 in accordance with FIGS. 59, 60.

FIGS. 61 and 62 show a lateral sectional representation and a plan representation of a further similarly constructed optoelectronic component 100. The component 100 comprises six separate metal carrier sections 121, 122, 123, 124, 125, 126 that can be contacted on the rear side, a radiation-emitting semiconductor chip 170 respectively being arranged on the carrier sections 121, 123, 125. The component 100 furthermore comprises a plastic package body 155 adjoining the carrier sections 121, 122, 123, 124, 125, 126 and semiconductor chips 170 and encapsulating the semiconductor chips 170. The plastic package body 155 is formed from a radiation-transmissive, or clear, plastic material. The semiconductor chips 170 may be configured for the generation of red, green and blue light radiation, so that the component 100 is an RGB component.

The semiconductor chips 170 are electrically connected with a rear-side contact and by means of an electrically conductive connecting material to the carrier sections 121, 123, 125 (this is not represented). The front-side contacts 175 of the semiconductor chips 170 are connected by means of bond wires 180 respectively to one of the carrier sections 122, 124, 126. The production (not represented) of optoelectronic components 100 having the structure shown in FIGS. 61, 62 may be carried out in a similar way to the method sequence of FIGS. 33 to 39, although in this case carrier sections 121, 122, 123, 124, 125, 126 are formed for each component 100 to be produced, and semiconductor chips 170 are mounted and wired on carrier sections 121, 123, 125 in accordance with FIGS. 61, 62.

Besides the embodiments described above and depicted in the figures, further embodiments may be envisioned, which may comprise further modifications and/or combinations of features.

For example, it is possible to use other materials instead of the materials specified above. In this sense, a carrier 110 may for example be formed from a metal material other than copper. Possible carrier materials are for example ironnickel, aluminum or molybdenum. Furthermore, the numerical specifications above are merely to be regarded as examples which may be replaced by other specifications.

In order to bring about radiation conversion, it is possible to use radiation-emitting semiconductor chips that comprise a conversion element in layer form or in platelet form for radiation conversion. As an alternative, such a conversion layer or a conversion element may also be formed or arranged on semiconductor chips after the chip mounting.

A further modification consists in implementing a front-side etching mask 141 not in the form of a metal etching mask but in the form of a photoresist mask consisting of a photoresist material.

Although the invention has been illustrated and described in detail by preferred exemplary embodiments, the invention is not restricted by the examples disclosed, and other variants may be derived therefrom by the person skilled in the art without departing from the protective scope of the invention.

LIST OF REFERENCES 100 optoelectronic component
101 front side
102 rear side
105 lateral surface
110 carrier
111 front side
112 rear side
121 carrier section
122 carrier section
123 carrier section
124 carrier section
125 carrier section
126 carrier section
130 depression
131 side flank
132 depression
133 through-hole
135 connection surface
139 etching region
141 etching mask
142 etching mask
145 wetting layer
146 antiwetting layer
150 plastic body
151 plastic material
152 plastic material
155 plastic package body
156 cavity
157 cavity
158 anchoring section
161 filler material
162 filler material
170 optoelectronic semiconductor chip
175 contact
176 contact
180 bond wire
190 driver chip
200 prefabricated package
210 thickness
230 depth
241 distance
242 distance
260 circuit board
261 contact
270 solder
290 separating line

The invention claimed is:

1. A method for producing optoelectronic components, comprising:
provision of a metal carrier, the carrier comprising a front side and a rear side opposite to the front side;
front-side removal of carrier material, so that the carrier comprises carrier sections protruding in a region of the front side and depressions arranged between them;
formation of a plastic body adjoining carrier sections, the plastic body comprising a first plastic material and a second plastic material, and the first plastic material being a reflective plastic material;
arranging of optoelectronic semiconductor chips on carrier sections;
rear-side removal of carrier material in a region of the depressions, so that the carrier is structured into separate carrier sections; and
carrying out singulation, the plastic body being severed between separate carrier sections and singulated optoelectronic components comprising at least one optoelectronic semiconductor chip being formed,
wherein prestructuring of the carrier is carried out by the front-side removal of carrier material, the formation of the plastic body comprising the first and second plastic material is carried out on the prestructured carrier, and the rear-side removal of carrier material in order to structure the carrier into separate carrier sections is carried out after the formation of the plastic body comprising the first and second plastic material,
wherein the optoelectronic semiconductor chips are embedded in the plastic body, wherein the formation of the plastic body comprises arranging the first and second plastic material, the first plastic material being arranged in the depressions of the carrier before the arranging of the optoelectronic semiconductor chips in such a way that the first plastic material is flush with carrier sections protruding in the region of the front side, and the second plastic material being arranged on the first plastic material, the optoelectronic semiconductor chips and carrier sections in the form of a continuous layer covering the optoelectronic semiconductor chips after the arranging of the optoelectronic semiconductor chips, so that all of the optoelectronic semiconductor chips are collectively covered by and embedded in the continuous layer of the second plastic material.

2. The method as claimed in claim 1, wherein through-holes are formed in the carrier before the formation of the plastic body and before the structuring of the carrier into separate carrier section, and wherein the formation of the plastic body is carried out in such a way that the plastic body comprises anchoring sections arranged in the through-holes.

3. The method as claimed in claim 1, wherein one of the following is present:
after the structuring of the carrier into separate carrier sections, a metal wetting layer is formed on a rear side and on side flanks of carrier sections, or
after the structuring of the carrier into separate carrier sections, an antiwetting layer is formed on side flanks and a metal wetting layer is formed on a rear side of carrier sections.

4. The method as claimed in claim 1, wherein the arranging of the optoelectronic semiconductor chips on carrier sections is carried out before the rear-side removal of carrier material.

5. The method as claimed in claim 1, wherein at least one of the following is present;
the front-side removal and the rear-side removal of carrier material is carried out by means of etching; and/or
the optoelectronic semiconductor chips are radiation-emitting semiconductor chips.

6. The method as claimed in claim 1, wherein the carrier is provided with a rear-side etching mask on the rear side and the rear-side removal of carrier material in order to structure the carrier into separate carrier sections is carried out by etching using the rear-side etching mask, the etching comprising selectively etching the carrier at positions that are not covered with the rear-side etching mask.

7. The method as claimed in claim 1, wherein the singulation is carried out in such a way that each optoelectronic component formed by the singulation comprises a plastic package body constituted of the first and the second plastic material, wherein the plastic package body forms a front side and a lateral circumferential surface of the respective optoelectronic component, and wherein the front side is formed exclusively by the second plastic material and the lateral circumferential surface is formed by the first and the second plastic material.

8. A method for producing optoelectronic components, comprising:
provision of a metal carrier, the carrier comprising a front side and a rear side opposite to the front side;
front-side removal of carrier material, so that the carrier comprises carrier sections protruding in a region of the front side and depressions arranged between them;
formation of a plastic body adjoining carrier sections;
arranging of optoelectronic semiconductor chips on carrier sections;
structuring of the carrier into separate carrier sections by rear-side removal of carrier material in a region of the depressions; and
carrying out singulation, the plastic body being severed between separate carrier sections and singulated optoelectronic components comprising at least one optoelectronic semiconductor chip being formed,
wherein prestructuring of the carrier is carried out by the front-side removal of carrier material, the formation of the plastic body is carried out on the prestructured carrier and before the structuring of the carrier into separate carrier sections, and the structuring of the carrier into separate carrier sections is carried out after the formation of the plastic body, and
wherein through-holes are formed in the carrier before the formation of the plastic body and before the structuring of the carrier into separate carrier sections, and wherein the formation of the plastic body is carried out in such a way that the plastic body comprises anchoring sections arranged in the through-holes.

9. The method as claimed in claim 8, wherein through-holes merging into depressions are formed in the region of the depressions of the carrier.

10. The method as claimed in claim 8, wherein through-holes are formed inside carrier sections protruding in the region of the front side of the carrier.

11. The method as claimed in claim 8, wherein through-holes are formed with a shape widening in steps in a region of the rear side of the carrier.

12. The method as claimed in claim 8, wherein the formation of the plastic body is carried out in such a way that the anchoring sections of the plastic body are flush with the carrier at the rear side.

13. The method as claimed in claim 8, wherein one of the following is present:
the arranging of the optoelectronic semiconductor chips on carrier sections is carried out before the structuring of the carrier into separate carrier sections and the optoelectronic semiconductor chips are arranged on carrier sections of the carrier protruding in the region of the front side; or
wherein the arranging of the optoelectronic semiconductor chips on carrier sections is carried out after the structuring of the carrier into separate carrier sections and the optoelectronic semiconductor chips are arranged on separate carrier sections.

* * * * *